(12) United States Patent
Suzawa et al.

(10) Patent No.: US 7,161,177 B2
(45) Date of Patent: Jan. 9, 2007

(54) SEMICONDUCTOR DEVICE AND MANUFACTURING METHOD THEREOF

(75) Inventors: Hideomi Suzawa, Kanagawa (JP); Koji Ono, Kanagawa (JP); Toru Takayama, Kanagawa (JP); Tatsuya Arao, Kanagawa (JP); Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/833,080

(22) Filed: Apr. 28, 2004

(65) Prior Publication Data

US 2004/0195590 A1    Oct. 7, 2004

Related U.S. Application Data

(62) Division of application No. 09/852,672, filed on May 11, 2001.

(30) Foreign Application Priority Data

May 12, 2000  (JP) .............................. 2000-140695
May 29, 2000  (JP) .............................. 2000-159251

(51) Int. Cl.
H01L 29/04   (2006.01)
H01L 31/0376 (2006.01)

(52) U.S. Cl. ................... 257/59; 257/72; 257/E29.151; 349/42; 349/43; 349/44

(58) Field of Classification Search .................. 257/59, 257/72, 66, 69, 336, 344, 347, E29.151; 349/42–44
See application file for complete search history.

(56) References Cited

U.S. PATENT DOCUMENTS 4,233,109 A    11/1980  Nishizawa
4,394,182 A    7/1983   Maddox, III
4,885,074 A    12/1989  Susko et al.
4,963,504 A    10/1990  Huang
5,112,766 A    5/1992   Fujii et al.
5,182,619 A    1/1993   Pfiester
5,185,058 A    2/1993   Cathey, Jr.
5,272,100 A    12/1993  Satoh et al.
5,302,240 A    4/1994   Hori et al.
5,378,309 A    1/1995   Rabinzohn (Continued)

FOREIGN PATENT DOCUMENTS

EP        0 680 079 A2    11/1995

(Continued)

OTHER PUBLICATIONS

Badih El-Kareh; *Fundamentals of Semiconductor Processing Technologies*; p. 285; 1998.

(Continued)

*Primary Examiner*—Jerome Jackson
*Assistant Examiner*—Joseph Nguyen
(74) *Attorney, Agent, or Firm*—Fish & Richardson P.C.

(57) ABSTRACT

There has been a problem that the manufacturing process is complicated and the number of processes is increased when a TFT with an LDD structure or a TFT with a GOLD structure is formed. In a method of manufacturing a semiconductor device, after low concentration impurity regions (24, 25) are formed in a second doping process, a width of the low concentration impurity region which is overlapped with the third electrode (18c) and a width of the low concentration impurity region which is not overlapped with the third electrode can be freely controlled by a fourth etching process. Thus, in a region overlapped with the third electrode, a relaxation of electric field concentration is achieved and then a hot carrier injection can be prevented. And, in the region which is not overlapped with the third electrode, the off-current value can be suppressed.

28 Claims, 33 Drawing Sheets

U.S. PATENT DOCUMENTS

| | | |
|---|---|---|
| 5,470,768 A | 11/1995 | Yanai et al. |
| 5,486,717 A | 1/1996 | Kokubo et al. |
| 5,543,340 A | 8/1996 | Lee |
| 5,576,858 A | 11/1996 | Ukai et al. |
| 5,581,092 A | 12/1996 | Takemura |
| 5,583,067 A | 12/1996 | Sanchez |
| 5,599,741 A | 2/1997 | Matsumoto et al. |
| 5,605,854 A | 2/1997 | Yoo |
| 5,633,738 A | 5/1997 | Wakui et al. |
| 5,643,826 A | 7/1997 | Ohtani et al. |
| 5,698,882 A * | 12/1997 | Park ............ 257/344 |
| 5,716,534 A | 2/1998 | Tsuchiya et al. |
| 5,750,430 A | 5/1998 | Son |
| 5,767,530 A | 6/1998 | Ha |
| 5,767,930 A | 6/1998 | Kobayashi et al. |
| 5,824,606 A | 10/1998 | Dible et al. |
| 5,825,437 A | 10/1998 | Seo et al. |
| 5,828,103 A | 10/1998 | Hsu |
| 5,841,170 A | 11/1998 | Adan et al. |
| 5,851,885 A | 12/1998 | Wen |
| 5,852,481 A | 12/1998 | Hwang |
| 5,883,007 A | 3/1999 | Abraham et al. |
| 5,917,199 A | 6/1999 | Byun et al. |
| 5,923,961 A | 7/1999 | Shibuya et al. |
| 5,923,962 A | 7/1999 | Ohtani et al. |
| 5,923,999 A | 7/1999 | Balasubramanyam et al. |
| 5,949,107 A | 9/1999 | Zhang |
| 5,973,378 A | 10/1999 | Ohtani |
| 5,986,305 A | 11/1999 | Wu |
| 6,001,714 A | 12/1999 | Nakajima et al. |
| 6,013,930 A | 1/2000 | Yamazaki et al. |
| 6,030,667 A | 2/2000 | Nakagawa et al. |
| 6,031,290 A | 2/2000 | Miyazaki et al. |
| 6,064,090 A | 5/2000 | Miyamoto et al. |
| 6,114,736 A | 9/2000 | Balasubramanyam et al. |
| 6,121,660 A | 9/2000 | Yamazaki et al. |
| 6,130,106 A | 10/2000 | Zimlich |
| 6,130,119 A | 10/2000 | Jinnai |
| 6,166,414 A | 12/2000 | Miyazaki et al. |
| 6,208,395 B1 | 3/2001 | Kanoh et al. |
| 6,225,966 B1 | 5/2001 | Ohtani et al. |
| 6,239,403 B1 | 5/2001 | Dible et al. |
| 6,259,106 B1 | 7/2001 | Boegli et al. |
| 6,259,138 B1 | 7/2001 | Ohtani et al. |
| 6,271,065 B1 | 8/2001 | Miyamoto et al. |
| 6,271,101 B1 | 8/2001 | Fukunaga |
| 6,323,070 B1 | 11/2001 | Yamazaki |
| 6,335,290 B1 | 1/2002 | Ishida |
| 6,357,385 B1 | 3/2002 | Ohmi et al. |
| 6,362,027 B1 | 3/2002 | Yamazaki et al. |
| 6,365,917 B1 * | 4/2002 | Yamazaki ............ 257/72 |
| 6,369,410 B1 | 4/2002 | Yamazaki et al. |
| 6,423,242 B1 | 7/2002 | Kojima et al. |
| 6,429,086 B1 | 8/2002 | Meikle et al. |
| 6,431,112 B1 | 8/2002 | Sill et al. |
| 6,461,899 B1 | 10/2002 | Kitakado et al. |
| 6,475,836 B1 | 11/2002 | Suzawa et al. |
| 6,489,222 B1 | 12/2002 | Yoshimoto |
| 6,515,336 B1 | 2/2003 | Suzawa et al. |
| 6,524,877 B1 | 2/2003 | Nakazawa et al. |
| 6,534,789 B1 | 3/2003 | Ishida |
| 6,534,826 B1 | 3/2003 | Yamazaki |
| 6,556,702 B1 | 4/2003 | Rishton et al. |
| 6,596,571 B1 | 7/2003 | Arao et al. |
| 6,602,761 B1 | 8/2003 | Fukunaga |
| 6,608,353 B1 | 8/2003 | Miyazaki et al. |
| 6,613,620 B1 | 9/2003 | Fujimoto et al. |
| 6,614,052 B1 | 9/2003 | Zhang |
| 6,646,287 B1 * | 11/2003 | Ono et al. ............ 257/66 |
| 6,680,223 B1 | 1/2004 | Yamazaki et al. |
| 6,686,228 B1 | 2/2004 | Suzawa et al. |
| 6,686,606 B1 | 2/2004 | Jeong et al. |
| 6,703,997 B1 | 3/2004 | Murade |
| 6,707,068 B1 | 3/2004 | Fujimoto et al. |
| 6,737,712 B1 | 5/2004 | Hashimoto et al. |
| 6,747,289 B1 | 6/2004 | Yamazaki et al. |
| 6,750,424 B1 | 6/2004 | Tanaka |
| 6,753,257 B1 | 6/2004 | Yamazaki |
| 6,773,996 B1 | 8/2004 | Suzawa et al. |
| 6,791,630 B1 | 9/2004 | Kim |
| 6,809,339 B1 | 10/2004 | Suzawa et al. |
| 6,825,488 B1 | 11/2004 | Yamazaki et al. |
| 6,828,586 B1 | 12/2004 | Fujimoto et al. |
| 6,909,114 B1 | 6/2005 | Yamazaki |
| 2001/0019127 A1 | 9/2001 | Ishida |
| 2001/0025959 A1 | 10/2001 | Yamazaki et al. |
| 2001/0030322 A1 | 10/2001 | Yamazaki et al. |
| 2001/0035526 A1 | 11/2001 | Yamazaki et al. |
| 2001/0040655 A1 | 11/2001 | Yamazaki et al. |
| 2001/0041392 A1 | 11/2001 | Suzawa et al. |
| 2001/0049197 A1 | 12/2001 | Yamazaki et al. |
| 2001/0052950 A1 | 12/2001 | Yamazaki et al. |
| 2001/0055841 A1 | 12/2001 | Yamazaki et al. |
| 2002/0000551 A1 | 1/2002 | Yamazaki et al. |
| 2002/0006705 A1 | 1/2002 | Suzawa et al. |
| 2002/0013022 A1 | 1/2002 | Yamazaki et al. |
| 2002/0017685 A1 | 2/2002 | Kasahara et al. |
| 2002/0028544 A1 | 3/2002 | Fujimoto et al. |
| 2002/0110941 A1 | 8/2002 | Yamazaki et al. |
| 2002/0113552 A1 | 8/2002 | Juestel et al. |
| 2002/0134983 A1 | 9/2002 | Yamazaki |
| 2002/0158288 A1 | 10/2002 | Yamazaki et al. |
| 2003/0207503 A1 | 11/2003 | Yamazaki et al. |
| 2003/0211664 A1 * | 11/2003 | Fujimoto et al. ........... 438/149 |
| 2004/0023448 A1 | 2/2004 | Fukunaga |
| 2004/0169183 A1 | 9/2004 | Fujimoto et al. |
| 2005/0040403 A1 | 2/2005 | Suzawa et al. |
| 2005/0056848 A1 | 3/2005 | Yamazaki et al. |
| 2005/0056934 A1 | 3/2005 | Suzawa et al. |
| 2005/0104068 A1 | 5/2005 | Yamazaki |
| 2005/0110016 A1 | 5/2005 | Yamazaki |

FOREIGN PATENT DOCUMENTS

| | | |
|---|---|---|
| EP | 0 909 972 A2 | 4/1999 |
| EP | 1 003 223 A2 | 5/2000 |
| EP | 1 006 589 A2 | 6/2000 |
| EP | 1 132 960 A2 | 9/2001 |
| JP | 01-207973 | 8/1989 |
| JP | 06-148685 | 5/1994 |
| JP | 07-130652 | 5/1995 |
| JP | 07-235680 | 9/1995 |
| JP | 08-274336 | 10/1996 |
| JP | 09-054318 | 2/1997 |
| JP | 09-293600 | 11/1997 |
| JP | 10-048640 | 2/1998 |
| JP | 10-073813 | 3/1998 |
| JP | 10-233511 | 9/1998 |
| JP | 10-326772 | 12/1998 |
| JP | 11-258596 | 9/1999 |
| JP | 2000-047263 | 2/2000 |
| JP | 2001-085700 | 3/2001 |
| TW | 324856 | 1/1998 |
| WO | WO 87/07079 | 11/1987 |

OTHER PUBLICATIONS

Australian Search Report dated Jun. 10, 2003 issued in Singapore Application No. SG 200102818-2 (4 pages).

Hatano et al., "A Novel Self-aligned Gate-overlapped LDD Poly-Si TFT with High Reliability and Performance", IEDM Technical Digest 97, pp. 523-526, Jul. 1997.

U.S. Appl. No. 09/615,449, Suzawa, et al. (pending), Jul. 13, 2000.

* cited by examiner

Schematic Structual View in Simulation

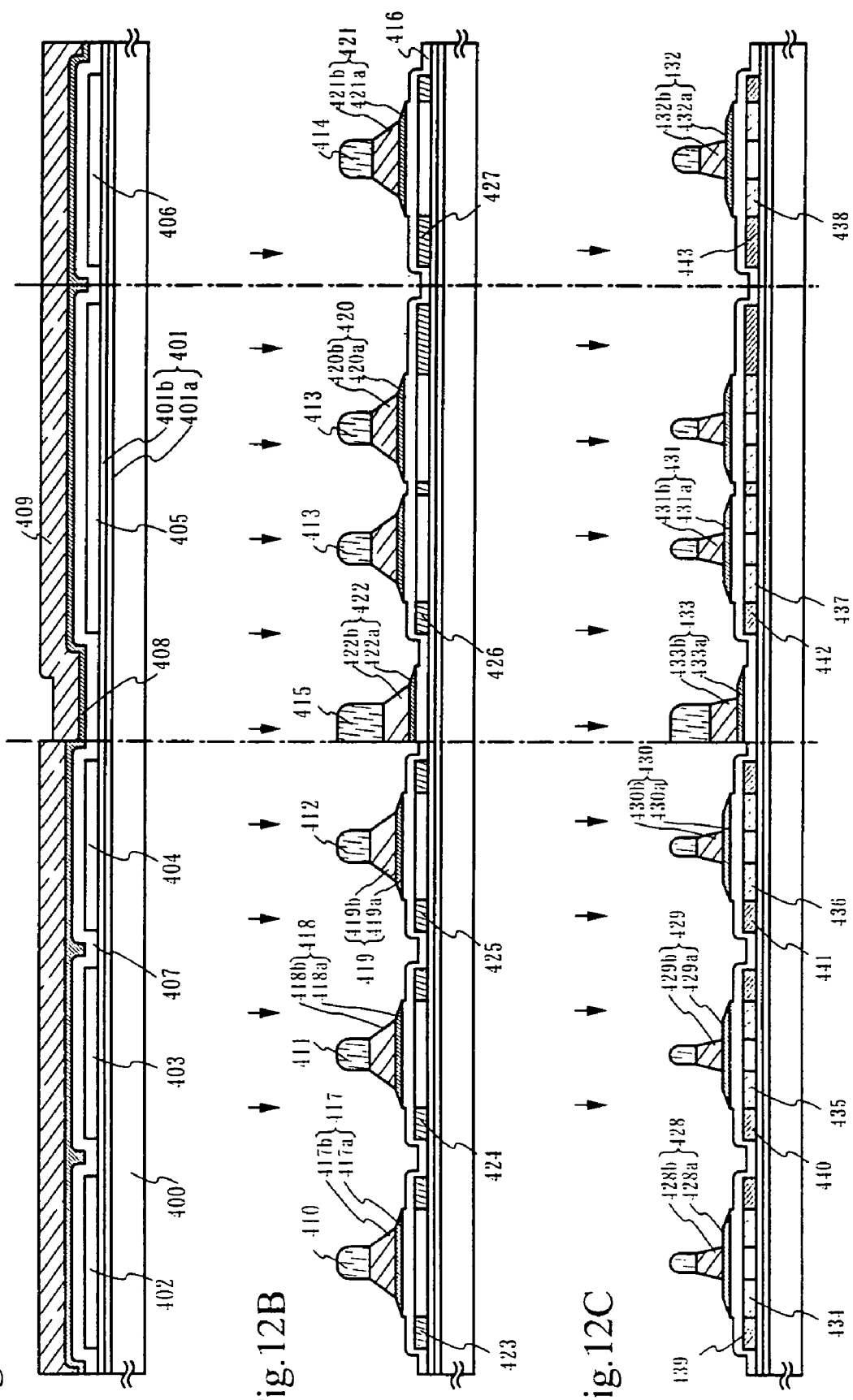

ICP power: 500W, RF power: 150W, chamber pressure: 1.0Pa
$Cl_2$=25sccm, $CF_4$=25sccm, $O_2$=10sccm ICP power: 500W, RF power: 20W, chamber pressure: 1.0Pa
$Cl_2$=30sccm, $CF_4$=30sccm

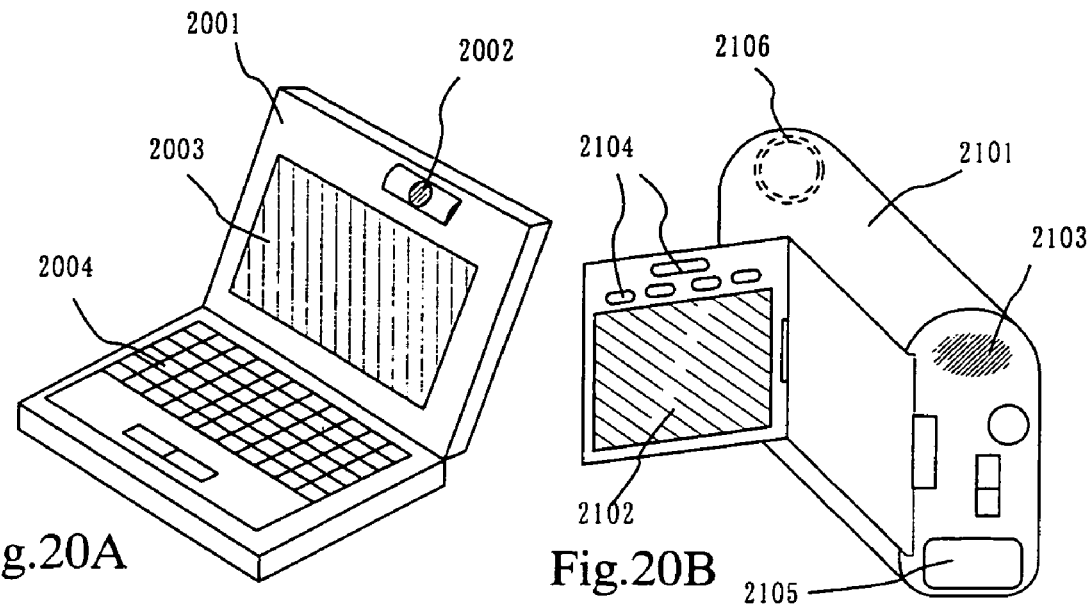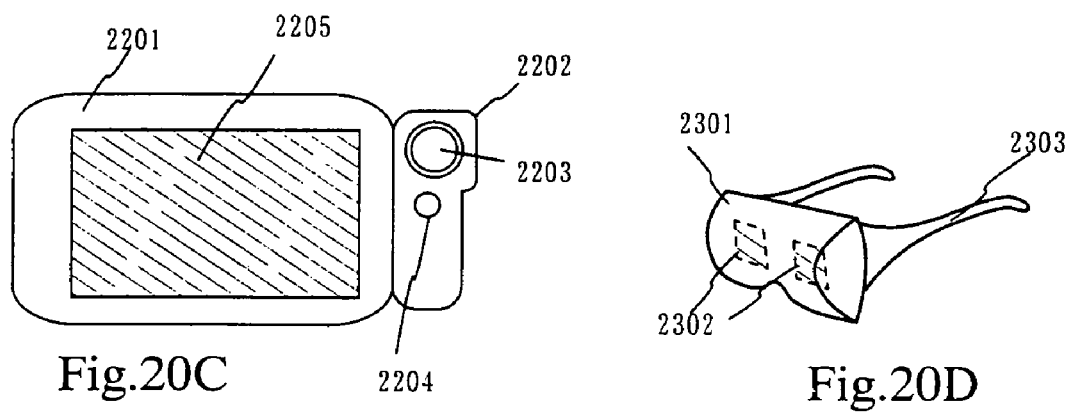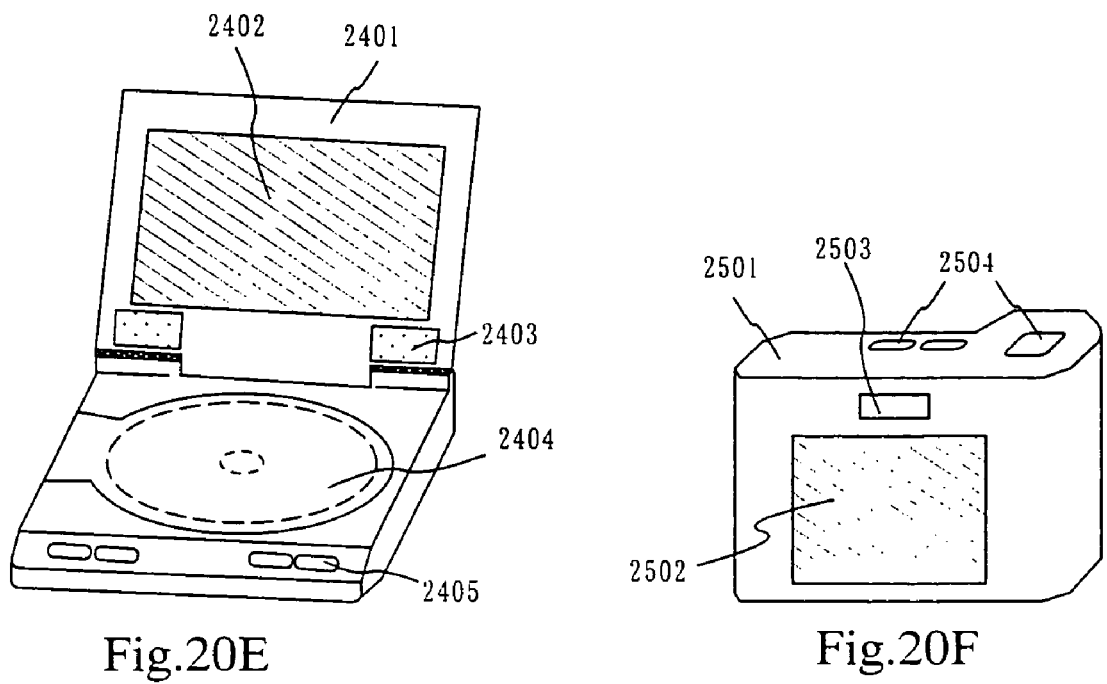

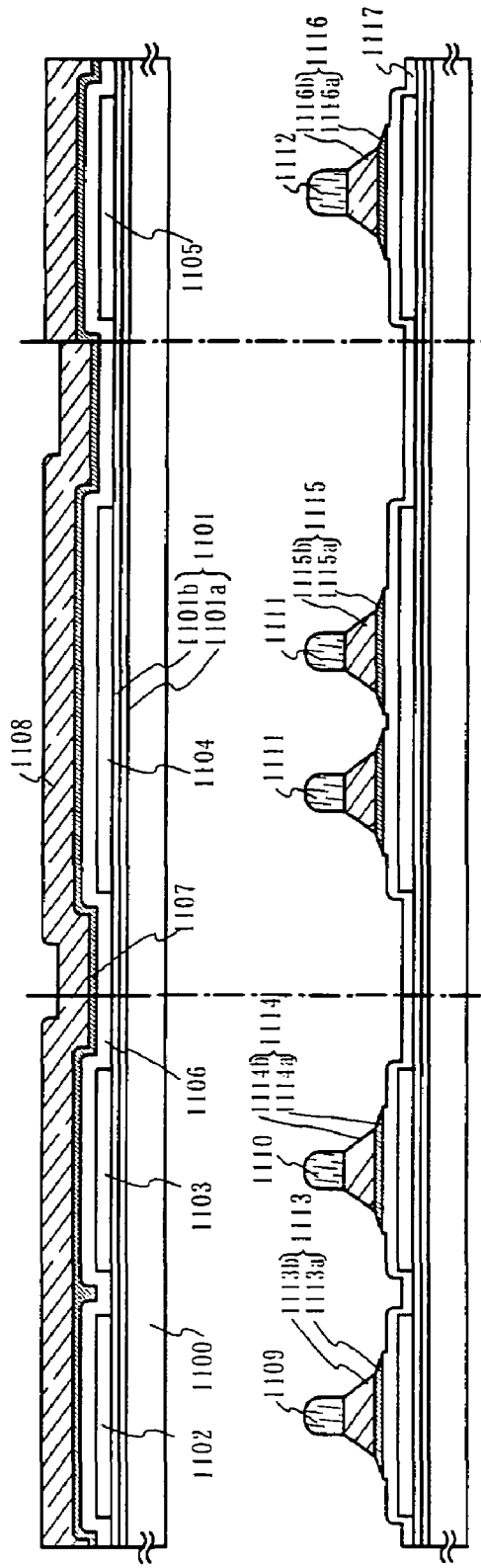

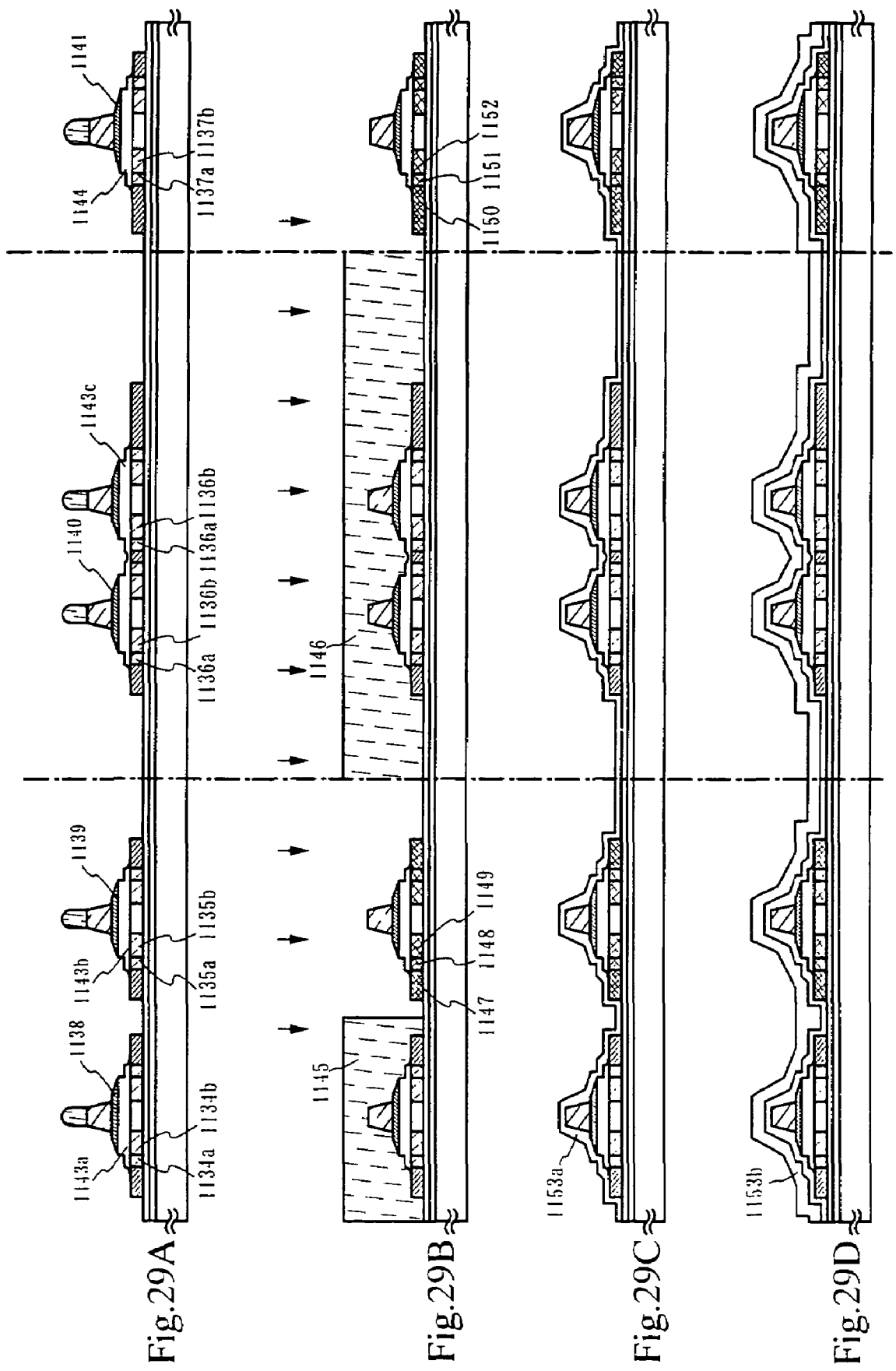

SEMICONDUCTOR DEVICE AND MANUFACTURING METHOD THEREOF

CROSS-REFERENCE TO RELATED APPLICATION

This application is a divisional application of U.S. application Ser. No. 09/852,672, filed on May 11, 2001, now allowed, which claims the benefit from foreign priority applications filed in Japan on May 12, 2000 as Ser. No. 2000-140695 and on May 29, 2000 as Ser. No. 2000-159251. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a semiconductor device comprising a circuit composed of thin film transistors (hereinafter referred to as TFTs) and a manufacturing method thereof, and for example, an electro-optical device which is represented by a liquid crystal display panel, an EL (electro luminescence) display device, an EC display device, and the like, and an electronic device in which such an electro-optical device is mounted as a part.

Note that, in this specification, the semiconductor device represents all devices which can operate utilizing a semiconductor characteristic, and thus an electro-optical device, a semiconductor circuit, and an electronic device are all semiconductor devices.

2. Description of the Related Art

Recently, a development of a semiconductor device with a large area integrated circuit formed by a thin film transistor (TFT), which is formed using a semiconductor thin film (several to several hundreds of nm in thickness) formed on a substrate with an insulating surface, has been progressing. An active matrix liquid crystal display device, an EL display device, and a contact type image sensor are known as typical examples. In particular, Since a TFT using a crystalline silicon film (typically, a polysilicon film) as an active layer (hereinafter referred to as polysilicon TFT) has a high field effect mobility, it can be also used for forming various functional circuits.

For example, in the active matrix liquid crystal display device, a pixel circuit for performing image display in respective functional blocks and a driver circuit (composed of a shift register circuit, a level shifter circuit, a buffer circuit, a sampling circuit, and the like, which are based on a CMOS circuit) for controlling the pixel circuit, are formed on a single substrate.

In the pixel circuit of the active matrix liquid crystal display device, the TFT (pixel TFT) is disposed in each of several tens to several millions of pixels, and a pixel electrode is provided in the respective pixel TFTs. A counter electrode is provided at the side of a opposing substrate with liquid crystal between the pixel electrode and the counter electrode. Thus, a kind of a capacitor using liquid crystal as a dielectric is formed. Then, a voltage applied to each of the pixels is controlled by a switching operation of the TFT. Thus, the liquid crystal is driven by controlling control an amount of charges to the capacitor, and an amount of transmtted light is controlled to display an image.

The pixel TFT is an n-channel type TFT, and is used as a switching element for applying a voltage to the liquid crystal and driving it. Since the liquid crystal is driven by an alternating current, a system called a frame inversion drive is employed in many cases. In this system, in order to keep consumption power low, it is important that an off-current value (drain current flowing when the TFT is in an off state) is sufficiently kept low as a characteristic required for the pixel TFT.

A low concentration drain (lightly doped drain: LDD) structure is known as a TFT structure for reducing the off-current value. It is required for forming this structure that an impurity element is added with a low concentration to a region between a channel forming region and a source region, or the channel forming region and a drain region, to which the impurity element is added with a high concentration, and the region is referred to as an LDD region. Further, a so-called GOLD (gate-drain overlapped LDD) structure, in which the LDD region is disposed to overlap with a gate electrode through a gate insulating film, is known as a means for preventing a reduction in an on-current value due to a hot carrier. It is known that such a structure relaxes a high electric field near the drain region to prevent a hot carrier injection and thus is effective to prevent a degradation phenomenon.

Here, there is a problem that the off-current value becomes larger than that in the general LDD structure although the GOLD structure has a large effect for preventing the degradation of the on-current value. Thus, this GOLD structure is not preferred for applying the pixel TFT. On the other hand, although the general LDD structure has a large effect for suppressing an increase of the off-current value, an effect for relaxing concentration of an electric field near the drain region to prevent the degradation due to a hot carrier injection is small. Therefore, in the semiconductor device which has a plurality of integrated circuits, such as the active matrix liquid crystal display device, the above problems are made clear particularly in the crystalline silicon TFT as the characteristics are improved a performance required for the active matrix liquid crystal display device are improved.

Conventionally, when the TFT with the LDD structure or the TFT with the GOLD structure is formed, there is a problem that these manufacturing processes become complicated and the number of processes is increased. It is apparent that the increase in the number of processes causes not only an increase of a manufacturing cost, but also a reduction in a manufacturing yield.

SUMMARY OF THE INVENTION

The present invention is a technique for solving the above problems, and an object of the present invention is to realize, in an electro-optical device and a semiconductor device which are represented by an active matrix liquid crystal display device manufactured using TFTs, an improvement of an operation characteristic and reliability of the semiconductor device, low consumption power, and a reduction in a manufacturing cost and an improvement of a manufacturing yield due to a reduction in the number of processes.

To realize the reduction in the manufacturing cost and the improvement of the manufacturing yield, it is considered as one means that the number of processes is reduced. Concretely, the number of photomasks required for manufacturing the TFTs is reduced. The photomask is used for forming a resist pattern as a mask on a substrate in an etching process in a photolithography technique. Thus, using one photomask means that processes such as resist peeling, washing, and drying, except for processes such as film formation and etching, are added before and after the etching process, and complicated processes such as resist application, prebaking, exposure, development, and postbaking are performed in the photolithography process.

The present invention is characterized in that the number of photomasks is made less than conventionally, and thus the TFTs are manufactured by manufacturing processes as mentioned below. Note that one example of a manufacturing method of the present invention is shown in FIGS. 1 and 2.

A manufacturing method of the present invention disclosed in this specification, comprises:

a first step of forming a semiconductor layer 12 on an insulating surface;

a second step of forming an insulating film 13 on the semiconductor layer 12;

a third step of forming a first electrode made from a lamination of a first conductive layer 18a with a first width (W1) and a second conductive layer 17b, on the insulating film 13;

a fourth step of adding an impurity element to the semiconductor layer 12 using the first electrode as a mask to form high concentration impurity regions 20 and 21;

a fifth step of etching the second conductive layer 17b to form a second electrode made from a lamination of the first conductive layer 18b with the first width (W1) and the second conductive layer 17c with a second width (W2);

a sixth step of adding the impurity element to the semiconductor layer 12 using the second conductive layer as a mask to form low concentration impurity regions 24 and 25; and a seventh step of etching the first conductive layer 18b to form a third electrode made from a lamination of the first conductive layer 18c with a third width (W3) and the second conductive layer 17c with the second width (W2).

In the above manufacturing method, a heat-resistant conductive material is used as a material for forming the first conductive film and the second conductive film. Typically, the first conductive film and the second conductive film are made of one element selected from the group consisting of tungsten (W), tantalum (Ta), and titanium (Ti), or a compound or an alloy containing the selected element.

In the above third step, the first electrode has a shape with a thickness gradually increasing from the end to the inside in an edge, a so-called taper shape.

In order to rapidly etch the first conductive film and the second conductive film with high precision, which are made of the heat-resistant conductive material, and to form the edges into the tapered shape, a dry etching method using high density plasma is applied. An etching apparatus using a microwave or inductively coupled plasma (ICP) is suitable to generate the high density plasma. In particular, the ICP etching apparatus is easy to control the plasma and can be used for a large area substrate to be processed.

A plasma processing method and a plasma processing apparatus are disclosed in Japanese Patent Application Laid-open No. Hei 9-293600. In this document, a method of applying high frequency power to a multi-spiral coil through an impedance matching device to form plasma is described as a means for performing plasma processing with high precision. The multi-spiral coil is constructed such that four spiral shaped coil portions are connected with each other in parallel. Here, the length of the respective coil portions is set to be a quarter of the wavelength of the high frequency power. Further, a separate high frequency power is also applied to a lower electrode for holding an object to be processed to provide a bias voltage.

When such an etching apparatus using the ICP to which the multi-spiral coil is applied is used, an angle of a taper portion (taper angle) is largely changed depending on bias power applied to a substrate side. When the bias voltage is further increased and a pressure is changed, the angle of the taper portion can be changed in a range of 5° to 45°.

Also, in the above fourth step, in order to form the high concentration impurity regions 20 and 21 in a self-aligning manner, a method of accelerating the ionized impurity element with an electric field to add to the semiconductor layer through a gate insulating film is used. In the present invention, a film, including an insulating film which is provided in contact with the first electrode and the semiconductor layer and between them, and other insulating films which extend from the above insulating film to a peripheral region, is referred to as the gate insulating film. In this specification, the above method of adding the impurity element is called "a through dope method" as a matter of convenience.

Note that, in this specification, the impurity element represents an impurity element (phosphorus or arsenic) for imparting an n-type conductivity to a semiconductor or an impurity (boron) for imparting a p-type conductivity to the semiconductor.

Also, in the above fifth step, by the etching apparatus using the ICP, the second conductive layer is selectively etched so that the second width (W2) of the second conductive layer 17C composing the second electrode is narrower than the first width (W1). Further, the taper angle in the edge of the first conductive layer in the second electrode is set to be smaller than that in the edge of the second conductive layer.

The present invention is characterized in that, in the above sixth step after the second electrode with such a shape is formed, the low concentration impurity regions 24 and 25, in which the concentration of the impurity element is continuously increased as the distance from the channel forming region increases, are formed in the semiconductor layer located under the taper portion (formed with the taper shape) of the first conductive layer composing the second electrode using the through dope method. Note that a concentration difference in the low concentration impurity regions is hardly produced although the concentration is continuously increased.

Thus, in order to form the low concentration impurity regions 24 and 25 with a gentle concentration gradient in a self-aligning manner, the ionized impurity element is accelerated with the electric field to add to the semiconductor layer through the taper portion of the first conductive layer composing the second electrode and the gate insulating film. Therefore, when the through dope method is applied to the taper portion of the first conductive layer composing the second electrode, the concentration of the impurity element added to the semiconductor layer can be controlled depending on the thickness of the taper portion of the first conductive layer, and then the low concentration impurity regions 24 and 25, in which the concentration of the impurity element gradually changes along the channel length direction of the TFT, can be formed.

Note that, immediately after the sixth step using the above through doping method, the low concentration impurity regions 24 and 25 are overlapped with the taper portions of the first conductive layer composing the second electrode through the gate insulating film.

Also, in the above seventh step, the taper portion of the first conductive layer is selectively etched. The etching in the seventh step is an etching using a RIE method, and is different from an etching method used in the third step and the fifth step. Note that, the etching is not limited to the RIE method. If a suitable condition is selected, the etching can be performed using a dry etching apparatus of the ICP system, or the etching using the RIE method after using the ICP method can be performed. By this seventh step, the taper angle of the first conductive layer in the third electrode becomes substantially equal to that of the first conductive layer in the second electrode. Also, the third width (W3) is set to be narrower than the first width (W1) and wider than the second width (W2). Further, the insulating film is removed simultaneously in the seventh step to expose portions of the high concentration impurity regions.

Note that, immediately after the above seventh step, the respective low concentration impurity regions can be divided into a region 25a which is overlapped with the taper portion of the first conductive layer composing the third electrode through the gate insulating film, and a region 25b which is not overlapped with the taper portion of the first conductive layer composing the third electrode through the gate insulating film.

Also, the third width (W3) can be freely controlled by suitably changing an etching condition. Thus, according to the present invention, the width of the low concentration impurity region which is overlapped with the third electrode and the width of the low concentration impurity region which is not overlapped with the third electrode can be freely controlled by suitably changing the etching condition in the seventh step. Note that the low concentration impurity region has a gentle concentration gradient regardless of the width of the third electrode. In the region which is overlapped with the third electrode, a hot carrier injection can be prevented since a relaxation of the electric field concentration is achieved. Also, in the region which is not overlapped with the third electrode, an increase of the off-current value can be suppressed.

In the above manufacturing method, a first photolithography process is performed in the first step and a second photolithography process is performed in the third step. However, in the other steps (the fourth step to the seventh step), a photolithography process is not performed since a resist mask which has been used in the second photolithography process is used as it is.

Therefore, after the above seventh step, a third photolithography process for forming a contact hole in an interlayer insulating film to be formed and a fourth photolithography process for forming a source electrode or a drain electrode which reaches the semiconductor layer, are performed, and thus the TFT can be manufactured.

As described above, although the number of photomasks is reduced, according to the present invention, a suitable TFT structure can be obtained. The structure of the present invention is represented below.

According to the present invention disclosed in this specification, there is provided a semiconductor device comprising a semiconductor layer formed on an insulating surface, an insulating film formed on the semiconductor layer, and a gate electrode formed on the insulating film, characterized in that the gate electrode has a lamination structure in which a first conductive layer with a first width (corresponding to W3 in FIG. 2) is a lower layer and a second conductive layer with a second width (corresponding to W2 in FIG. 2) which is narrower than the first width is an upper layer, and
the semiconductor layer has a channel forming region which is overlapped with the second conductive layer, a low concentration impurity region which is partially overlapped with the first conductive layer, and a source region and a drain region which are comprised of high concentration impurity regions.

Further, in the above structure, it is characterized in that the low concentration impurity region is located between the channel forming region and the source region, or between the channel forming region and the drain region.

Further, in the above structure, it is characterized in that an end portion of the first conductive layer has a taper shape.

Moreover, in the above structure, it is characterized in that the end portion of the first conductive layer is located between the channel forming region and the source region, or between the channel forming region and the drain region, through the insulating film.

Further, in the above structure, it is characterized in that a film thickness of a region of the insulating film which is overlapped with the low concentration impurity region becomes thinner as a distance from the channel region is larger.

Furthermore, as shown in FIG. 3, the present invention is characterized in that, in the low concentration impurity region 25 provided between the channel forming region 26 and the drain region 23, the concentration gradient is formed such that the concentration of the impurity element for imparting a conductivity type is gradually increased as the distance from the drain region decreases, and the low concentration impurity region 25 with a gentle concentration gradient includes the region (GOLD region) 25a which is overlapped with the gate electrode 18c and the region (LDD region) 25b which is not overlapped with the gate electrode 18c.

Note that, in this specification, the low concentration impurity region which is overlapped with the gate electrode through the insulating film is called the GOLD region, and the low concentration impurity region which is not overlapped with the gate electrode is called the LDD region.

Also, the present invention is characterized in that the electro-optical device which represents the liquid crystal display device and the EL display device is formed using the TFTs having the above structure.

Further, the present invention is characterized in that the number of photomasks is made less than that conventionally, and thus the TFTs are manufactured by manufacturing processes as mentioned below. Note that one example of a manufacturing method of the present invention is shown in, FIGS. 23 and 24;

According to the present invention disclosed in this specification, as shown in FIGS. 23 and 24, there is provided a method of manufacturing a semiconductor device, comprising:

a first step of forming a semiconductor layer on an insulating surface;

a second step of forming an insulating film on the semiconductor layer;

a third step of forming a first electrode made from a lamination of a first conductive layer with a first width (W1) and a second conductive layer, on the insulating film;

a fourth step of etching the second conductive layer to form a second electrode made from a lamination of the first conductive layer with the first width (W1) and the second conductive layer with a second width (W2);

a fifth step of adding an impurity element to the semiconductor layer using the second electrode as a mask to form a high concentration impurity region;

a sixth step of adding the impurity element to the semiconductor layer through the first conductive layer using the second conductive layer as a mask to form a low concentration impurity region; and a seventh step of etching the first conductive layer to form a third electrode made from a lamination of the first conductive layer with a third width (W3) and the second conductive layer with the second width (W2).

In the above manufacturing method, a heat-resistant conductive material is used as a material for forming the first conductive film and the second conductive film. Typically, the first conductive film and the second conductive film are made of one element selected from the group consisting of tungsten (W), tantalum (Ta), and titanium (Ti), or a compound or an alloy containing the selected element.

In the above third step, the first electrode has a shape that is a thickness gradually increasing from the end to the inside in an end portion, a so-called taper shape.

Also, in the above fourth step, the second conductive layer is selectively etched so that the second width (W2) of the second conductive layer 17c composing the second electrode is narrower than the first width (W1) using the etching apparatus using the ICP. Further, the taper angle in the end portion of the first conductive layer in the second electrode is set to be smaller than that in the end portion of the second conductive layer.

Subsequently, in the above sixth step, using the through dope method, the low concentration impurity regions 1024 and 1025, in which the concentration of the impurity element is continuously increased as the distance from the channel forming region increases, are formed in a self-aligning manner in the semiconductor layer located under the taper portion (formed with the taper shape) of the first conductive layer composing the second electrode.

Note that, immediately after the sixth step using the above through doping method, the low concentration impurity regions 1024 and 1025 are overlapped with the taper portion of the first conductive layer composing the second electrode through the gate insulating film.

Also, in the above seventh step, the first conductive layer is selectively etched. As the etching in the seventh step, the etching using the RIE method, the etching using the ICP method, or the etching using the RIE method after using the ICP method may be suitably performed by an operator. By this seventh step, the taper angle of the first conductive layer in the third electrode becomes substantially equal to that of the first conductive layer in the second electrode. Also, the third width (W3) is set to be narrower than the first width (W1), and wider than the second width (W2). Here, although the example, in which the insulating film is removed simultaneously in the seventh step to expose portions of the high concentration impurity regions, is described, the present invention is not particularly limited to this example, and the insulating film may be left thin.

Note that, immediately after the above seventh step, the respective low concentration impurity regions can be divided into a region 1025a which is overlapped with the taper portion of the first conductive layer composing the third electrode through the gate insulating film and a region 1025b which is not overlapped with the taper portion of the first conductive layer composing the third electrode through the gate insulating film.

Also, the third width (W3) can be freely controlled by suitably changing an etching condition. Thus, according to the present invention, the width of the low concentration impurity region which is overlapped with the third electrode and the width of the low concentration impurity region which is not overlapped with the third electrode can be freely controlled by suitably changing the etching condition in the seventh step. However, the low concentration impurity region has a gentle concentration gradient regardless of the width of the third electrode. In the region which is overlapped with the third electrode, since a relaxation of electric field concentration is made, a hot carrier injection can be prevented. In the region which is not overlapped with the third electrode, an increase of the off-current value can be suppressed.

In the above manufacturing method, a first photolithography process is performed in the first step and a second photolithography process is performed in the third step. However, in other steps (the fourth step to the seventh step), since a resist mask which has been used in the second photolithography process is used as it is, a photolithography process is not performed.

Therefore, after the above seventh step, a third photolithography process for forming a contact hole in an interlayer insulating film to be formed and a fourth photolithography process for forming a source electrode or a drain electrode, which reaches the semiconductor layer, are performed, and thus the TFT can be manufactured.

Also, in the above manufacturing process, although the high concentration doping is performed in the fifth step and the low concentration doping is performed in the sixth step, the low concentration doping may be performed in the fifth step and the high concentration doping may be performed in the sixth step. In this case, a manufacturing method of the present invention, comprises:

a first step of forming a semiconductor layer on an insulating surface;

a second step of forming an insulating film on the semiconductor layer;

a third step of forming a first electrode made from a lamination of a first conductive layer with a first width (W1) and a second conductive layer, on the insulating film;

a fourth step of etching the second conductive layer to form a second electrode made from a lamination of the first conductive layer with the first width (W1) and the second conductive layer with a second width (W2);

a fifth step of adding an impurity element to the semiconductor layer through the first conductive layer using the second conductive layer as a mask to form a low concentration impurity region;

a sixth step of adding the impurity element to the semiconductor layer using the second electrode as a mask to form a high concentration impurity region; and a seventh step of etching the first conductive layer to form a third electrode made from a lamination of the first conductive layer with a third width (W3) and the second conductive layer with the second width (W2).

Also, according to the present invention disclosed in this specification, there is provided a method of manufacturing a semiconductor device, comprising:

a first step of forming a semiconductor layer on an insulating surface;

a second step of forming an insulating film on the semiconductor layer;

a third step of forming a first electrode made from a lamination of a first conductive layer with a first width (W1) and a second conductive layer, on the insulating film;

a fourth step of etching the second conductive layer to form a second electrode made from a lamination of the first conductive layer with the first width (W1) and the second conductive layer with a second width (W2);

a fifth step of adding an impurity element to the semiconductor layer using the second conductive layer as a mask to form a low concentration impurity region and a high concentration impurity region; and a sixth step of etching the first conductive layer to form a third electrode made from a lamination of the first conductive layer with a third width (W3) and the second conductive layer with the second width (W2).

Thus, when the doping condition is suitably adjusted by a user, a process for forming the low concentration impurity region and the high concentration impurity region can be performed by doping process one time.

Also, one example of a manufacturing method of the present invention is shown in FIGS. 25A to 26D.

According to the present invention disclosed in this specification, as shown in FIGS. 25A to 26D, there is provided a method of manufacturing a semiconductor device, comprising:

a first step of forming a semiconductor layer on an insulating surface;

a second step of forming an insulating film on the semiconductor layer;

a third step of laminating a first conductive film and a second conductive film on the insulating film;

a fourth step of forming a second conductive layer with a first width (X1);

a fifth step of adding an impurity element to the semiconductor layer using the second conductive layer with the first width (X1) as a mask to form a high concentration impurity region;

a sixth step of etching the first conductive film to form a first electrode made from a lamination of a first conductive layer with a second width (X2) and the second conductive layer with a third width (X3);

a seventh step of etching the second conductive layer to form a second electrode made from a lamination of the first conductive layer with the second width (X2) and the second conductive layer with a fourth width (X4);

an eighth step of adding the impurity element to the semiconductor layer through the first conductive layer using the second conductive layer with the fourth width (X4) as a mask to form a low concentration impurity region; and a ninth step of etching the first conductive layer to form a third electrode made from a lamination of the first conductive layer with a fifth width (X5) and the second conductive layer with the fourth width (X4).

Further, in the above respective manufacturing methods, it is characterized in that, after the step of forming the third electrode, the method further comprises the steps of:

forming a first interlayer insulating film for covering the third electrode;

performing a first heat treatment for activating the impurity element in the semiconductor layer;

forming a second interlayer insulating film for covering the first interlayer insulating film; and performing a second heat treatment with a lower temperature than that of the first heat treatment after the formation of the second interlayer insulating film.

Furthermore, one example of a manufacturing method of the present invention is shown in FIGS. 25A to 25C and FIGS. 27A to 27D.

According to the present invention disclosed in this specification, as shown FIGS. 25A to 25C and FIGS. 27A to 27D, there is provided a method of manufacturing a semiconductor device, comprising:

a first step of forming a semiconductor layer on an insulating surface;

a second step of forming an insulating film on the semiconductor layer;

a third step of laminating a first conductive film and a second conductive film on the insulating film;

a fourth step of forming a second conductive layer with a first width (X1);

a fifth step of adding an impurity element to the semiconductor layer using the second conductive layer with the first width (X1) as a mask to form a high concentration impurity region;

a sixth step of etching the second conductive layer to form the second conductive layer with a second width (Y2);

a seventh step of adding an impurity element to the semiconductor layer through the first conductive film using the second conductive layer with the second width (Y2) as a mask to form a low concentration impurity region; and an eighth step of etching the first conductive film to form an electrode made from a lamination of the first conductive layer with a third width (Y3) and the second conductive layer with the second width (Y2).

Moreover, it is characterized in that after the eighth step, the manufacturing method further comprises:

a ninth step of forming a first interlayer insulating film for covering the third electrode;

a tenth step of performing a first heat treatment for activating the impurity element in the semiconductor layer;

an eleventh step of forming a second interlayer insulating film for covering the first interlayer insulating film; and a twelfth step of performing a second heat treatment with a lower temperature than that of the first heat treatment.

BRIEF DESCRIPTION OF THE DRAWINGS

In the accompanying drawings:

FIGS. 12A to 12C show a manufacturing process of an AM-LCD;

FIGS. 20A to 20F show examples of electronic equipment;

FIGS. 28A to 28D show a manufacturing process of an AM-LCD (Embodiment 10);

FIGS. 29A to 29D show the manufacturing process of the AM-LCD (Embodiment 10);

DESCRIPTION OF THE PREFERRED EMBODIMENTS

Figure 1A:
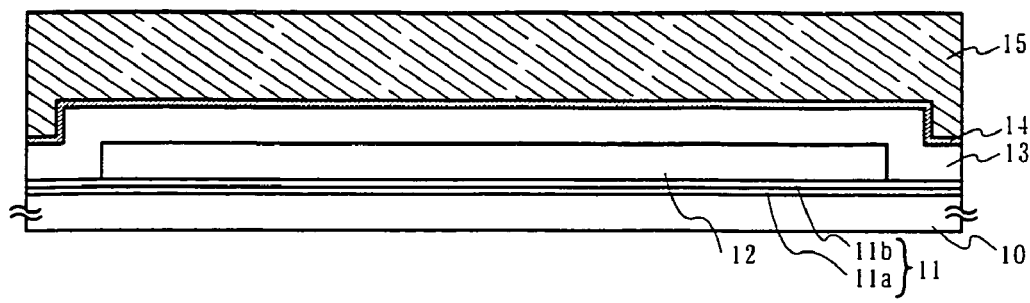
FIGS. 1A to 1D show a manufacturing process of a TFT.

An embodiment of the present invention will be described below with reference to FIGS. 1A to 3.

First, a base insulating film 11 is formed on a substrate 10. As the substrate 10, a glass substrate, a quartz substrate, and a silicon substrate may be used. Also, a metal substrate or a stainless substrate, on which an insulating film is formed, may be used. Further, a plastic substrate with a resistible heat resistance to a treatment temperature may be used.

Also, as the base insulating film 11, the base insulating film 11 made of an insulating film such as a silicon oxide film, a silicon nitride film, or a silicon nitride oxide film is formed. Here, although an example, in which a two-layered structure (11a and 11b) is used as the base insulating film 11, is shown, a single layer film of the insulating film or a lamination structure with two layers or more may be used. Note that the base insulating film may be not formed.

Next, a semiconductor layer 12 is formed on the base insulating film 11. A crystalline semiconductor film obtained by using a known crystallization process (a laser crystallization method, a thermal crystallization method, a thermal crystallization method using a catalyst such as nickel, or the like) is formed into a predetermined shape pattern using a first photomask after a semiconductor film with an amorphous structure is formed by a known method (a sputtering method, an LPCVD method, a plasma CVD method, or the like), then the semiconductor film 12 is formed. The semiconductor film 12 is formed with a thickness of 25 to 80 nm (preferably, 30 to 60 nm). Although a material of the crystalline semiconductor film is not limited to a special material, preferably the crystalline semiconductor film may be formed using silicon, silicon germanium (SiGe) alloy, or the like.

Next, an insulating film 13 covering the semiconductor film 12 is formed.

The insulating film 13 is formed as a single layer or a lamination structure of an insulating film containing silicon with a thickness of 40 to 150 nm by using the plasma CVD method or the sputtering method. Note that this insulating film 13 becomes a gate insulating film.

Next, a first conductive film 14 with a film thickness of 20 to 100 nm and a second conductive film 15 with a film thickness of 100 to 400 nm are laminated on the insulating film 13 (FIG. 1A). Here, the first conductive film 14 made of TaN and the second conductive film 15 made of W are laminated using the sputtering method. Note that, here, although the first conductive film 14 is made of TaN and the second conductive film 15 is made of W, the first conductive film 14 and the second conductive film 15 are not limited to those and may be formed using one element selected from the group consisting of Ta, W, Ti, Mo, Al, and Cu, or using an alloy material or a compound material containing the element as its main constituent. Also, a semiconductor film, which is represented by a polycrystalline silicon film in which an impurity element such as phosphorus has doped, may be used.

Figure 1B:
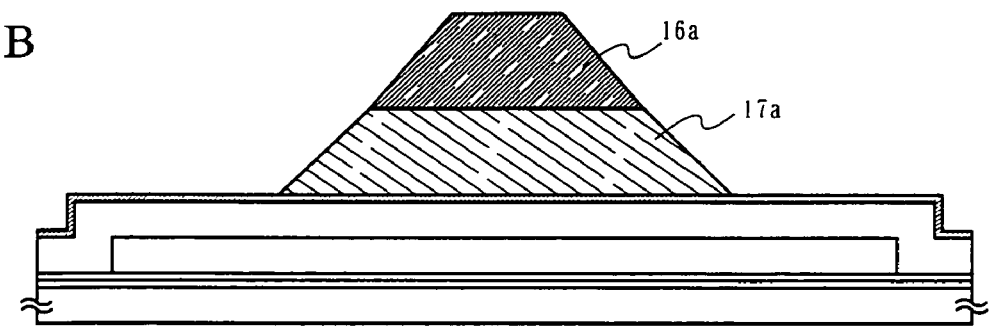

Next, a resist mask 16a is formed using a second photomask, and then a first etching process is performed using an ICP etching apparatus. The second conductive film 15 is etched by this first etching process to obtain a second conductive layer 17a with a taper portion (a portion with a taper shape) in an end portion, as shown in FIG. 1B.

Here, an angle of the taper portion (taper angle) is defined as an angle formed by a substrate surface (horizontal surface) and a slanting portion of the taper portion. The taper angle of the second conductive layer 17a can be set in a range of 5° to 45° by selecting a suitable etching condition.

Figure 1C:
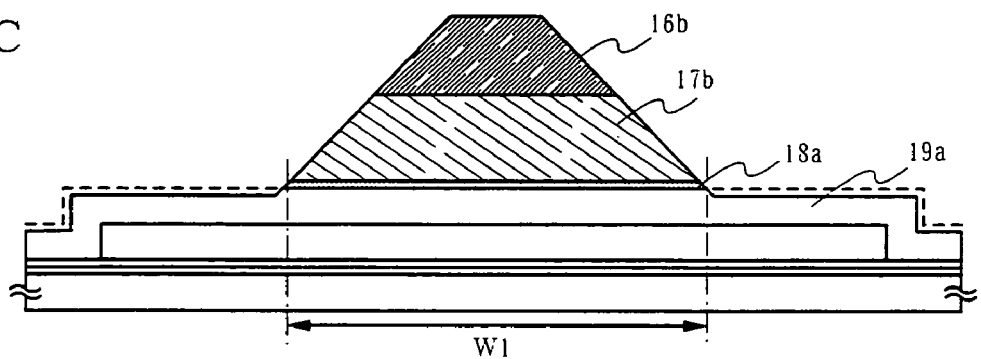

Next, using the resist mask 16a as it is, a second etching process is performed using the ICP etching apparatus. The first conductive film 14 is etched in the second etching process to form a first conductive layer 18a as shown in FIG. 1C. The first conductive layer 18a has a first width (W1). Note that, in this second etching process, the resist mask, the second conductive layer, and the insulating film are slightly etched to form a resist mask 16b, a second conductive layer 17b, and an insulating film 19a, respectively.

Figure 2A:
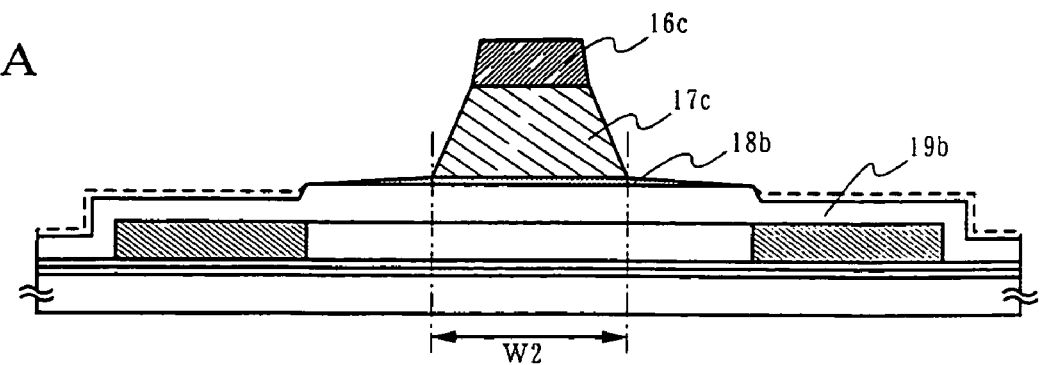
FIGS. 2A to 2D show the manufacturing process of the TFT.
Figure 2B:
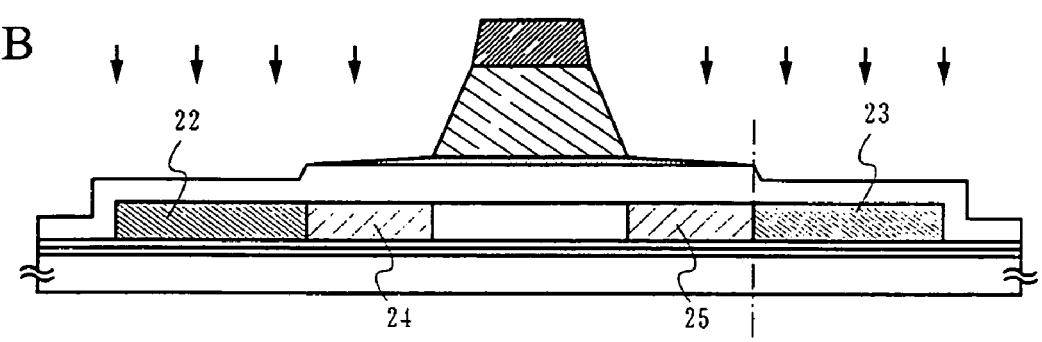
Figure 2C:
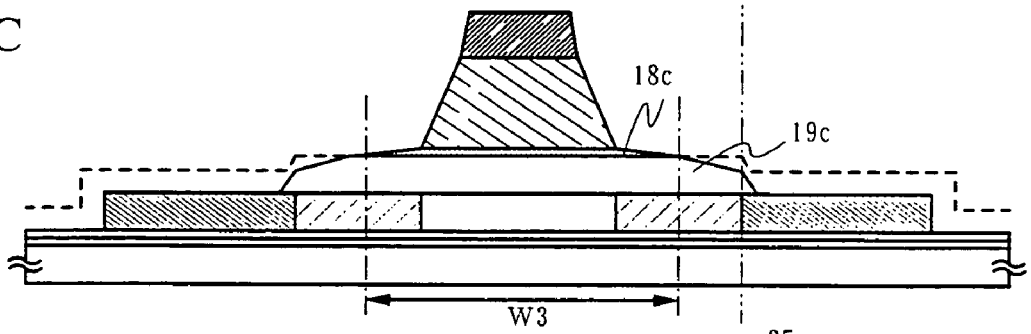

Note that, here, in order to suppress a film reduction of the insulating film 13, the etching process is performed two times (the first etching process and the second etching process). However, if an electrode structure (lamination layer of the second conductive layer 17b and the first conductive layer 18a) as shown in FIG. 2C can be formed, the number of etching process is not limited to two times, and the etching process may be performed one time.

Figure 1D:
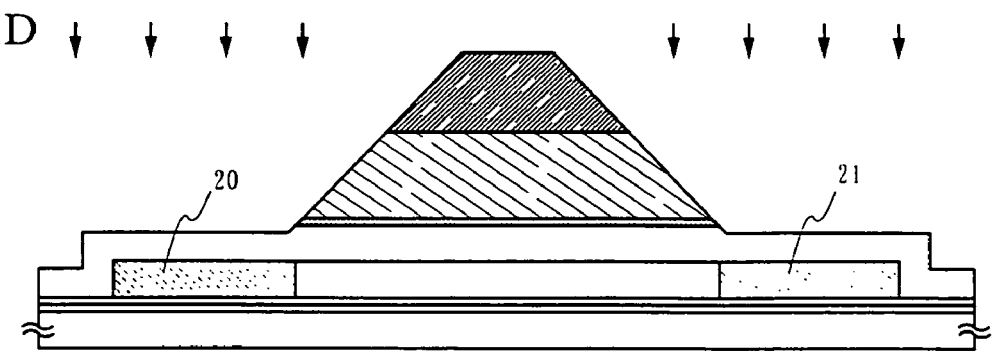

Next, with the resist mask 16b as it is, a first doping process is performed. A through doping is performed through the insulating film 19a in the first doping process to form high concentration impurity regions 20 and 21 (FIG. 1D).

Next, using the resist mask 16b, a third etching process is performed using the ICP apparatus. In this third etching process, the second conductive layer 17b is etched to form the second conductive film 17c as shown in FIG. 2A. The second conductive layer 17c has a second width (W2). Note that, in this third etching process, the resist mask, the first conductive layer, and the insulating film are slightly etched to form a resist mask 16c, a first conductive layer 18b, and an insulating film 19b, respectively.

Next, with the resist mask 16c as it is, a second doping process is performed. A through doping is performed through the taper portion of the first conductive layer 18b and the insulating film 19b in the second doping process to form low concentration impurity regions 24 and 25 (FIG. 2B). Note that, in this second doping process, the high concentration impurity regions 20 and 21 are doped to form high concentration impurity regions 22 and 23.

Next, with the resist mask 16c as it is, a fourth etching process is performed by an RIE apparatus. A portion of the taper portion of the first conductive layer 18b is removed by this fourth etching process. Here, the first conductive layer 18b with the first width (W1) becomes the first conductive layer 18c with a third width (W3). In the present invention, this first conductive layer 18c and the second conductive layer 17c laminated thereon become a gate electrode. Note that, in this fourth etching process, the insulating film 19b is also etched to form an insulating film 19c. Here, although an example, in which a portion of the insulating film is removed to expose the high concentration impurity regions is shown here, the present invention is not limited to this example.

After that, the resist mask 16c is removed to activate the impurity element added to the semiconductor layer. Next, after an interlayer insulating film 27 is formed, a contact hole is formed using a third mask and electrodes 28 and 29 are formed using a fourth mask.

Figure 2D:
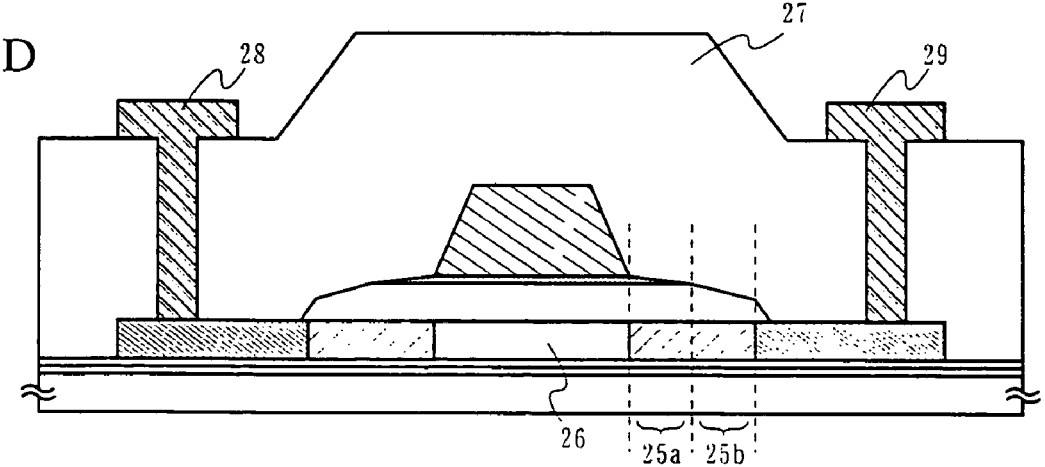
Figure 3:
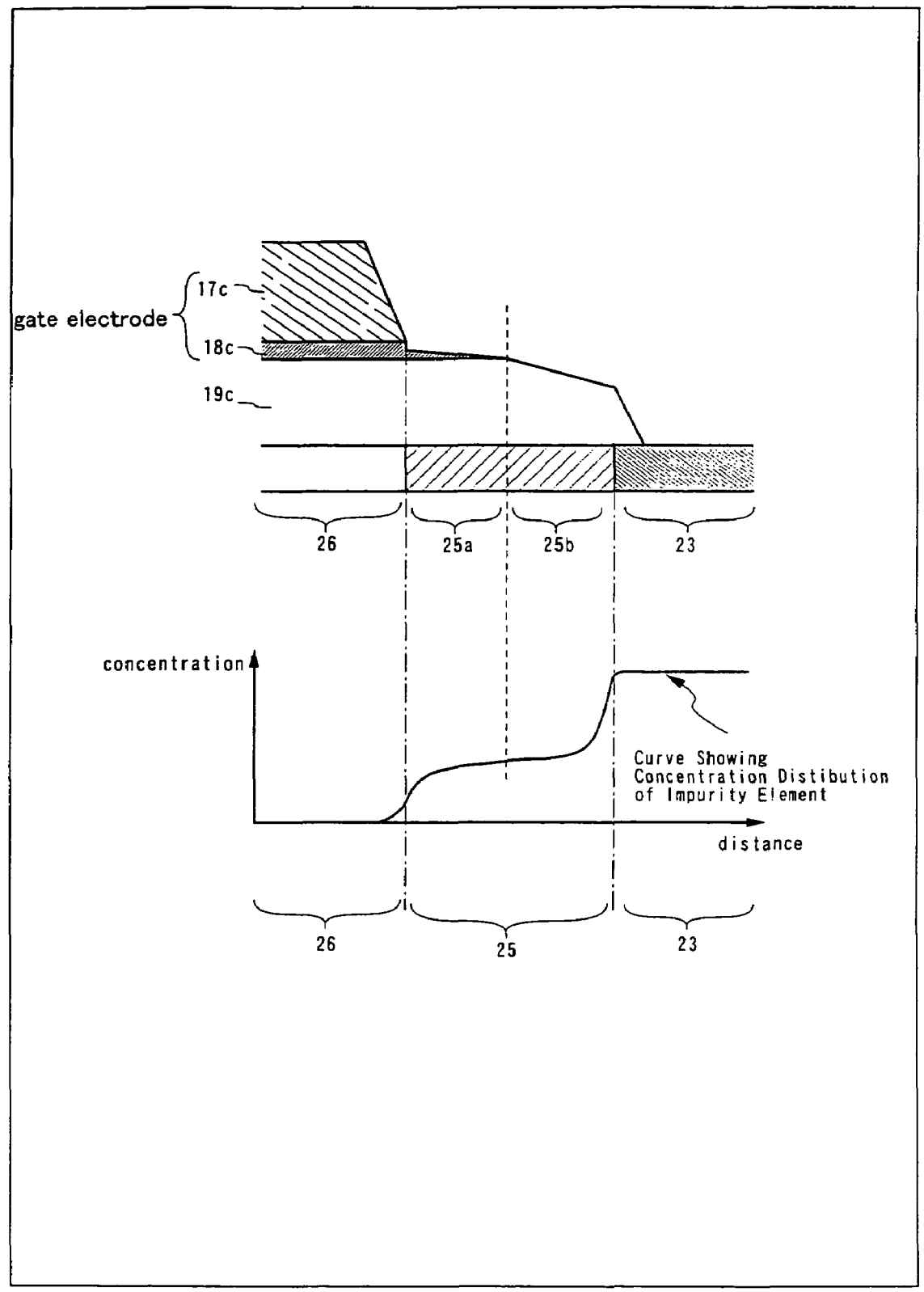
FIG. 3 shows a curve representing a concentration distribution of an impurity element.

Thus, the TFT with the structure as shown in FIG. 2D can be formed using four photomasks.

Also, the TFT formed by the present invention is characterized in that a concentration difference is hardly produced in the low concentration impurity region 25 provided between a channel forming region 26 and a drain region 23, and the low concentration impurity region 25 has a gentle concentration gradient and further a region 25a which is overlapped with a gate electrode 18c (GOLD region) and a region 25b which is not overlapped with the gate electrode 18c (LDD region). Also, a peripheral portion of the insulating film 19c, that is, the region 25b which is not overlapped with the gate electrode 18c and upper portions of the high concentration impurity regions 20 and 21 become a taper shape.

Figure 4:
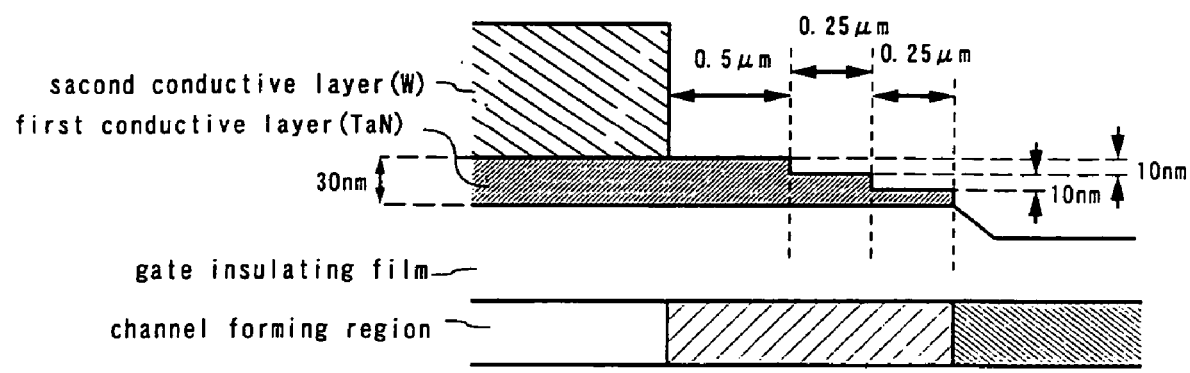
FIG. 4 is a schematic structural view used in a simulation.

Note that, a simulation is performed in the process of FIG. 2B. In this simulation, a schematic structural view as shown in FIG. 4 is used. A film thickness of the semiconductor layer is 42 nm and a film thickness of the gate electrode is 110 nm. The taper portion of the first conductive layer is modeled as a step-shaped structure as shown in FIG. 4. A case where phosphorus doping is performed with an accelerating voltage of 90 keV and a dosage of $1.4 \times 10^{13}$ atoms/cm$^2$ is assumed.

Figure 5:
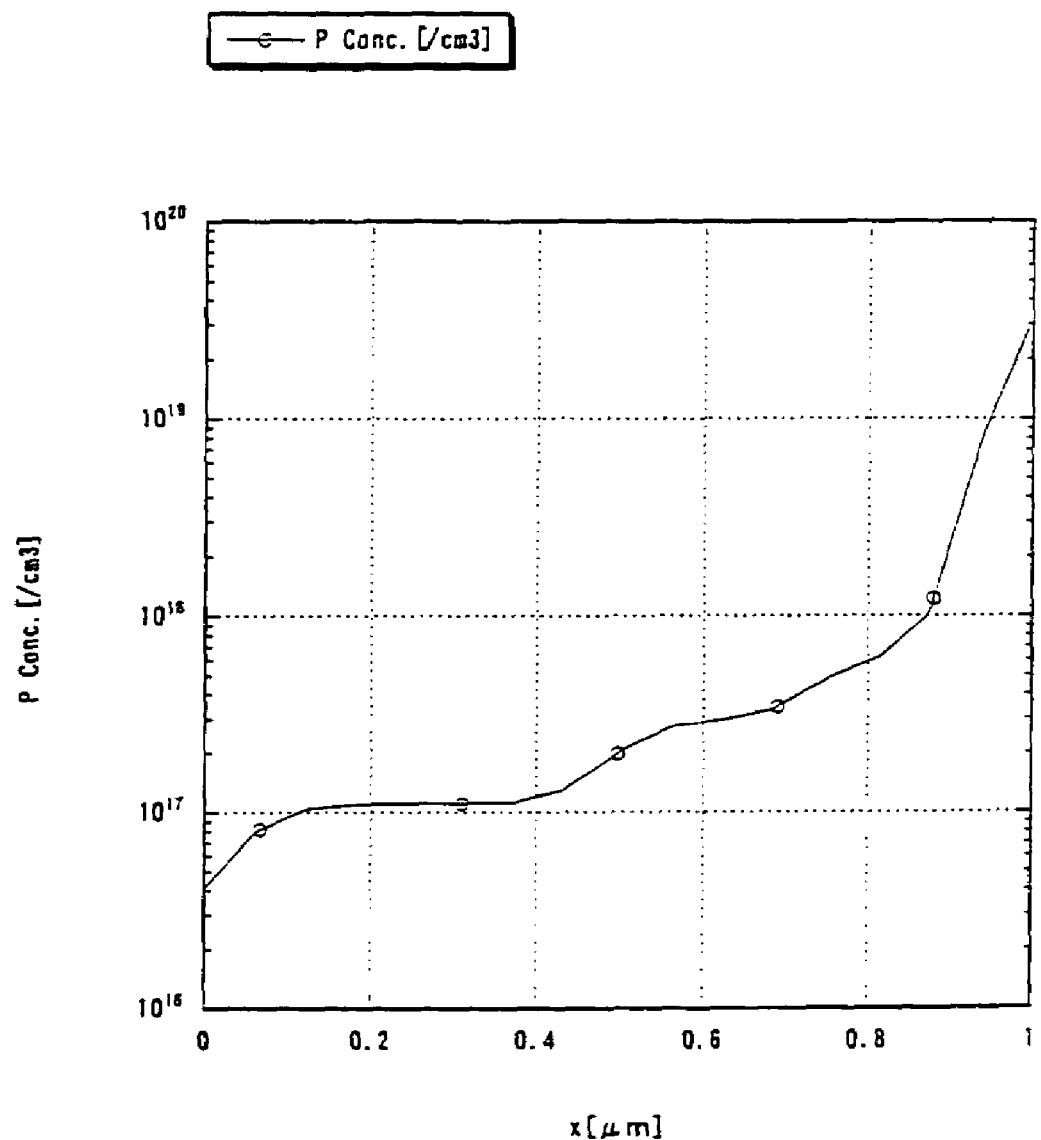
FIG. 5 is a graph of a simulation result (phosphorus doping)

The simulation result is shown in FIG. 5. In FIG. 5, it is shown that the concentration of the impurity element (phosphorus) is continuously increased as the distance from the channel forming region is increased. Note that the concentration gradient is gentle and the concentration difference in the low concentration impurity regions is hardly produced.

Figure 6:
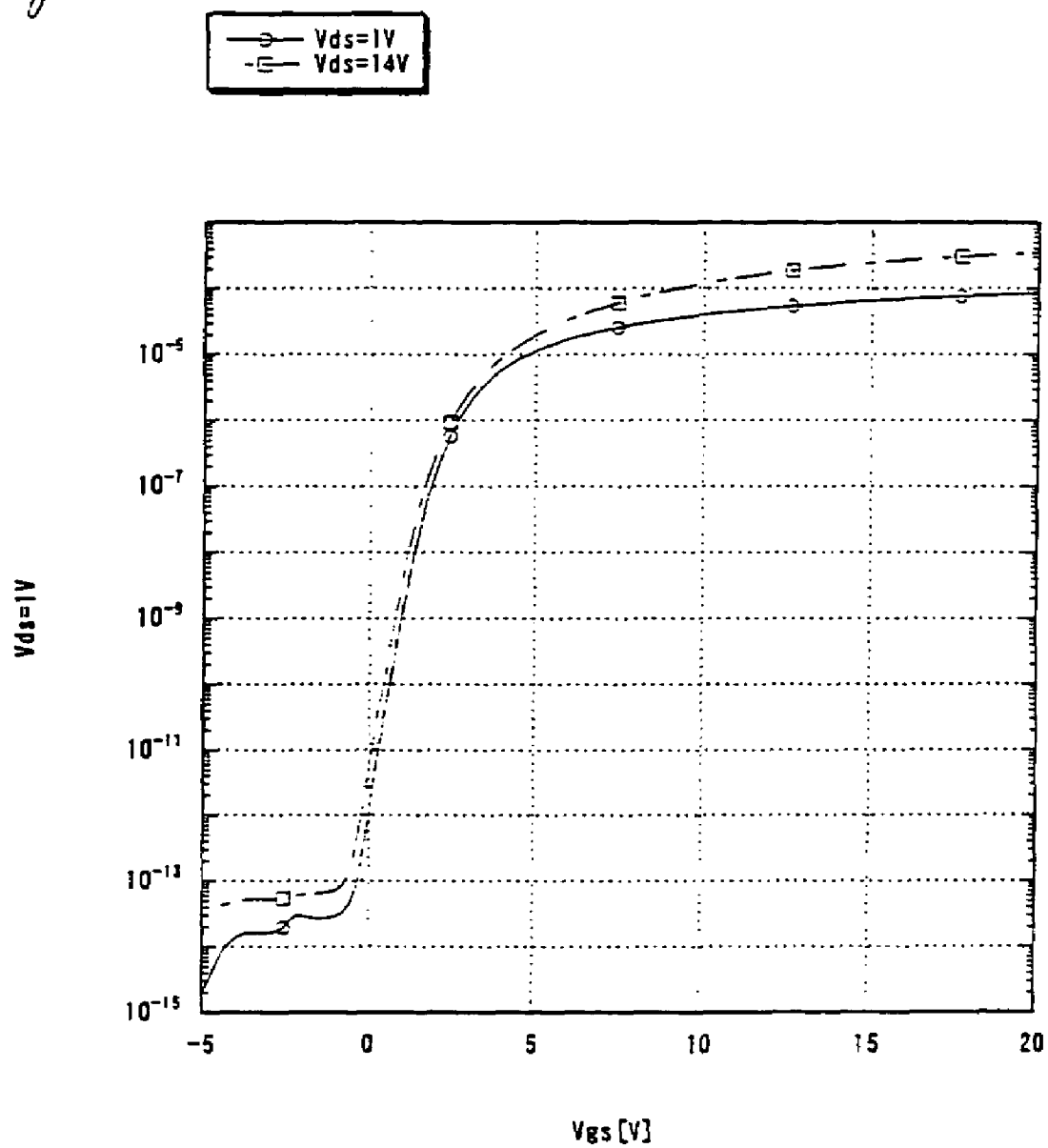
FIG. 6 is a graph of a simulation result (voltage/current characteristic of TFT)
Figure 7:
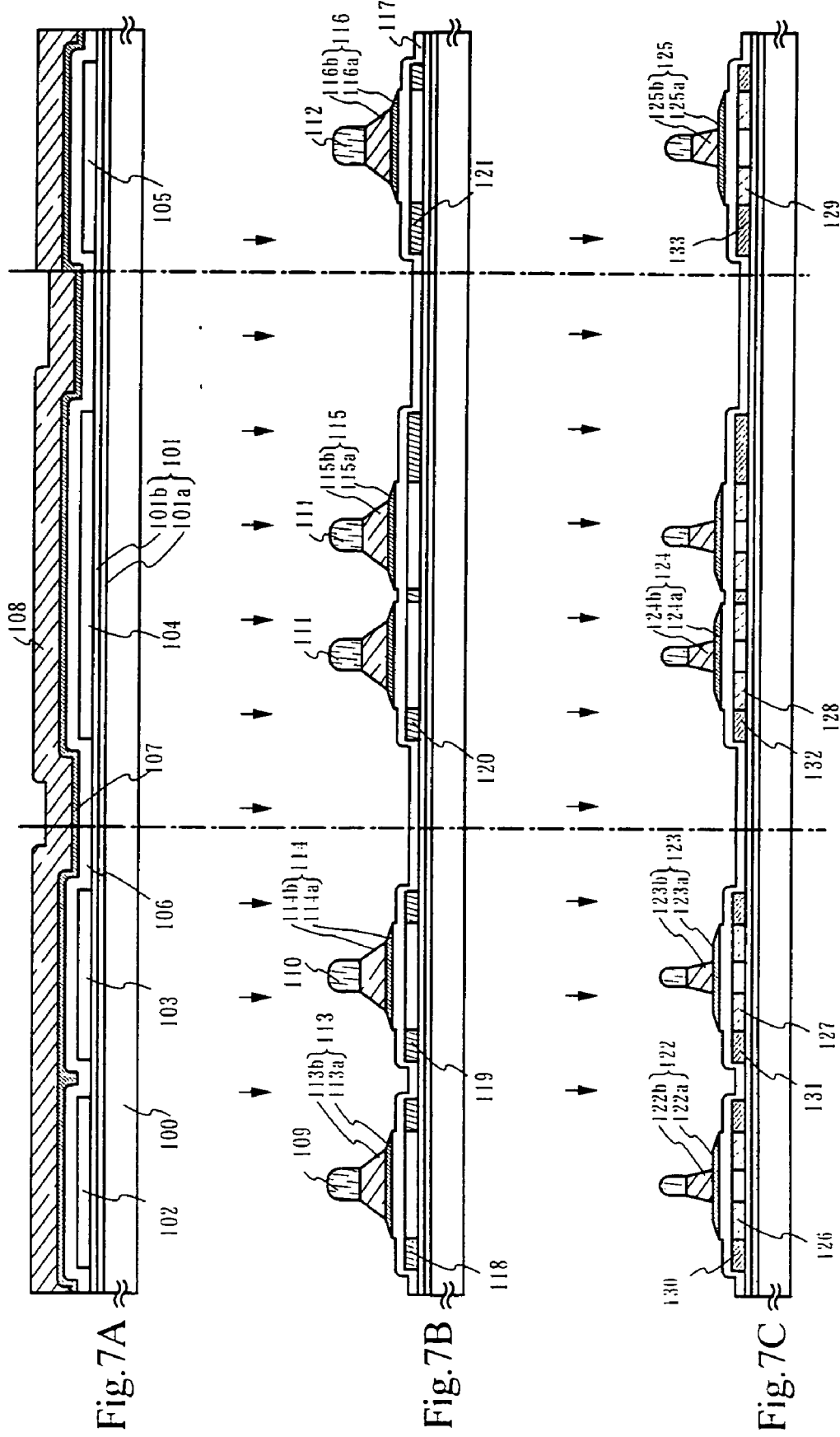
FIGS. 7A to 7C show a manufacturing process of an AM-LCD.
Figure 8:
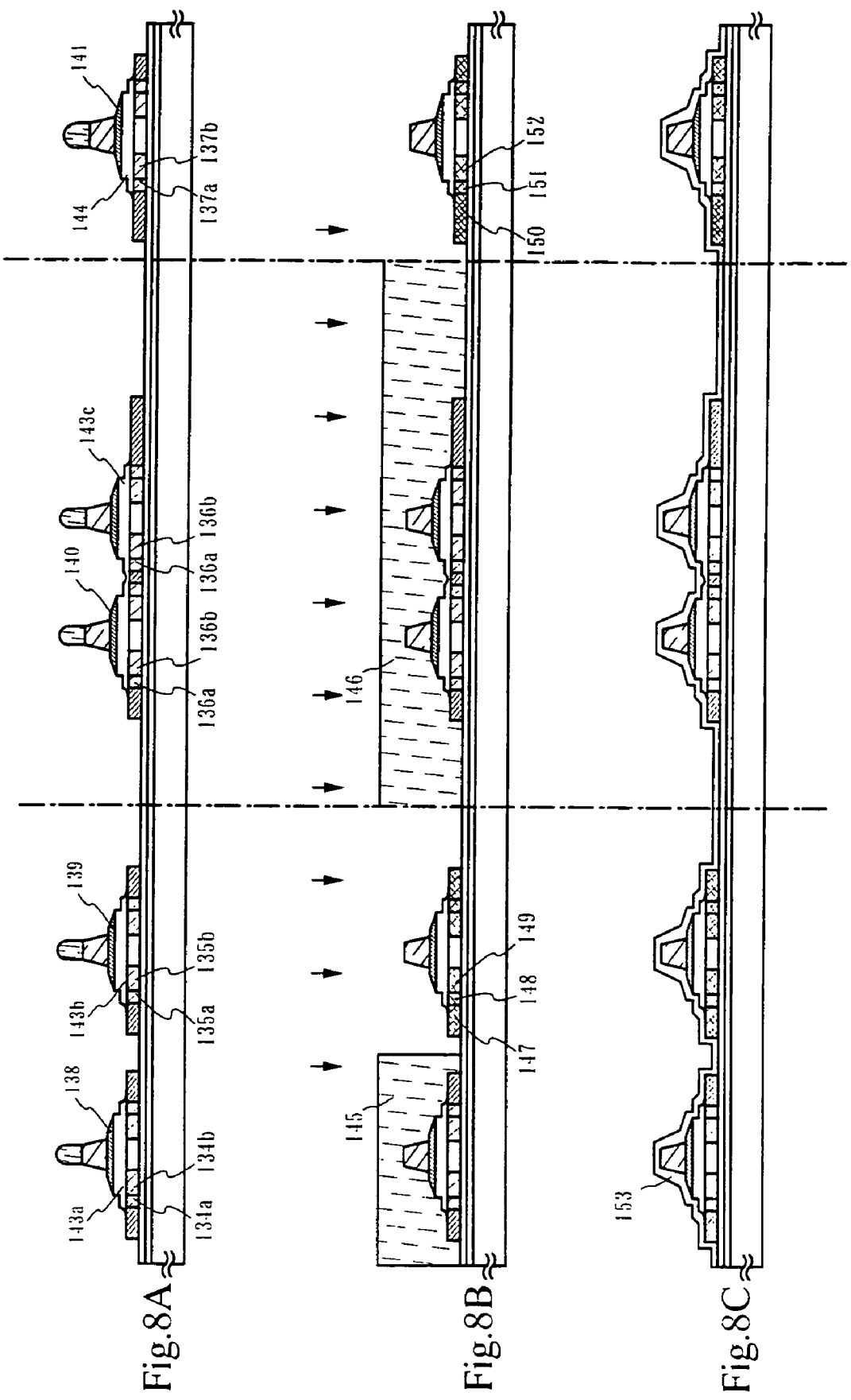
FIGS. 8A to 8C show the manufacturing process of the AM-LCD.

Also, a voltage/current characteristic of the TFT which has the concentration distribution obtained as FIG. 5 and is formed with the GOLD region with 0.5 μm in width and the LDD region with 0.5 μm in width is shown in FIG. 6. Note that, from this simulation, a threshold value (Vth) of the TFT is 1.881 V, an S value is 0.2878 V/dec, an on-current is 40 μA when Vds (a voltage difference between the source region and the drain region)=1 V, the on-current is 119.6 μA when Vds=14 V.

The present invention constructed above will be further described in detail with the embodiments mentioned below.

[Embodiment 1]

Here, a method of simultaneously forming, on the same substrate, a pixel portion and TFTs (n-channel TFT and p-channel TFT) of a driver circuit provided in the periphery of the pixel portion, is described in detail with FIGS. 7A to 9.

First, in this embodiment, a substrate 100 is used, which is made of glass such as barium borosilicate glass or aluminum borosilicate, represented by such as Corning #7059 glass and #1737 glass. Note that, as the substrate 100, there is no limitation provided that it is a substrate with transmittance, and a quartz substrate may be used. A plastic substrate with heat resistance to a process temperature of this embodiment may also be used.

Then, a base film 101 formed of an insulating film such as a silicon oxide film, a silicon nitride film or a silicon nitride oxide film is formed on the substrate 100. In this embodiment, a two-layer structure is used as the base film 101. However, a single-layer film or a lamination structure consisting of two or more layers of the insulating film may be used. As a first layer of the base film 101, a silicon nitride oxide film 101a is formed with a thickness of 10 to 200 nm (preferably 50 to 100 nm) with a plasma CVD method using SiH$_4$, NH$_3$, and N$_2$O as reaction gas. In this embodiment, the silicon nitride oxide film 101a (composition ratio Si=32%, O=27%, N=24% and H=17%) with a film thickness of 50 nm is formed. Then, as a second layer of the base film 101, a silicon nitride oxide film 101b is formed and laminated into a thickness of 50 to 200 nm (preferably 100 to 150 nm) with a plasma CVD method using SiH$_4$ and N$_2$O as reaction gas. In this embodiment, the silicon nitride oxide film 101b (composition ratio Si=32%, O=59%, N=7% and H=2%) with a film thickness of 100 nm is formed.

Subsequently, semiconductor layers 102 to 105 are formed on the base film. The semiconductor layers 102 to 105 are formed from a semiconductor film with an amorphous structure which is formed by a known method (such as a sputtering method, an LPCVD method, or a plasma CVD method), and is subjected to a known crystallization process (a laser crystallization method, a thermal crystallization method, or a thermal crystallization method using a catalyst such as nickel). The crystalline semiconductor film thus obtained is patterned into desired shapes to obtain the semiconductor layers. The semiconductor layers 102 to 105 are formed into the thickness of from 25 to 80 nm (preferably 30 to 60 nm). The material of the crystalline semiconductor film is not particularly limited, but it is preferable to be formed of silicon, a silicon germanium (Si$_x$Ge$_{1-x}$ (X=0.0001 to 0.02)) alloy, or the like. In this embodiment, 55 nm thick amorphous silicon film is formed by a plasma CVD method, and then, a nickel-containing solution is held on the amorphous silicon film. A dehydrogenation process of the amorphous silicon film is performed (500° C. for one hour), and thereafter a thermal crystallization process is performed (550° C. for four hours) thereto. Further, to improve the crystallinity thereof, a laser annealing treatment is performed to form the crystalline silicon film. Then, this crystalline silicon film is subjected to a patterning process using a photolithography method, to obtain the semiconductor layers 102 to 105.

Further, after the formation of the semiconductor layers 102 to 105, a minute amount of impurity element (boron or phosphorus) may be doped to control a threshold value of the TFT.

Besides, in the case where the crystalline semiconductor film is manufactured by the laser crystallization method, a pulse-oscillation type or continuous-wave type excimer laser, YAG laser, or YVO$_4$ laser may be used. In the case where those kinds of laser are used, it is appropriate to use a method in which laser light radiated from a laser oscillator is condensed by an optical system into a linear beam, and is irradiated to the semiconductor film. Although the conditions of the crystallization should be properly selected by an operator, in the case where the excimer laser is used, a pulse oscillation frequency is set as 30 Hz, and a laser energy density is set as 100 to 400 mJ/cm$^2$ (typically 200 to 300 mJ/cm$^2$). In the case where the YAG laser is used, it is appropriate that the second harmonic is used to with a pulse oscillation frequency of 1 to 10 kHz and a laser energy density of 300 to 600 mJ/cm$^2$ (typically, 350 to 500 mJ/cm$^2$). Then, laser light condensed into a linear shape with a width of 100 to 1000 μm, for example, 400 μm is irradiated to the whole surface of the substrate, and an overlapping ratio (overlap ratio) of the linear laser light at this time may be set as 80 to 98%.

A gate insulating film 106 is then formed for covering the semiconductor layers 102 to 105. The gate insulating film 106 is formed of an insulating film containing silicon by a plasma CVD method or a sputtering method into a film thickness of from 40 to 150 nm. In this embodiment, the gate insulating film 106 is formed of a silicon nitride oxide film into a thickness of 110 nm by a plasma CVD method (composition ratio Si=32%, O=59%, N=7%, and H=2%). Of course, the gate insulating film is not limited to the silicon nitride oxide film, and an other insulating film containing silicon may be used as a single layer or a lamination structure.

Besides, when the silicon oxide film is used, it can be possible to be formed by a plasma CVD method in which TEOS (tetraethyl orthosilicate) and O$_2$ are mixed and discharged at a high frequency (13.56 MHZ) power density of 0.5 to 0.8 W/cm$^2$ with a reaction pressure of 40 Pa and a substrate temperature of 300 to 400° C. Good characteristics as the gate insulating film can be obtained in the manufactured silicon oxide film thus by subsequent thermal annealing at 400 to 500° C.

Then, as shown in FIG. 7A, on the gate insulating film 106, a first conductive film 107 with a thickness of 20 to 100 nm and a second conductive film 108 with a thickness of 100 to 400 nm are formed and laminated. In this embodiment, the first conductive film 107 of TaN film with a film thickness of 30 nm and the second conductive film 108 of a W film with a film thickness of 370 nm are formed into lamination. The TaN film is formed by sputtering with a Ta target under a nitrogen containing atmosphere. Besides, the W film is formed by the sputtering method with a W target. The W film may be formed by a thermal CVD method using tungsten hexafluoride (WF$_6$). Whichever method is used, it is necessary to make the material have low resistance for use as the gate electrode, and it is preferred that the resistivity of the W film is set to less than or equal to 20 μΩcm. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film by a sputtering method using a target with a purity of 99.9999% or 99.99%, and in addition, by taking sufficient consideration to prevent impurities within the gas phase from mixing therein during the film formation, a resistivity of from 9 to 20 μΩcm can be realized.

Note that, in this embodiment, the first conductive film 107 is made of TaN, and the second conductive film 108 is made of W, but the material is not particularly limited thereto, and either film may be formed of an element selected from the group consisting of Ta, W, Ti, Mo, Al, Cu, Cr, and Nd, or an alloy material or a compound material containing the above element as its main constituent. Besides, a semiconductor film, typified by a polycrystalline silicon film doped with an impurity element such as phosphorus, may be used. Further, an AgPdCu alloy may be used. Besides, any combination may be employed such as a combination in which the first conductive film is formed of tantalum (Ta) and the second conductive film is formed of W, a combination in which the first conductive film is formed of titanium nitride (TiN) and the second conductive film is formed of W, a combination in which the first conductive film is formed of tantalum nitride (TaN) and the second conductive film is formed of Al, or a combination in which the first conductive film is formed of tantalum nitride (TaN) and the second conductive film is formed of Cu.

Next, masks 109 to 112 made of resist are formed using a photolithography method, and a first etching process is performed in order to form electrodes and wirings. This first etching process is performed with the first and second etching conditions. In This embodiment, as the first etching conditions, an ICP (inductively coupled plasma) etching method is used, a gas mixture of CF$_4$, Cl$_2$ and O$_2$ is used as an etching gas, the gas flow rate is set to 25/25/10 sccm, and plasma is generated by applying a 500 W RF (13.56 MHZ) power to a coil shape electrode under 1 Pa. A dry etching device with ICP (Model E645-☐ICP) produced by Matsushita Electric Industrial Co. Ltd. is used here. A 150 W RF (13.56 MHZ) power is also applied to the substrate side (test piece stage) to effectively apply a negative self-bias voltage. The W film is etched with the first etching conditions, and the end portion of the second conductive layer is formed into a tapered shape. In the first etching conditions, the etching rate for W is 200.39 nm/min, the etching rate for TaN is 80.32 nm/min, and the selectivity of W to TaN is about 2.5. Further, the taper angle of W is about 26° with the first etching conditions. Note that, the etching with the first etching conditions is corresponding to the first etching process (FIG. 1B) described in the embodiment mode.

Thereafter, the first etching conditions are changed into the second etching conditions without removing the masks 109 to 112 made of resist, a mixed gas of CF$_4$ and Cl$_2$ is used as an etching gas, the gas flow rate is set to 30/30 sccm, and plasma is generated by applying a 500 W RF (13.56 MHZ) power to a coil shape electrode under 1 Pa to thereby perform etching for about 30 seconds. A 20 W RF (13.56 MHZ) power is also applied to the substrate side (test piece stage) to effectively a negative self-bias voltage. The W film and the TaN film are both etched on the same order with the second etching conditions in which CF$_4$ and Cl$_2$ are mixed. In the second etching conditions, the etching rate for W is 58.97 nm/min, and the etching rate for TaN is 66.43 nm/min. Note that, the etching time may be increased by approximately 10 to 20% in order to perform etching without any residue on the gate insulating film. In addition, etching with the second etching conditions is corresponding to the second etching process (FIG. 1C) described in the embodiment mode.

In the first etching process, the end portions of the first and second conductive layers are formed to have a tapered shape due to the effect of the bias voltage applied to the substrate side by adopting masks of resist with a suitable shape. The angle of the tapered portions may be set to 15° to 45°. Thus, first shape conductive layers 113 to 116 (first conductive layers 113a to 116a and second conductive layers 113b to 116b) constituted of the first conductive layers and the second conductive layers are formed by the first etching process. The width of the first conductive layers in a channel length direction corresponds to W1 shown in the embodiment mode. Reference numeral 117 denotes a gate insulating film, and regions of the gate insulating film which are not covered by the first shape conductive layers 113 to 116 are made thinner by approximately 20 to 50 nm by etching.

Then, a first doping process is performed to add an impurity element for imparting an n-type conductivity to the semiconductor layer without removing the mask made of resist (FIG. 7B). Doping may be carried out by an ion doping method or an ion injecting method. The condition of the ion doping method is that a dosage is $1\times10^{13}$ to $5\times10^{15}$ atoms/cm$^2$, and an acceleration voltage is 60 to 100 keV. In this embodiment, the dosage is $1.5\times10^{15}$ atoms/cm$^2$ and the acceleration voltage is 80 keV. As the impurity element for imparting the n-type conductivity, an element which belongs to group 15 of the periodic table, typically phosphorus (P) or arsenic (As) is used, and phosphorus is used here. In this case, the conductive layers 113 to 116 become masks to the impurity element for imparting the n-type conductivity, and high concentration impurity regions 118 to 121 are formed in a self-aligning manner. The impurity element for imparting the n-type conductivity is added to the high concentration impurity regions 118 to 121 in the concentration range of $1.\text{times}.10.\text{sup}.20$ to $1.\text{times}.10.\text{sup}.21$ atoms/cm.sup.3. Note that, the first doping process is corresponding to the first doping process (FIG. 1D) described in the embodiment mode.

Thereafter, the second etching process is performed without removing the masks made of resist. Note that, one of chlorine gas such as Cl.sub.2, BCl.sub.3, SiCl.sub.4 or CCl.sub.4, fluorine gas such as CF.sub.4, SF.sub.6 or NF.sub.3, and O.sub.2, and a mixed gas including the above gas as its main constituent may be used as etching gas used in the first etching process and the second etching process. Here, a mixed gas of CF.sub.4, Cl.sub.2 and O.sub.2 is used as an etching gas, the gas flow rate is set to 25/25/10 sccm, and plasma is generated by applying a 500 W RF (13.56 MHZ) power to a coil shape electrode under 1 Pa to thereby perform etching. A 20 W RF (13.56 MHZ) power is also applied to the substrate side (test piece stage) to effectively apply a negative self-bias voltage. In the second etching process, the etching rate for W is 124.62 nm/min, the etching rate for TaN is 20.67 nm/min, and the selectivity of W to TaN is 6.05. Accordingly, the W film is selectively etched. The taper angle of W is 70.degree. in the second etching. Second conductive layers 122b to 125b are formed by the second etching process. On the other hand, the first conductive layers 113a to 116a are hardly etched, and first conductive layers 122a to 125a are formed. Note that, the second etching process here is corresponding to the third etching process (FIG. 2A) described in the embodiment mode. Further, the width of the second conductive layers in the channel length direction is corresponding to W2 shown in the embodiment mode.

Next, a second doping process is performed and the state of FIG. 7C is obtained. Second conductive layers 122b to 125b are used as masks to an impurity element, and doping is performed such that the impurity element is added to the semiconductor layer below the tapered portions of the first conductive layers. In this embodiment, phosphorus (P) is used as the impurity element, and plasma doping is performed with the dosage of $3.5.\text{times}.10.\text{sup}.12$ atoms/cm.sup.2 and the acceleration voltage of 90 keV. Thus, low concentration impurity regions 126 to 129, which overlap with the first conductive layers, are formed in a self-aligning manner. The concentration of phosphorus (P) in the low concentration impurity regions 126 to 129 is $1.\text{times}.10.\text{sup}.17$ to $1.\text{times}.10.\text{sup}.18$ atoms/cm.sup.3, and has a gentle concentration gradient in accordance with the film thickness of the tapered portions of the first conductive layers. Note that, in the semiconductor layer that overlaps with the tapered portions of the first conductive layers, the concentration of the impurity element slightly falls from the end portions of the tapered portions of the first conductive layers toward the inner portions. The concentration, however, keeps almost the same level. Further, the impurity element is added to the high concentration impurity regions 118 to 121 to form high concentration impurity regions 130 to 133. Note that, the second doping process here is corresponding to the second doping process (FIG. 2B) described in the embodiment mode.

Thereafter, a third etching process is performed without removing the masks made of resist. The tapered portions of the first conductive layers are partially etched to thereby reduce the regions that overlap with the semiconductor layer in the third etching process. Here, CHF.sub.3 is used as an etching gas, and a reactive ion etching method (RIE method) is used. In This embodiment, the third etching process is performed with the chamber pressure of 6.7 Pa, the RF power of 800 W, the CHF.sub.3 gas flow rate of 35 sccm. Thus, first conductive layers 138 to 141 are formed (FIG. 8A). Note that, the third etching process here is corresponding to the fourth etching process (FIG. 2C) described in the embodiment mode. Further, the width of the first conductive layers in the channel length direction corresponds to W3 shown in the embodiment mode.

In the third etching process, the insulating film 117 is etched at the same time, a part of the high concentration impurity regions 130 to 133 is exposed, and insulating films 143a to 143c and 144 are formed. Note that, in this embodiment, the etching condition by which the part of the high concentration impurity regions 130 to 133 is exposed is used, but it is possible that a thin layer of the insulating film is left on the high concentration impurity regions if the thickness of the insulating film or the etching condition is changed.

In accordance with the third etching process, impurity regions (LDD regions) 134a to 137a are formed, which do not overlap with the first conductive layers 138 to 141. Note that, impurity regions (GOLD regions) 134b to 137b remain overlapped with the first conductive layers 138 to 141.

The electrode formed of the first conductive layer 138 and the second conductive layer 122b becomes a gate electrode of an n-channel TFT of a driver circuit to be formed in the later process. The electrode formed of the first conductive layer 139 and the second conductive layer 123b becomes a gate electrode of a p-channel TFT of the driver circuit to be formed in the later process. Similarly, the electrode formed of the first conductive layer 140 and the second conductive layer 124b becomes a gate electrode of an n-channel TFT of a pixel portion to be formed in the later process, and the electrode formed of the first conductive layer 141 and the second conductive layer 125b becomes one of electrodes of a storage capacitor of the pixel portion to be formed in the later process.

In accordance with the above processes, in this embodiment, the difference between the impurity concentration in the impurity regions (GOLD regions) 134b to 137b that overlap with the first conductive layers 138 to 141 and the impurity concentration in the impurity regions (LDD regions) 134a to 137a that do not overlap with the first conductive layers 138 to 141 can be made small, thereby improving the TFT characteristics.

Next, the masks of resist are removed, masks 145 and 146 are newly formed of resist, and a third doping process is performed. In accordance with the third doping process, impurity regions 147 to 152 are formed, in which the impurity element imparting a conductivity (p-type) opposite to the above conductivity (n-type) is added to the semiconductor layer that becomes an active layer of the p-channel TFT (FIG. 8B). The first conductive layers 139 and 141 are used as masks to the impurity element, and the impurity element that imparts the p-type conductivity is added to thereby form impurity regions in a self-aligning manner. In this embodiment, the impurity regions 147 to 152 are formed by an ion doping method using diborane ($B_2H_6$). Note that, in the third doping process, the semiconductor layer to become the n-channel TFT is covered with the masks 145 and 146 formed of resist. Although phosphorus is added to the impurity regions of the semiconductor layer to become the p-channel TFT at different concentrations in accordance with the first and second doping processes, the doping process is performed such that the concentration of the impurity element imparting p-type conductivity is in the range of $2 \times 10^{20}$ to $2 \times 10^{21}$ atoms/cm$^3$ in any of the impurity regions. Thus, the impurity regions function as a source region and a drain region of the p-channel TFT with no problem. In this embodiment, a part of the semiconductor that becomes an active layer of the p-channel TFT is exposed, and thus, there is an advantage that an impurity element (boron) is easily added.

The doping process here may be carried out once or a plurality of times. For example, in the case of performing the doping twice, the first doping condition has an acceleration voltage of 5 to 40 keV to form impurity regions 147 and 150, and the second doping condition has an acceleration voltage of 60 to 120 keV to form impurity regions 148, 149, 151, and 152. Then, injection defect in the semiconductor layer can be suppressed, and further, it is possible that the concentrations of boron in the impurity regions 147 and 150 are made to be different from that in the impurity regions 148, 149, 151, and 152 to improve freedom for designing.

In accordance with the above-described processes, the impurity regions are formed in the respective semiconductor layers.

Subsequently, the masks 145 and 146 of resist are removed, and a first interlayer insulating film 153 is formed. This first interlayer insulating film 153 is formed of an insulating film containing silicon by a plasma CVD method or a sputtering method into a thickness of 100 to 200 nm. In this embodiment, a silicon nitride oxide film with a film thickness of 150 nm is formed by a plasma CVD method. Of course, the first interlayer insulating film 153 is not particularly limited to the silicon nitride oxide film, but an other insulating film containing silicon may be formed into a single layer or a lamination structure.

Then, as shown in FIG. 8C, a step of activating the impurity elements added in the respective semiconductor layers is performed. This step is carried out by thermal annealing using a furnace annealing oven. The thermal annealing may be performed in a nitrogen atmosphere containing an oxygen content of 1 ppm or less, preferably 0.1 ppm or less, at 400 to 700° C., typically 500 to 600° C. In this embodiment, a heat treatment at 550° C. for 4 hours is carried out. Note that, except the thermal annealing method, a laser annealing method, or a rapid thermal annealing method (RTA method) can be applied thereto.

Note that, in this embodiment, at the same time as the above activation process, nickel used as the catalyst in crystallization is gettered to the impurity regions (130, 132, 147, 150) containing phosphorous at a high concentration.

As a result, nickel concentration of the semiconductor layer which becomes a channel forming region is mainly lowered. The TFT with a channel forming region thus formed has an off current value decreased, and has high electric field mobility because of good crystallinity, thereby attaining satisfactory characteristics.

Further, an activation process may be performed before forming the first interlayer insulating film 153. However, in the case where a wiring material used is weak to heat, it is preferable that the activation process is performed after an interlayer insulating film (an insulating film containing silicon as its main ingredient, for example, silicon nitride oxide film) is formed to protect the wiring or the like as in this embodiment.

In addition, heat treatment at 300 to 550° C. for 1 to 12 hours is performed in an atmosphere containing hydrogen of 3 to 100%, to perform a step of hydrogenating the semiconductor layers. In this embodiment, the heat treatment is performed at 410° C. for 1 hour in an atmosphere containing hydrogen of about 3%. This step is a step of terminating dangling bonds in the semiconductor layer with hydrogen in the insulating film. As another means for hydrogenation, plasma hydrogenation (using hydrogen excited by plasma) may be carried out.

Besides, in the case of using a laser annealing method as the activation process, it is preferred to irradiate laser light such as an excimer laser or a YAG laser after the hydrogenating process.

Next, a second interlayer insulating film 154 of an organic insulating material is formed on the first interlayer insulating film 153. In this embodiment, an acrylic resin film with a film thickness of 1.6 μm is formed. Then, patterning is performed for forming a contact holes reaching the respective impurity regions 130, 132, 147 and 150.

Then, in a driver circuit 205, wirings 155 to 158 electrically connected to the impurity region 130 or the impurity region 147, respectively, are formed. Note that, these electrodes are formed by patterning a lamination film of a Ti film with a film thickness of 50 nm and an alloy film (alloy film of Al and Ti) with a film thickness of 500 nm.

Further, in a pixel portion 206, a connection electrode 160 and a source electrode 159 are formed, which contact with the impurity region 132, and a connection electrode 161 is formed, which contacts with the impurity region 150.

Figure 9:
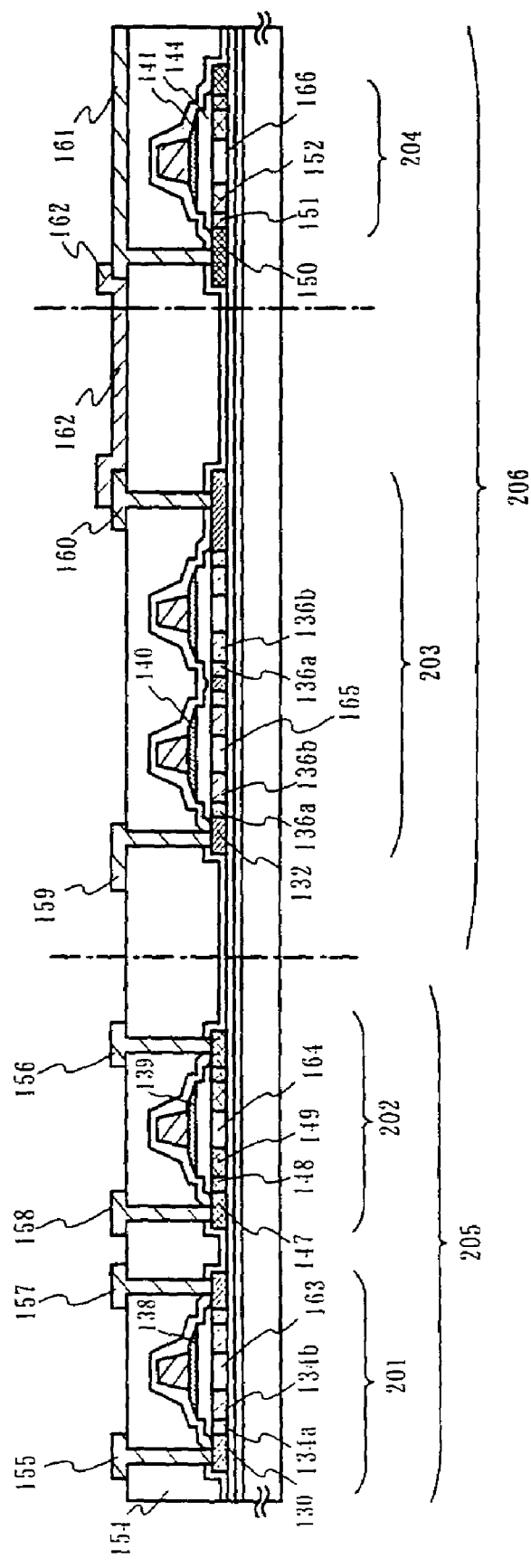
FIG. 9 shows the manufacturing process of the AM-LCD.

Next, a transparent conductive film is formed thereon with a thickness of 80 to 120 nm, and a pixel electrode 162 is formed by patterning (FIG. 9). An alloy of indium oxide and zinc oxide ($In_2O_3$-ZnO) and zinc oxide (ZnO) are also suitable materials for the transparent conductive film. Further, zinc oxide having gallium (Ga) added (ZnO:Ga) or the like may be preferably used in order to improve transmittivity or conductivity of visual radiation.

Further, the pixel electrode 162 is formed so as to contact and overlap with the connection electrode 160, and thus, an electrical connection with a drain region of a pixel TFT is formed. Moreover, an electrical connection of the pixel electrode 162 to the semiconductor layer (impurity region 150), that functions as one of the electrodes forming a storage capacitor, is formed.

Note that, although an example of using a transparent conductive film as a pixel electrode is shown here, a reflection type display device can be manufactured if a pixel electrode is formed using a conductive material with reflectivity. In the case, the pixel electrode can be simultaneously formed in the process of manufacturing electrodes, and it is preferable that a material with excellent reflectivity, such as a film including Al or Ag as its main constituent or a lamination film thereof, is used as a material for the pixel electrode.

In the manner as described above, the driver circuit 205 including an n-channel TFT 201 and a p-channel TFT 202, and the pixel portion 206 including a pixel TFT 203 and a storage capacitor 204 can be formed on the same substrate. In this specification, such a substrate is called an active matrix substrate for convenience.

The n-channel TFT 201 of the driving circuit 205 includes a channel forming region 163, the low concentration impurity region 134b (GOLD region) overlapping with the first conductive layer 138 forming a part of the gate electrode, the low concentration impurity region 134a (LDD region) formed outside the gate electrode, and the high concentration impurity region 130 functioning as a source region or a drain region. The p-channel TFT 202 includes a channel forming region 164, an impurity region 149 overlapping with the first conductive layer 139 forming a part of the gate electrode, an impurity region 148 formed outside the gate electrode, and the impurity region 147 functioning as a source region or a drain region.

The pixel TFT 203 of the pixel portion 206 includes a channel forming region 165, the low concentration impurity region 136b (GOLD region) overlapping with the first conductive layer 140 forming the gate electrode, a low concentration impurity region 136a (LDD region) formed outside the gate electrode, and the high concentration impurity region 132 functioning as a source region or a drain region. Besides, the impurity element imparting p-type conductivity is added to the respective semiconductor layers 150 to 152 functioning as one of electrodes of the storage capacitor 204. The storage capacitor 204 is formed from the electrodes 125 and 142 and the semiconductor layers 150 to 152 and 166 with the insulating film 144 as a dielectric material.

[Embodiment 2]

In this embodiment, a process for manufacturing an active matrix liquid crystal display device using the active matrix substrate manufactured in Embodiment 1 will be described. The description is made with reference to FIG. 10.

First, after the active matrix substrate with the state of FIG. 9 is obtained according to Embodiment 1, an orientation film 167 is formed on the active matrix substrate of FIG. 9 to perform a rubbing process. Note that, in this embodiment, before the formation of the orientation film 167, an organic resin film such as an acrylic resin film is patterned to form a columnar spacer for keeping a gap between substrates in a desired position. Also, instead of the columnar spacer, a spherical spacer may be distributed over the entire surface.

Next, a opposing substrate 168 is prepared. A color filter in which a colored layer 174 and a light shielding layer 175 are arranged corresponding to each pixel is provided in this opposing substrate 168. Also, a light shielding layer 177 is provided in a portion of a driver circuit. A leveling film 176 for covering this color filter and the light shielding layer 177 is provided. Next, a counter electrode 169 made of a transparent conductive film is formed in a pixel portion on the leveling film 176, and then an orientation film 170 is formed on the entire surface of the opposing substrate 168 to perform a rubbing process.

Figure 10:
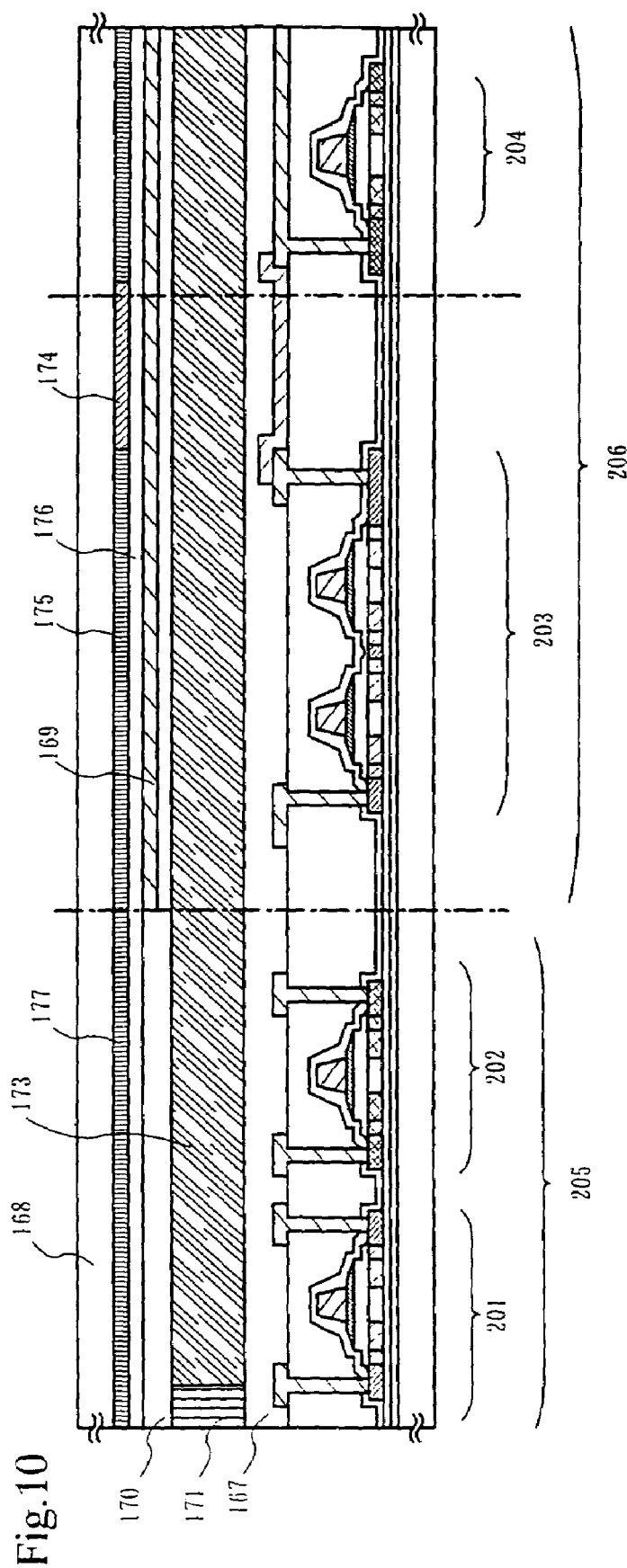
FIG. 10 is a cross sectional structural view of a transmission type liquid crystal display device.

Then, the active matrix substrate in which the pixel portion and the driver circuit are formed and the opposing substrate are adhered to each other by using a sealing member 171. A filler is mixed with the sealing member 171, and two substrate are adhered to each other with a uniform interval by this filler and the columnar spacer. After that, a liquid crystal material 173 is injected into a space between both substrates and then completely encapsulated by a sealing member (not shown). A known liquid crystal material may be used as the liquid crystal material 173. Thus, the active matrix liquid crystal display device as shown in FIG. 10 is completed. If necessary, the active matrix substrate or the opposing substrate is cut with a predetermined shape. Also, a polarization plate and the like are suitably provided using a known technique. And, an FPC is adhered to the active matrix liquid crystal display device using a known technique.

A structure of a liquid crystal display panel thus obtained will be described using a top view of FIG. 11. Note that the same reference symbols are used for portions corresponding to those of FIG. 10.

Figure 11A:
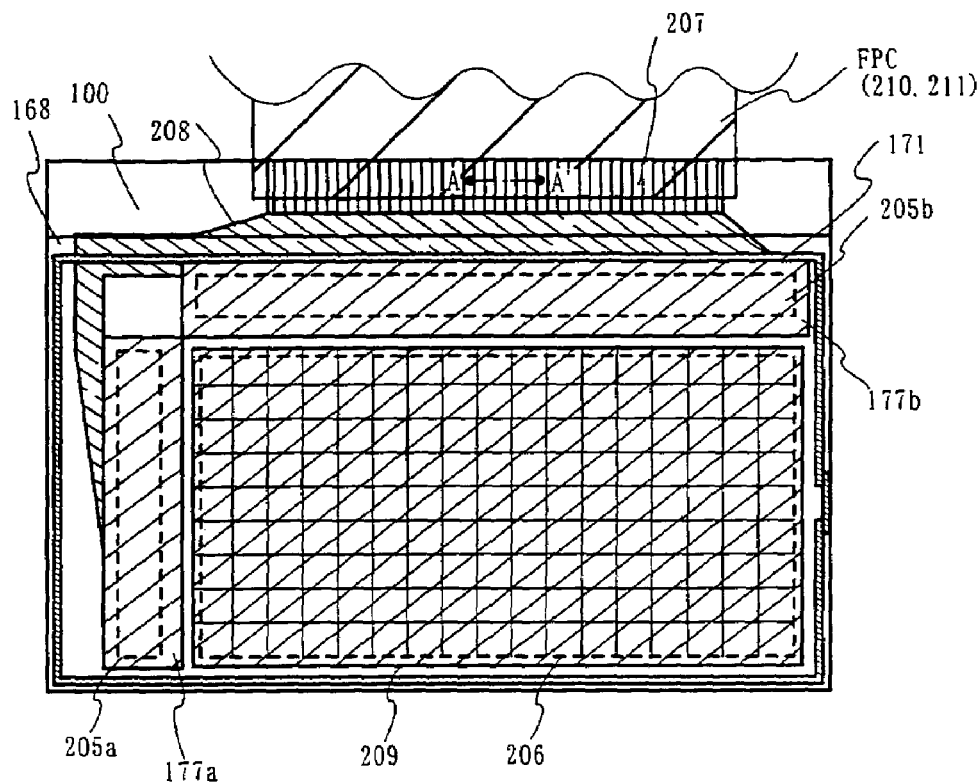
FIGS. 11A and 11B are external views of a liquid crystal panel.

The top view of FIG. 11A shows the state that the active matrix substrate and the opposing substrate 168 are adhered to each other through the sealing member 171. In the active matrix substrate, an external input terminal 207 to which the pixel portion, the driver circuit, and the FPC (flexible printed circuit) are adhered, a wiring 208 for connecting the external input terminal 207 with an input portion of the respective circuits, and the like are formed. Also, the color filter and the like are formed in the opposing substrate 168.

A light shielding layer 177a is provided in the opposing substrate side so as to overlap with a gate wiring side driver circuit 205a. Also, a light shielding layer 177b is provided in the opposing substrate side so as to overlap with a source wiring side driver circuit 205b. In a color filter 209 which is provided in the opposing substrate side on a pixel portion 206, a light shielding layer and colored layers for respective colors (red color (R), green color (G), blue color B) and are provided corresponding to each pixel. Actually, a color display is formed using three colors, that is, the colored layer for the red color (R), the colored layer for the green color (G), and the colored layer for the blue color B. Note that the colored layers for respective colors are arbitrarily arranged.

Here, for a color display, the color filter 209 is provided in the opposing substrate. However, the present invention is not particularly limited to this case, and in manufacturing the active matrix substrate, the color filter may be formed in the active matrix substrate.

Also, in the color filter, the light shielding layer is provided between adjacent pixels such that a portion except for a display region is shielded. The light shielding layers 177a and 177b are provided in a region covering the driver circuit. However, when the liquid crystal display device is incorporated into an electronic device as a display portion thereof, the region covering the driver circuit is covered with a cover. Thus, the color filter may be constructed without the light shielding layer. In manufacturing the active matrix substrate, the light shielding layer may be formed in the active matrix substrate.

Also, without providing the light shielding layer, the colored layers composing the color filter may be suitably arranged between the opposing substrate and the counter electrode such that light shielding is made by a lamination layer laminated with a plurality of layers. Thus, the portion except for the display region (gaps between pixel electrodes) and the driver circuit may be light-shielded.

Also, the FPC which is composed of a base film 210 and a wiring 211 is adhered to the external input terminal by using an anisotropic conductive resin. Further, a reinforced plate is provided to increase a mechanical strength.

Figure 11B:
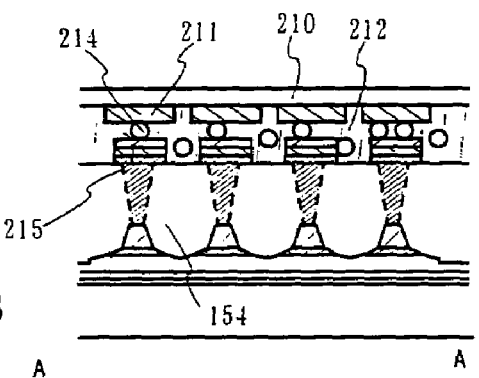

FIG. 11B is a cross sectional view along a line A-A' on the external input terminal 207 in FIG. 11A. An outside diameter of a conductive particle 214 is smaller than a pitch of a wiring 215. Thus, when the conductive particle is dispersed in an adhesive 212 with a suitable amount, an electrical connection with a corresponding wiring in the FPC side can be formed, without occurrence of a short circuit to adjacent wiring.

The liquid crystal display panel manufactured above can be used as the display portion of various electronic equipment.

[Embodiment 3]

In this embodiment, a manufacturing method of an active matrix substrate different from that of Embodiment 1 will be described with reference to FIGS. 12A to 15, and FIGS. 17A and 17B. Although the transmission type display device is formed in Embodiment 1, in this embodiment, it is characterized in that a reflection type display device is formed to reduce the number of masks compared with Embodiment 1.

First, in this embodiment, a substrate 400 is used, which is made from glass, such as barium borosilicate glass or aluminum borosilicate glass, represented by Corning #7059 glass and #1737 glass. Note that, as the substrate 400, a quartz substrate, or a silicon substrate, a metal substrate, or a stainless substrate, on which an insulating film is formed, may be used as the replace. A plastic substrate having heat resistance to a process temperature of this embodiment may also be used.

Then, a base film 401 formed of an insulating film such as a silicon oxide film, a silicon nitride film or a silicon nitride oxide film is formed on the substrate 400. In this embodiment, a two-layer structure is used for the base film 401. However, a single-layer film or a lamination structure consisting of two or more layers of the insulating film may be used. As a first layer of the base film 401, a silicon nitride oxide film 401a is formed into a thickness of 10 to 200 nm (preferably 50 to 100 nm) using $SiH_4$, $NH_3$, and $N_2O$ as reaction gases by a plasma CVD method. In this embodiment, the silicon nitride oxide film 401a (composition ratio Si=32%, O=27%, N=24% and H=17%) having a film thickness of 50 nm is formed. Then, as a second layer of the base film 401, a silicon nitride oxide film 401b is formed so as to be laminated on the first layer with a thickness of 50 to 200 nm (preferably 100 to 150 nm) using $SiH_4$ and $N_2O$ as reaction gases by plasma CVD. In this embodiment, the silicon nitride oxide film 401b (composition ratio Si=32%, O=59%, N=7% and H=2%) having a film thickness of 100 nm is formed.

Subsequently, semiconductor layers 402 to 406 are formed on the base film 401. The semiconductor layers 402 to 406 are formed such that a semiconductor film having an amorphous structure formed by a known method (a sputtering method, an LPCVD method, or a plasma CVD method) is subjected to a known crystallization process (a laser crystallization method, a thermal crystallization method, or a thermal crystallization method using a catalyst such as nickel) and the crystalline semiconductor film thus obtained is patterned into desired shapes. The semiconductor layers 402 to 406 are formed into a thickness of from 25 to 80 nm (preferably 30 to 60 nm). The material of the crystalline semiconductor film is not particularly limited, but it is preferable to form the film using silicon, a silicon germanium (SiGe) alloy, or the like. In this embodiment, a 55 nm thick amorphous silicon film is formed by a plasma CVD method, and then, nickel-containing solution is held on the amorphous silicon film. A dehydrogenation process of the amorphous silicon film is performed (500° C. for one hour), and thereafter a thermal crystallization process is performed (550° C. for four hours) thereto. Further, to improve the crystallinity, laser annealing process is performed to form the crystalline silicon film. Then, this crystalline silicon film is subjected to a patterning process using a photolithography method, to obtain the semiconductor layers 402 to 406.

Further, after the formation of the semiconductor layers 402 to 406, a minute amount of impurity element (boron or phosphorus) may be doped to control a threshold value of the TFT.

Besides, in the case where the crystalline semiconductor film is manufactured by the laser crystallization method, a pulse oscillation type or continuous emission type excimer laser, YAG laser, or $YVO_4$ laser may be used. In the case where those lasers are used, it is appropriate to use a method in which laser light radiated from a laser oscillator is condensed into a linear beam by an optical system, and is irradiated to the amorphous semiconductor film. Although the conditions of the crystallization should be properly selected by an operator, in the case where the excimer laser is used, a pulse oscillation frequency is set to 30 Hz, and a laser energy density is set from 100 to 400 mJ/cm$^2$ (typically 200 to 300 mJ/cm$^2$). In the case where the YAG laser is used, it is appropriate that the second harmonic is used to set a pulse oscillation frequency from 1 to 10 kHz, and a laser energy density is set from 300 to 600 mJ/cm$^2$ (typically, 350 to 500 mJ/cm$^2$). Then, laser light condensed into a linear shape with a width of 100 to 1000 µm, for example, 400 µm is irradiated to the whole surface of the substrate, and an overlapping ratio (overlap ratio) of the linear laser light at this time may be set as 80 to 98%.

A gate insulating film 407 is then formed covering the semiconductor layers 402 to 406. The gate insulating film 407 is formed of an insulating film containing silicon by a plasma CVD or a sputtering method with a film thickness of from 40 to 150 nm. In this embodiment, the gate insulating film 407 is formed from a silicon nitride oxide film with a thickness of 110 nm by plasma CVD (composition ratio Si=32%, O=59%, N=7%, and H=2%). Of course, the gate insulating film is not limited to the silicon nitride oxide film, and other insulating films containing silicon may be formed into a single layer or a lamination structure.

Besides, when the silicon oxide film is used, it can be formed by plasma CVD in which TEOS (tetraethyl orthosilicate) and $O_2$ are mixed, with a reaction pressure of 40 Pa, and at a substrate temperature of from 300 to 400° C., and discharged at a high frequency (13.56 MHZ) power density of 0.5 to 0.8 W/cm$^2$. The silicon oxide film thus manufactured can have good characteristics as the gate insulating film by subsequent thermal annealing at 400 to 500° C.

Then, as shown in FIG. 12A on the gate insulating film 407, a first conductive film 408 and a second conductive film 409 are formed into lamination to have a film thickness of 20 to 100 nm and 100 to 400 nm, respectively. In this embodiment, the first conductive film 408 made of a TaN film with a film thickness of 30 nm and the second conductive film 409 made of a W film with a film thickness of 370 nm are formed into lamination. The TaN film is formed by sputtering with a Ta target under a nitrogen containing atmosphere. Besides, the W film is formed by the sputtering method with a W target. The W film may be formed by a thermal CVD method using tungsten hexafluoride ($WF_6$). Whichever method is used, it is necessary to make the material have low resistance for use as the gate electrode, and it is preferred that the resistivity of the W film is set to 20 µΩm or less. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film by sputtering using a target having a high purity (purity of 99.9999%), and in addition, by taking sufficient consideration to prevent impurities within the gas phase from mixing therein during the film formation, a resistivity of from 9 to 20 μΩcm can be realized.

Note that, in this embodiment, the first conductive film 408 is made of TaN and the second conductive film 409 is made of W. However, the first conductive film 408 and the second conductive film 409 are not limited to those and then may be formed from one element selected from the group consisting of Ta, W, Ti, Mo, Al, Cu, Cr, and Nd, or using an alloy material or a compound material containing the above element as its main constituent. Also, a semiconductor film typified by a polycrystalline silicon film in which an impurity element such as phosphorus has doped may be used. An AgPdCu alloy may be used. Further, a combination of the first conductive film made of a tantalum (Ta) film and the second conductive film made of a W film, a combination of the first conductive film made of a titanium nitride (TiN) film and the second conductive film made of a W film, a combination of the first conductive film made of a tantalum nitride (TaN) film and the second conductive film made of an Al film, or a combination of the first conductive film made of the tantalum nitride (TaN) film and the second conductive film made of a Cu film may be used.

Figure 17A:
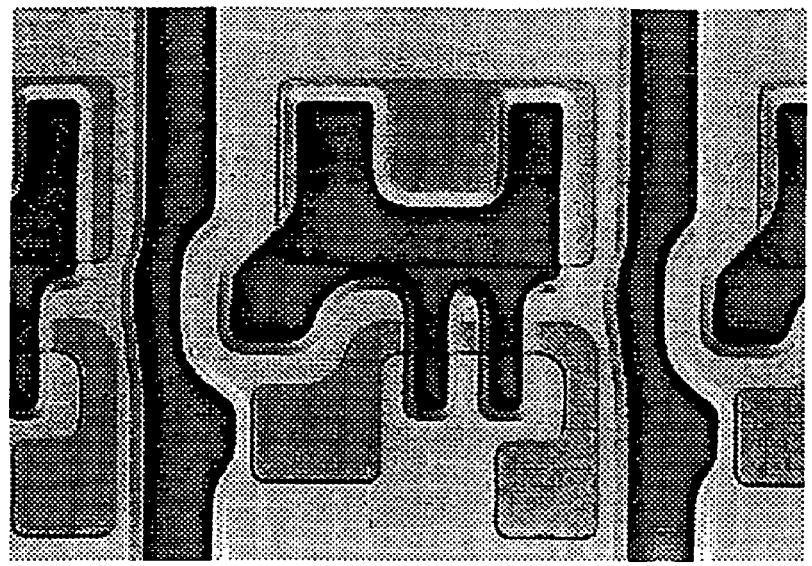
FIGS. 17A and 17B are top views of the pixel in the manufacturing process.

Next, masks 410 to 415 made from resists are formed by using a photolithography method, and then a first etching process for forming electrodes and wirings is performed at first and second etching conditions. In this embodiment, as the first etching condition, an ICP (inductively coupled plasma) etching method is used, $CF_4$, $Cl_2$, and $O_2$ are used as etching gases, and a gas flow rate is set to be 25/25/10 (sccm). And, RF power (13.56 MHZ) of 500 W is applied to a coil shape electrode at a pressure of 1 Pa to generate plasma. Thus, an etching is performed. Here, a dry etching device using ICP (Model E645-□ICP), produced by Matsushita Electric Industrial Co. Ltd. is used. Also, RF power (13.56 MHZ) of 150 W is applied to a substrate side (sample stage) to effectively apply a negative self-bias voltage. Under this first etching condition, the W film is etched such that the end portion of the second conductive layer becomes a taper shape. A top view of the pixel portion observed by using an optical microscope immediately after the etching with the first etching condition is shown in FIG. 17A.

After that, without removing the masks 410 to 415 made from resists, the first etching condition is changed into the second etching condition, $CF_4$ and $Cl_2$ are used as etching gases, and a gas flow rate is set to be 30/30 (sccm). And, RF power (13.56 MHZ) of 500 W is applied to a coil type electrode at a pressure of 1 Pa to generate plasma. Thus, an etching is performed for about 30 seconds. Also, RF power (13.56 MHZ) of 20 W is applied to the substrate side (sample stage) to effectively apply a negative self-bias voltage. Under the second etching condition that $CF_4$ and $Cl_2$ are mixed with each other, both the W film and the TaN film are etched with the same degree. Note that, in order to perform the etching without any residue on the gate insulating film, an etching time may be increased by about 10 to 20%.

Figure 17B:
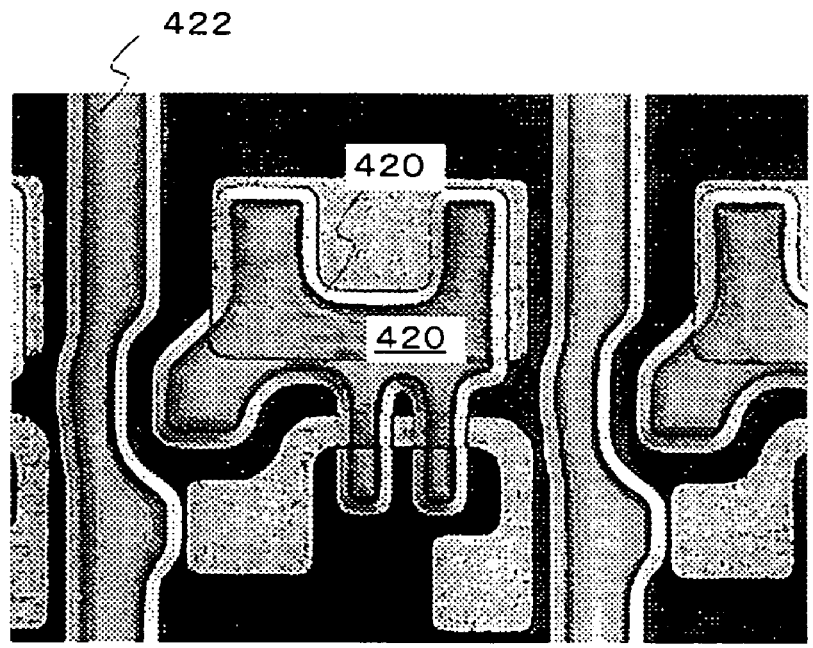

In the first etching process, when the mask made from the resist with a suitable shape is used, the end portions of the first conductive layer and the second conductive layer become a taper shape, due to an effect of the bias voltage applied to the substrate side. An angle of the taper portion is 15° to 45°. Thus, first shape conductive layers 417 to 422 (first conductive layers 417a to 422a and second conductive layers 417b to 422b) constituted of the first conductive layers and the second conductive layers are formed by the first etching process. Reference numeral 416 is a gate insulating film. A region which is not covered with the first shape conductive layers 417 to 422 is etched by about 20 to 50 nm to form a thinned region. Also, a top view of the pixel portion observed by using an optical microscope immediately after the etching with the second etching condition is shown in FIG. 17B.

Then, without removing the mask made from the resist, a first doping process is performed to add an impurity element for imparting an n-type conductivity to the semiconductor layer (FIG. 12B). The doping process may be performed with an ion doping method or an ion injecting method. As a condition in the ion dope method, a dosage is $1 \times 10^{13}$ to $5 \times 10^{15}$ atoms/cm$^2$ and an acceleration voltage is 60 to 100 keV. In this embodiment, the dose is set to $1.5 \times 10^{15}$ atoms/cm$^2$ and the accelerating voltage is set to 80 keV. As the impurity element for imparting the n-type conductivity, an element belonging to Group 15, typically phosphorus (P) or arsenic (As) is used. In this doping process, phosphorus (P) is used. In this case, the conductive layers 417 to 421 become masks against the impurity element for imparting the n-type conductivity, and thus high concentration impurity regions 423 to 427 are formed in a self-aligning manner. The impurity element for imparting the n-type conductivity is added to the high concentration impurity regions 423 to 427 in a concentration range of $1 \times 10^{20}$ to $1 \times 10^{21}$ atoms/cm$^3$.

Next, a second etching process is performed without removing the masks made from resists. Here, $CF_4$, $Cl_2$, and $O_2$ are used as etching gases to selectively etch the W film. At this time, first conductive layers 428b to 433b are formed by the second etching process. On the other hand, the second conductive layers 417a to 422a are hardly etched to form second conductive layers 428a to 433a. Next, a second doping process is performed to obtain the state of FIG. 12C. Doping is performed such that, when the second conductive layers 417a to 422a are used as masks against the impurity element, the impurity element is added to the semiconductor layers under the taper portions of the first conductive layers. Thus, impurity regions 434 to 438 overlapping with the first conductive layers are formed. The concentration of phosphorus (P) that is added to the impurity regions has a gentle concentration gradient in accordance with the film thickness of the taper portions of the first conductive layers. Note that, in the semiconductor layers overlapped with the first conductive layers, although an impurity concentration is slightly reduced from the end portions of the taper portions of the first conductive layers toward the inner portions, substantially the same degree of concentration is obtained. Also, the impurity element is added to the impurity regions 423 to 427 to form impurity regions 439 to 443.

Figure 13A:
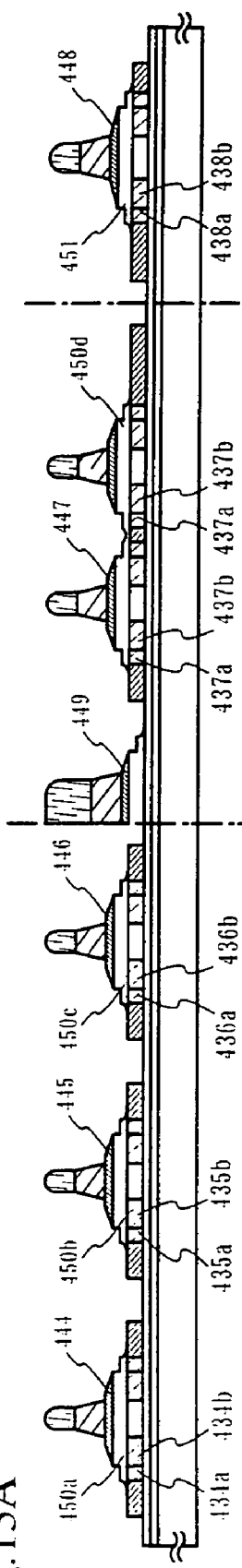
FIGS. 13A to 13C show the manufacturing process of the AM-LCD.

Next, a third etching process is performed without removing the mask made from the resist (FIG. 13A. In this third etching process, the taper portions of the first conductive layers are partially etched to reduce the regions overlapped with the semiconductor layers. The third etching process is performed using $CHF_3$ as an etching gas by a reactive ion etching method (RIE method). First conductive layers 444 to 449 are formed by the third etching. Simultaneously, the insulating film 416 is also etched to form insulating films 450a to 450d, and 451.

By the above third etching, impurity regions (LDD regions) 434a to 438a which are not overlapped with the first conductive layers 444 to 448 are formed. Note that impurity regions (GOLD regions) 434b to 438b remain overlapping with the first conductive layers 444 to 448.

By doing so, in This embodiment, the difference between the impurity concentration in the impurity regions (GOLD regions) 434b to 438b that overlap with the first conductive layers 444 to 448 and the impurity concentration in the impurity regions (LDD regions) 434a to 438a that do not overlap with the first conductive layers 444 to 448 can be made small, thereby improving the reliability.

Figure 13B:
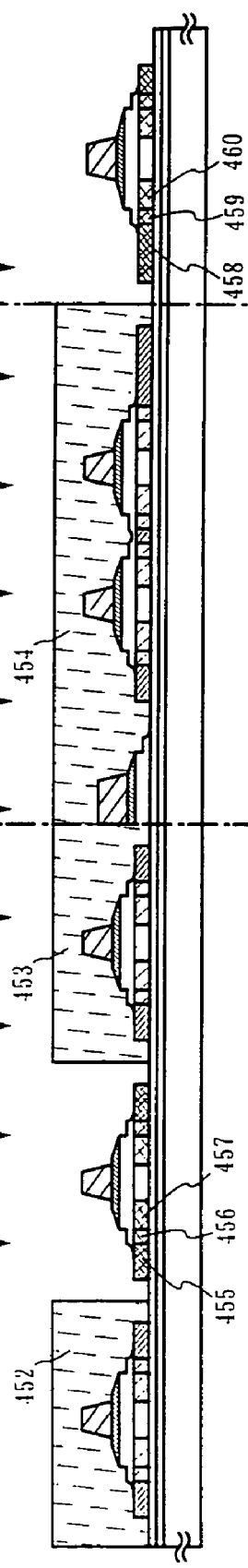

Next, the masks formed from resist are removed, masks 452 to 454 are newly formed from resist, and a third doping process is performed. In accordance with the third doping process, impurity regions 455 to 460 are formed, in which the impurity element (p-type) imparting a conductivity opposite to the one conductivity (n-type) is added to the semiconductor layer that becomes an active layer of the p-channel TFT. The first conductive layers 445 and 448 are used as masks against the impurity element, and the impurity element that imparts the p-type conductivity is added, to thereby form impurity regions in a self-aligning manner. In This embodiment, the impurity regions 455 to 460 are formed by an ion doping method using diborane ($B_2H_6$) (FIG. 13B). In the third doping process, the semiconductor layer forming the n-channel TFT is covered with the masks 452 to 454 formed from resist. Although phosphorus is added to the impurity regions 455 and 460 at different concentrations in accordance with the first and second doping processes, the doping process is performed such that the concentration of the impurity element imparting p-type conductivity is in the range of $2 \times 10^{20}$ to $2 \times 10^{21}$ atoms/cm$^3$ in any of the impurity regions. Thus, the impurity regions function as the source region and the drain region of the p-channel TFT so that no problem occurs. In This embodiment, a part of the semiconductor that becomes an active layer of the p-channel TFT is exposed, and thus, there is an advantage that an impurity element (boron) is easily added.

Through the above processes, the impurity regions are formed in the respective layers.

Subsequently, the masks 452 to 454 consisting of resist are removed, and a first interlayer insulating film 461 is formed. This first interlayer insulating film 461 is formed of an insulating film containing silicon by a plasma CVD method or a sputtering method with a thickness of 100 to 200 nm. In this embodiment, a silicon nitride oxide film with a film thickness of 150 nm is formed by plasma CVD. Of course, the first interlayer insulating film 461 is not particularly limited to the silicon nitride oxide film, and other insulating film containing silicon may be formed into a single layer or a lamination structure.

Figure 13C:
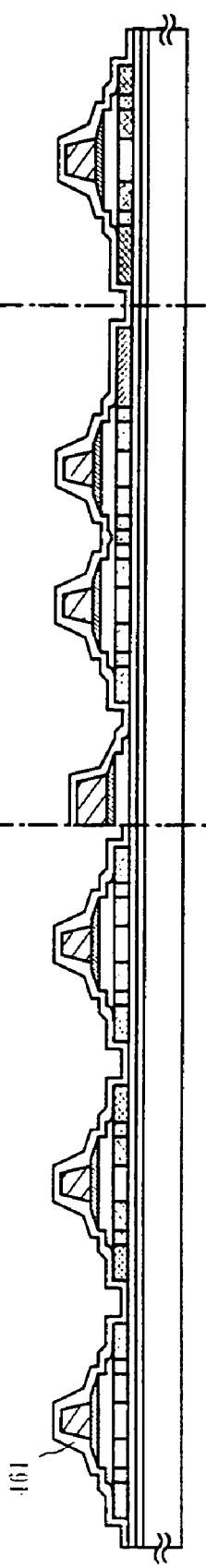

Then, as shown in FIG. 13C, a step of activating the impurity elements added in the respective semiconductor layers is conducted. This activation step is carried out by thermal annealing using an annealing furnace. The thermal annealing may be performed in a nitrogen atmosphere having an oxygen concentration of 1 ppm or less, preferably 0.1 ppm or less and at 400 to 700° C., typically 500 to 550° C. In this embodiment, a heat treatment at 500° C. for 4 hours is carried out. Note that, other than the thermal annealing method, a laser annealing method, or a rapid thermal annealing method (RTA method) can be applied thereto.

Note that, in this embodiment, at the same time with the above activation process, nickel used as the catalyst for crystallization is gettered to the impurity regions 439, 441, 442, 455, and 458 containing phosphorous at high concentration. As a result, nickel concentration of the semiconductor layer which becomes a channel forming region is mainly lowered. The TFT having a channel forming region thus formed is decreased in off current value, and has high electric field mobility because of good crystallinity, thereby attaining satisfactory characteristics.

Further, an activation process may be performed before forming the first interlayer insulating film 461. However, in the case where the used wiring material is weak to heat, it is preferable that the activation process is performed after an interlayer insulating film (containing silicon as its main constituent, for example, silicon nitride film) is formed to protect the wiring or the like as in this embodiment.

In addition, heat treatment at 300 to 550° C. for 1 to 12 hours is performed in an atmosphere containing hydrogen of 3 to 100% to perform a step of hydrogenating the semiconductor layers. In this embodiment, the heat treatment is performed at 410° C. for 1 hour in a nitrogen atmosphere containing hydrogen of about 3%. This step is a step of terminating dangling bonds in the semiconductor layer by hydrogen included in the interlayer insulating film. As another means for hydrogenation, plasma hydrogenation (using hydrogen excited by plasma) may be carried out.

Also, in the case where a laser annealing method is used for an activation process, it is desired that laser light of an excimer laser, a YAG laser or the like is irradiated after the hydrogenation.

Next, a second interlayer insulating film 462 made of an inorganic insulating material or an organic insulating material is formed on the first interlayer insulating film 461. In this embodiment, an acrylic resin film with a film thickness of 1.6 μm is formed. The film with the viscosity of 10 to 1000 cp, preferably, 40 to 200 cp is used. Also, the acrylic resin film has convex and concave portions on its surface.

In this embodiment, in order to prevent the mirror reflection, convex and concave portions are formed on the surfaces of the pixel electrodes by forming the second interlayer insulating film with convex and concave portions on the surface. Also, in order to attain light scattering characteristics by forming the convex and concave portions on the surfaces of the pixel electrodes, convex portions may be formed in regions below the pixel electrodes. In this case, since the same photomask is used in the formation of the TFTs, the convex portions can be formed without increasing the number of processes. Note that the convex portion may be suitably provided in the pixel portion region except for the wirings and the TFT portion on the substrate. Thus, the convex and concave portions are formed on the surfaces of the pixel electrodes along the convex and concave portions formed on the surface of the insulating film covering the convex portion.

Also, a film with the leveled surface may be used as the second interlayer insulating film 462. In this case, the following is preferred. That is, after the formation of the pixel electrodes, convex and concave portions are formed on the surface with a process using a known method such as a sandblast method or an etching method. Thus, since the mirror reflection is prevented and reflection light is scattered, whiteness is preferably increased.

Then, in a driver circuit 506, wirings 463 to 467 electrically connected with the respective impurity regions are formed. Note that those wirings are formed by patterning a lamination film of a Ti film with a film thickness of 50 nm and an alloy film (alloy film of Al and Ti) with a film thickness of 500 nm.

Figure 14:
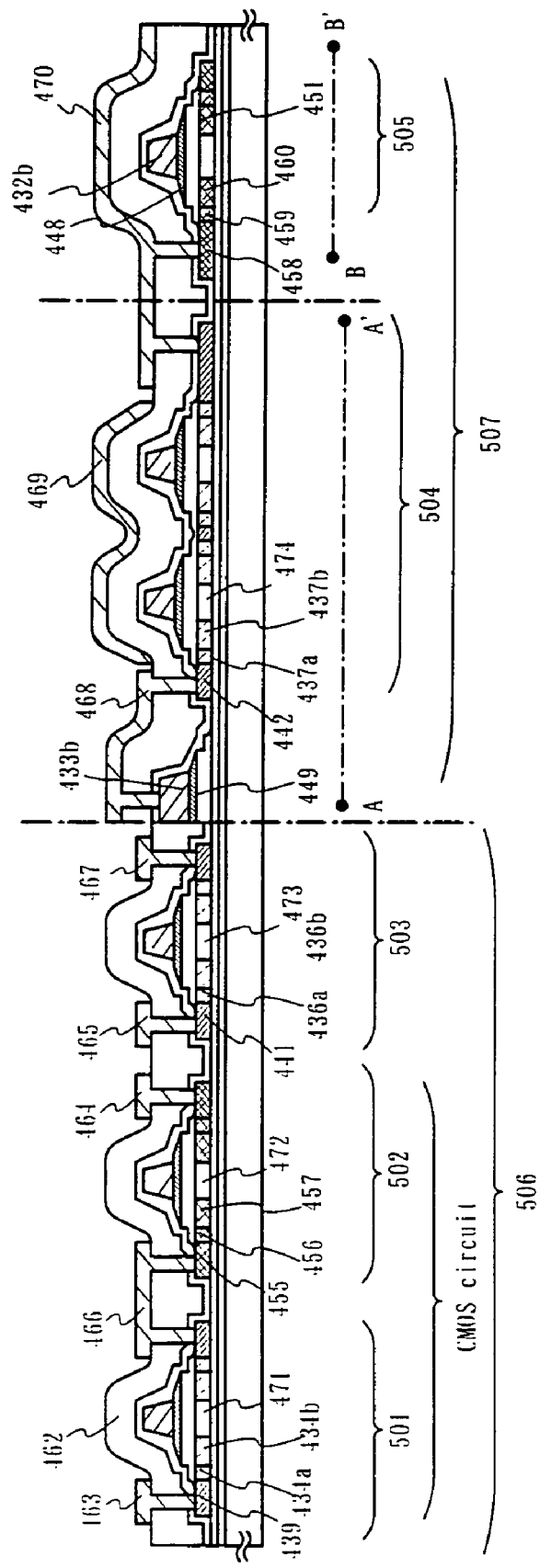
FIG. 14 shows the manufacturing process of the AM-LCD.

Also, in a pixel portion 507, a pixel electrode 470, a gate wiring 469, and a connection electrode 468 are formed (FIG. 14). By this connection electrode 468, an electrical connection between a source wiring (lamination layer of the impurity region 443b and the first conductive layer 449) and the pixel TFT is formed. Also, an electrical connection between the gate wiring 469 and the gate electrode of the pixel TFT is formed. With respect to the pixel electrode 470, an electrical connection with the drain region 442 of the pixel TFT and an electrical connection with the semiconductor layer 458 which functions as one of electrodes for forming a storage capacitor are formed. It is desired that a material having a high reflectivity, such as a film containing Al or Ag as its main constituent, or a lamination film thereof, is used for the pixel electrode 470.

Thus, the driver circuit 506 having a CMOS circuit formed by an n-channel TFT 501 and a p-channel TFT 502 and an n-channel type TFT 503, and the pixel portion 507 having a pixel TFT 504 and a retaining capacitor 505 can be formed on the same substrate. As a result, the active matrix substrate is completed.

The n-channel type TFT 501 of the driver circuit 506 has a channel forming region 471, a low concentration impurity region (GOLD region) 434b overlapping with the first conductive layer 444 constituting a portion of the gate electrode, a low concentration impurity region (LDD region) 434a formed outside the gate electrode, and a high concentration impurity region 439 which functions as the source region or the drain region. The p-channel type TFT 502 forming the CMOS circuit by connecting with the n-channel type TFT 501 through an electrode 466 has a channel forming region 472, an impurity region 457 overlapping with the gate electrode, an impurity region 456 formed outside the gate electrode, and a high concentration impurity region 455 which functions as the source region or the drain region. The n-channel type TFT 503 has a channel forming region 473, a low concentration impurity region (GOLD region) 436b overlapping with the first conductive layer 446 constituting a portion of the gate electrode, a low concentration impurity region (LDD region) 436a formed outside the gate electrode, and a high concentration impurity region 441 which functions as the source region or the drain region.

The pixel TFT 504 of the pixel portion 507 includes a channel forming region 474, the low concentration impurity region 437b (GOLD region) overlapping with the first conductive layer 447 forming a part of the gate electrode, a low concentration impurity region 437a (LDD region) formed outside the gate electrode, and the high concentration impurity region 443 functioning as a source region or a drain region. Besides, impurity elements imparting p-type conductivity are added to the respective semiconductor layers 458 to 460 functioning as one of the electrodes of the storage capacitor 505. The storage capacitor 505 is formed from the electrode (a lamination of 448 and 432b) and the semiconductor layers 458 to 460 using the insulating film 451 as a dielectric member.

Further, in the pixel structure of this embodiment, an end portion of the pixel electrode is formed by arranging it so as to overlap with the source wiring so that the gap between the pixel electrodes is shielded from light without using a black matrix.

Figure 15:
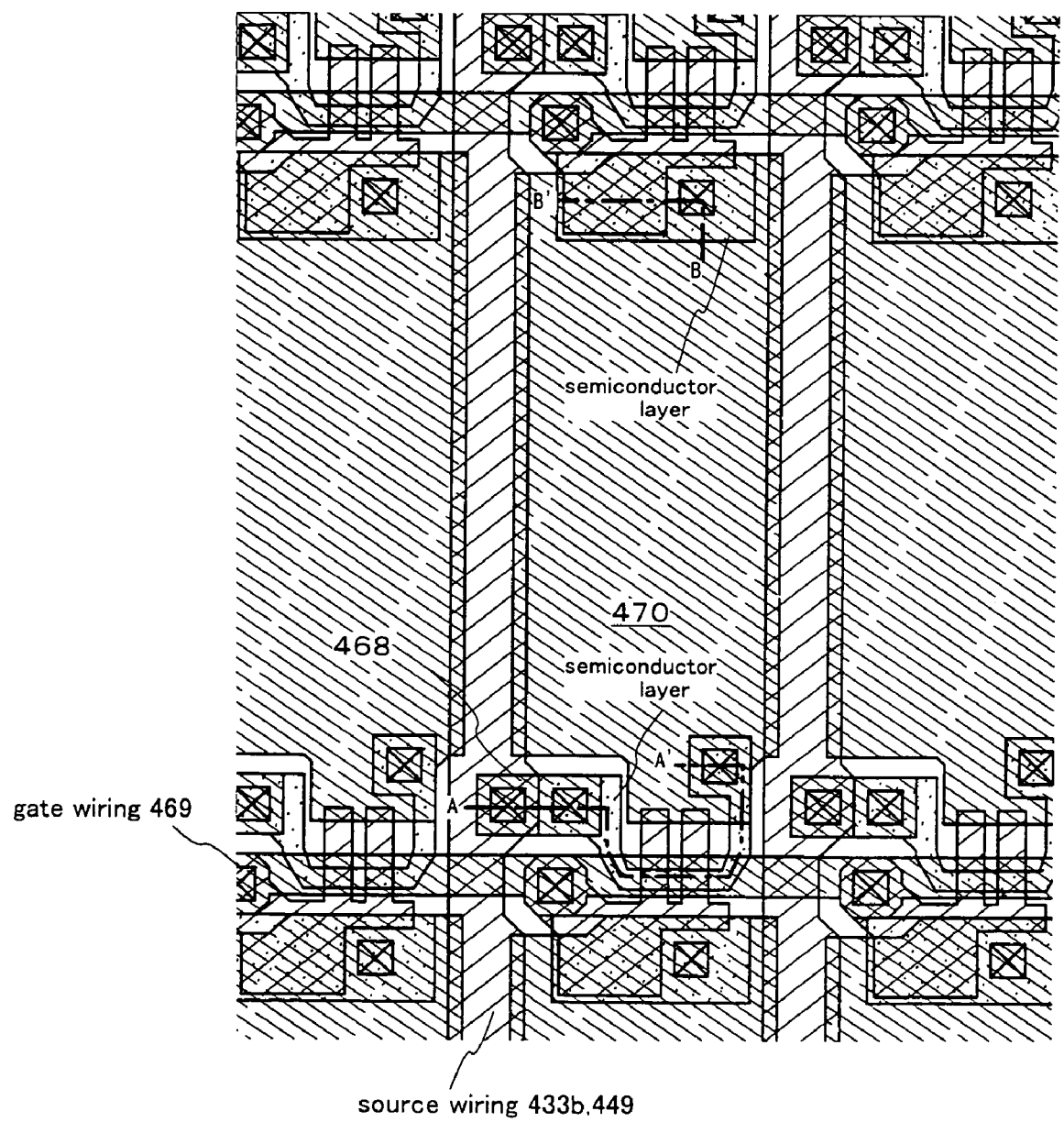
FIG. 15 is a top view of a pixel.

A top view of the pixel portion of the active matrix substrate manufactured in this embodiment is shown in FIG. 15. Note that, the same reference numerals are used to indicate parts corresponding FIGS. 12 to 14. A dash line A-A' in FIG. 14 corresponds to a sectional view taken along the line A-A' in FIG. 15. Also, a dash line B-B' in FIG. 14 corresponds to a sectional view taken along the line B-B' in FIG. 15.

In addition, in accordance with the process steps of this embodiment, the number of photo masks needed for manufacturing the active matrix substrate may be made into five pieces. As a result, it can contribute to reduction in manufacturing steps, lowering the manufacturing cost, and improving the yield.

[Embodiment 4]

Figure 16:
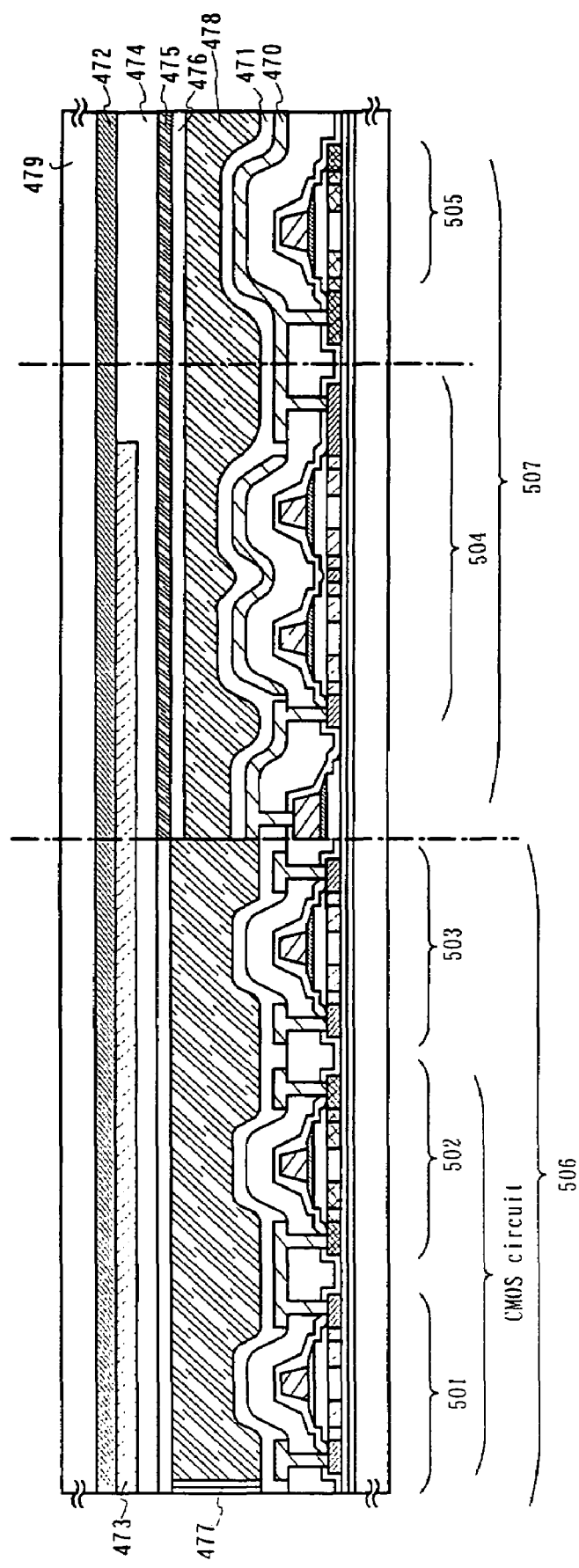
FIG. 16 is a cross sectional structural view of a reflection type liquid crystal display device.

In this embodiment, a manufacturing process of a reflection type liquid crystal display device from the active matrix substrate manufactured in accordance with Embodiment 3 will be described hereinbelow. FIG. 16 is referred to in an explanation thereof.

First, in accordance with Embodiment 3, an active matrix substrate in a state shown in FIG. 14 is obtained, and thereafter, an orientation film 471 is formed at least on the pixel electrode 470 on the active matrix substrate of FIG. 14, and is subjected to a rubbing process. Note that, in this embodiment, before the formation of the orientation film 471, a columnar spacer (not shown) for maintaining a gap between the substrates is formed at a desired position by patterning an organic resin film such as an acrylic resin film. Further, spherical spacers may be scattered on the entire surface of the substrate in place of the columnar spacer.

Next, an opposing substrate 479 is prepared. Colored layers 472, 473 and a leveling film 474 are formed on the opposing substrate 479. The red-colored layer 472 and the blue-colored layer 473 are overlapped with each other, thereby forming a light shielding portion. Note that, the red-colored layer and a green-colored layer may be partially overlapped with each other to form a light shielding portion.

In this embodiment, the substrate as shown in Embodiment 3 is used. Thus, in FIG. 15 showing the top view of the pixel portion of Embodiment 3, it is necessary to shield the light at least, a gap between the gate wiring 469 and the pixel electrode 470, a gap between the gate wiring 469 and the connection electrode 468, and a gap between the connection electrode 468 and the pixel electrode 470. In this embodiment, the respective colored layers are arranged such that these gaps are overlapped with a light shielding portion made from a lamination layer of the colored layers in light shielding positions, and then adhered to the counter substrate.

Thus, without forming a light shielding layer such as a black mask, the number of processes can be reduced by shielding the light in the gaps between the respective pixel electrodes using the light shielding portion made from the lamination layer of the colored layers.

Next, an opposing electrode 475 made from a transparent conductive film is formed on a leveling film 474 in at least the pixel portion, and then an orientation film 476 is formed on the entire surface of the counter substrate to perform a rubbing processing.

Then, the active matrix substrate in which the pixel portion 506 and the driver circuit 507 are formed and the counter substrate are adhered to each other by using a sealing member 477. A filler is mixed with the sealing member 477, and two substrate are adhered to each other with a uniform interval by this filler and the columnar spacer. After that, a liquid crystal material 478 is injected into a space between both substrates and then completely sealed by a sealing agent (not shown). A known liquid crystal material may be used as the liquid crystal material 478. Note that, since this embodiment is the reflection type, a substrate interval becomes about a half that in Embodiment 1. Thus, the reflection type liquid crystal display device as shown in FIG. 16 is completed. If necessary, the active matrix substrate or the counter substrate is cut with a predetermined shape. Also, a polarization plate (not shown) is adhered to only the counter substrate. And, an FPC is adhered to the liquid crystal display device using a known technique.

The liquid crystal panel thus manufactured can be used as the display portion of various electronic devices.

[Embodiment 5]

In this embodiment, an example that an EL (electro luminescence) display device, which is also called a light emitting device or a light emitting diode, is manufactured by using the present invention will be described. The EL device referred to in this specification include a triplet-based light emission device and a singlet-based light emission device, for example. Note that, FIG. 18 is a cross sectional view of the EL display device of the present invention.

Figure 18:
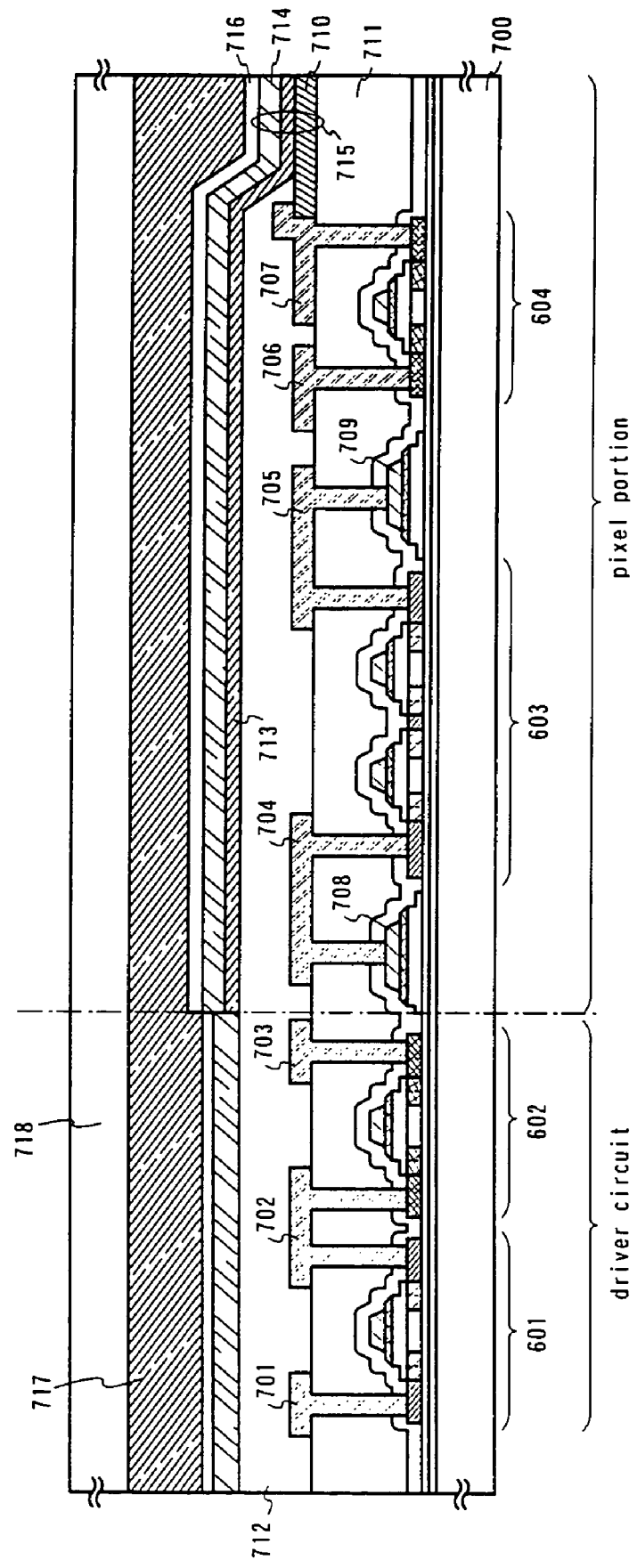
FIG. 18 shows a structure of an active matrix EL display device.

In FIG. 18, a switching TFT 603 provided on a substrate 700 is formed using the n-channel type TFT 503 of FIG. 14. Thus, this structure may be referred to the description of the n-channel type TFT 503.

Note that, in this embodiment, a double gate structure in which two channel forming regions are formed is used. However, a single gate structure in which one channel forming region is formed, or a triple gate structure in which three channel forming regions are formed may be used.

A driver circuit provided on the substrate 700 is formed using the CMOS circuit (a n-channel type TFT 601 and p-channel type TFT 602) of FIG. 14. Thus, this structure may be referred to the descriptions of the n-channel type TFT 501 and the p-channel type TFT 502. Note that, in this embodiment, the single gate structure is used. However, the double gate structure or the triple gate structure may also be used.

Also, wirings 701 and 703 function as a source wiring of the CMOS circuit, a wiring 702 functions as a drain wiring thereof. A wiring 704 functions as a wiring for electrically connecting a source wiring 708 with a source region of the switching TFT. A wiring 705 functions as a wiring for electrically connecting a drain wiring 709 with a drain region of the switching TFT.

Note that, a current-controlled TFT 604 is formed using the p-channel type TFT 502 of FIG. 14. Thus, this structure may be referred to the descriptions of the p-channel type TFT 502. Note that, in this embodiment, the single gate structure is used. However, the double gate structure or the triple gate structure may be used.

Also, a wiring 706 is a source wiring (corresponding to a current supply line) of the current-controlled TFT. Reference numeral 707 denotes an electrode which is electrically connected with a pixel electrode 710 by overlapping with the pixel electrode 710 of the current-controlled TFT.

Note that, reference numeral 710 denotes the pixel electrode (anode of an EL element) made from a transparent conductive film. As the transparent conductive film, a compound of indium oxide and tin oxide, a compound of indium oxide and zinc oxide, zinc oxide, tin oxide, or indium oxide can be used. Also, the transparent conductive film to which gallium is added may be used. The pixel electrode 710 is formed on a level interlayer insulating film 711 before the formation of the above wirings. In this embodiment, it is very important to level a step in the TFT using the leveling film 711 made of resin. Since an EL layer formed later is extremely thin, there is the case where insufficient light emitting occurs due to the step. Thus, in order to form the EL layer as level as possible, it is desired that the step is leveled before the formation of the pixel electrode 710.

After the wirings 701 to 707 are formed, a bank 712 is formed as shown in FIG. 18. The bank 712 may be formed by patterning an insulating film with a thickness of 100 to 400 nm containing silicon or an organic resin film.

Note that, since the bank 712 is an insulating film, it is necessary to pay attention to a dielectric breakdown of an element in the film formation. In this embodiment, a carbon particle or a metal particle is added to the insulating film which is a material of the bank 712 to reduce a resistivity. Thus, an electrostatic occurrence is suppressed. Here, an additional amount of the carbon particle or the metal particle may be controlled such that the resistivity is $1 \times 10^6$ to $1 \times 10^{12}$ Ωm (preferably, $1 \times 10^8$ to $1 \times 10^{10}$ Ωm).

An EL layer 713 is formed on the pixel electrode 710. Note that, only one pixel is shown in FIG. 18. However, in this embodiment, the EL layers are formed corresponding to respective colors of R (red), G (green), and B (blue). Also, in this embodiment, a low molecular organic EL material is formed by an evaporation method. Concretely, copper phthalocyanine (CuPc) film with a thickness of 20 nm is provided as a hole injection layer, and a tris-8-quinolinolate aluminum complex ($Alq_3$) film with a thickness of 70 nm is provided thereon as a light emitting layer. Thus, a lamination structure of those films is formed. A light emitting color can be controlled by adding a fluorochrome such as quinacridon, perylene, or DCM1 to $Alq_3$.

Note that, the above example is one example of the organic EL material which can be used as the EL layer, and it is unnecessary to be limited to this example. The EL layer (layer for causing light to emit and a carrier to move for the emitting of light) may be formed by freely combining the light emitting layer and a charge transport layer or a charge injection layer. For example, in this embodiment, although the example that the low molecular organic EL material is used as the EL layer is shown, a polymer organic EL material may be also used. Also, an inorganic material such as silicon carbide can be used as the charge transport layer or the charge injection layer. A known material can be used as the organic EL material and the inorganic material.

Next, a cathode 714 made from a conductive film is provided on the EL layer 713. In the case of this embodiment, an alloy film of aluminum and lithium is used as the conductive film. Of course, a known MgAg film (alloy film of magnesium and silver) may be used. As a cathode material, the conductive film made of an element which belongs to group 1 or group 2 of the periodic table, or the conductive film to which those elements are added may be used.

When this cathode 714 is formed, an EL element 715 is completed. Note that, the EL element 715 completed here represents a capacitor formed by the pixel electrode (anode) 710, the EL layer 713, and the cathode 714.

It is effective to provide a passivation film 716 so as to completely cover the EL element 715. As the passivation film 716, a single layer of an insulating film containing a carbon film, a silicon nitride film, or silicon nitride oxide film, or a lamination layer of a combination with the insulating film is used.

Here, it is preferred that a film with a good coverage is used as the passivation film, and it is effective to use the carbon film, in particular a DLC (diamond like carbon) film. Since the DLC film can be formed in a range of a room temperature to 100° C., it can be easily formed over the EL layer 713 with a low heat-resistance. Also, since the DLC film has a high blocking effect against oxygen, the oxidation of the EL layer 713 can be suppressed. Thus, the oxidation of the EL layer 713 during the following sealing process can be prevented.

Further, a sealing member 717 is provided on the passivation film 716, and then a cover member 718 is adhered to the sealing member 717. Ultraviolet light cured resin may be used as the sealing member 717, and it is effective to provide a material having a hygroscopic effect or a material having an oxidation inhibition effect inside. Also, in this embodiment, a member in which a carbon film (preferably, a diamond carbon like film) is formed on both surfaces of, a glass substrate, a quartz substrate, or a plastic substrate (including a plastic film) is used as the cover member 718.

Thus, an EL display device of the structure as shown in FIG. 18 is completed. Note that, after the formation of the bank 712, it is effective to successively perform the processes until the formation of the passivation film 716 using a film formation apparatus of a multi chamber system (or an inline system) without exposing to air. Further, processes until the adhesion of the cover member 718 can be successively performed without exposing to air.

Thus, n-channel TFTs 601 and 602, a switching TFT (n-channel TFT) 603, and a current control TFT (n-channel TFT) 604 are formed on the insulator 700 in which a plastic substrate is formed as a base. The number of masks required in the manufacturing process until now is less than that required in a general active matrix EL display device.

That is, the manufacturing process of the TFTs is largely simplified, and thus the improvement of yield and the reduction of a manufacturing cost can be realized.

Further, as described using FIG. 14, when the impurity regions overlapped with the gate electrode through the insulating film are provided, the n-channel type TFT having a high resistant against the deterioration due to a hot carrier effect can be formed. Thus, the EL display device with high reliability can be realized.

In this embodiment, only the structures of the pixel portion and the driver circuit are shown. However, according to the manufacturing process of this embodiment, logic circuits such as a signal separation circuit, a D/A converter, an operational amplifier, and a γ correction circuit can be further formed on the same insulator. A memory and a microprocessor can be also formed.

An EL light emitting device of this embodiment after the sealing (filling) process for protecting the EL element will be described using FIG. 19. Note that, if necessary, reference symbols used in FIG. 18 are referred to.

Figure 19A:
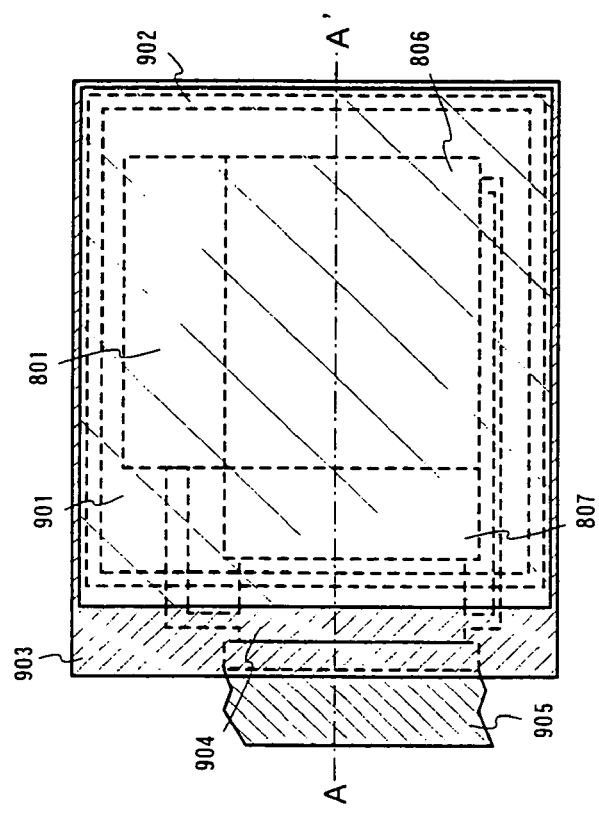
FIGS. 19A and 19B show structures of the active matrix EL display device.
Figure 19B:
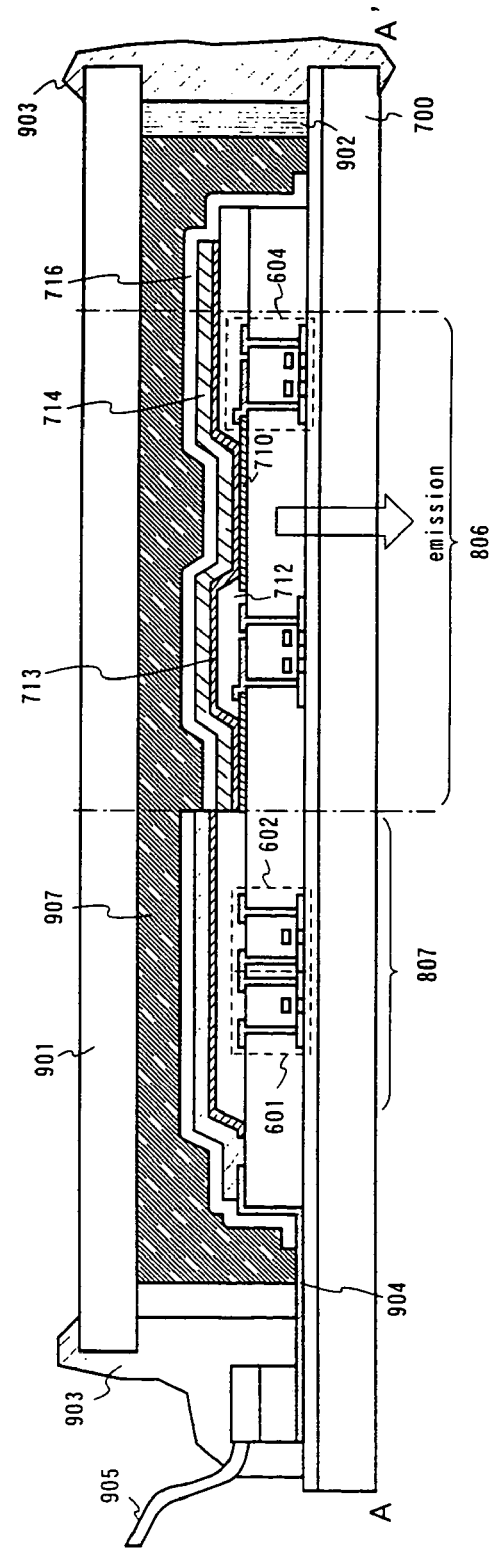

FIG. 19A is a top view representing the state after the sealing of the EL element, and FIG. 19B is a cross sectional view along a line A-A' of FIG. 19A. Reference numeral 801 shown by a dotted line denotes a source side driver circuit, reference numeral 806 denotes a pixel portion, and reference numeral 807 denotes a gate side driver circuit. Also, reference numeral 901 denotes a cover member, reference numeral 902 denotes a first sealing member, and reference numeral 903 denotes a second sealing member. A sealing member 907 is provided in the inside surrounded by the first sealing member 902.

Note that, reference numeral 904 denotes a wiring for transmitting signals inputted to the source side driver circuit 801 and the gate side driver circuit 807. The wiring 904 receives a video signal and a clock signal from an FPC (flexible printed circuit) 905 as an external input terminal. In FIG. 19A, although only the FPC is shown, a printed wiring board (PWB) may be attached to the FPC. The EL display device in this specification includes not only the main body of the EL display device but also the EL display device to which the FPC or the PWB is attached.

Next, the cross sectional structure will be described using FIG. 19B. The pixel portion 806 and the gate side driver circuit 807 are formed over a substrate 700. The pixel portion 806 is formed by a plurality of pixels each having a current control TFT 604 and a pixel electrode 710 electrically connected with the drain region thereof. Also, the gate side driver circuit 807 is formed using the CMOS circuit in which an n-channel type TFT 601 and a p-channel type TFT 602 are combined with each other (see FIG. 14).

The pixel electrode 710 functions as an anode of the EL element. Also, banks 712 are formed in both ends of the pixel electrode 710. An EL layer 713 and a cathode 714 of the EL element are formed on the pixel electrode 710.

The cathode 714 also functions as a wiring common to all pixels, and is electrically connected with the FPC 905 through the connection wiring 904. Further, all elements which are included in the pixel portion 806 and the gate side driver circuit 807 are covered with the cathode 714 and a passivation film 716.

Also, the cover member 901 is adhered to the resultant substrate 700 by the first sealing member 902. Note that, in order to keep an interval between the cover member 901 and the EL element, a spacer made of a resin film may be provided. Then, the inside of the first sealing member 902 is filled with a sealing member 907. Note that, it is preferred that epoxy resin is used as the first sealing member 902 and the sealing member 907. Also, it is desired that the first sealing member 902 is a material to which moisture and oxygen are not penetrated as much as possible. Further, a material having a hygroscopic effect or a material having an oxidation inhibition effect may be contained in the sealing member 907.

The sealing member 907 provided to cover the EL element also functions as an adhesive for adhering the cover member 901 to the resultant substrate 700. Also, in this embodiment, FRP (fiberglass-reinforced plastics), PVF (polyvinylfluoride), Mylar, polyester, or acrylic can be used as a material of a plastic substrate 901a composing the cover member 901.

Also, after the adhering of the cover member 901 using the sealing member 907, the second sealing member 903 is provided to cover side surfaces (exposed surfaces) of the sealing member 907. In the second sealing member 903, the same material as that of the first sealing member 902 can be used.

By sealing the EL element with the sealing member 907 with the above structure, the EL element can be completely shielded from the outside, and penetration of a substance (such as moisture or oxygen) which prompts deterioration due to oxidation of the EL layer, from the outside, can be prevented. Thus, the EL display device with high reliability is obtained.

[Embodiment 6]

TFT formed by implementing above Embodiments 1 to 5 of the present invention can be used in various electro-optical devices (such as an active matrix liquid crystal display device, an active matrix EL display device and an active matrix EC display device). Namely, the present invention can be implemented in all electronic appliance in which these electro-optical devices are built into a display portion.

The following can be given as such electronic appliance: a video camera, a digital camera, a projector, a head-mounted display (goggle type display), a car navigation system, a car stereo, a personal computer, and a portable information terminal (such as a mobile computer, a portable telephone or an electronic book). Examples of these are shown in FIGS. 20, 21 and 22.

FIG. 20A is a personal computer, and it includes a main body 2001, an image input portion 2002, a display portion: 2003, and a keyboard 2004, etc. The present invention can be applied to the display portion 2003.

FIG. 20B is a video camera, and it includes a main body 2101, a display portion 2102, an audio input portion 2103, operation switches 2104, a battery 2105, and an image receiving portion 2106, etc. The present invention can be applied to the display portion 2102.

FIG. 20C is a mobile computer, and it includes a main body 2201, a camera portion 2202, an image receiving portion 2203, operation switches 2204, and a display portion 2205. The present invention can be applied to the display portion 2205.

FIG. 20D is a goggle type display, and it includes a main body 2301, a display portion 2302, an arm portion 2303, etc. The present invention can be applied to the display portion 2302.

FIG. 20E is a player that uses a recording medium on which a program is recorded (hereafter referred to as a recording medium), and the player includes a main body 2401, a display portion 2402, a speaker portion 2403, a recording medium 2404, and operation switches 2405, etc. Note that this player uses a recording medium such as a DVD (digital versatile disk) or a CD, and the appreciation of music, the appreciation of film, game playing and the Internet can be performed. The present invention can be applied to the display portion 2402.

FIG. 20F is a digital camera, and it includes a main body 2501, a display portion 2502, an eyepiece portion 2503, operation switches 2504, and an image receiving portion (not shown in the figure), etc. The present invention can be applied to the display portion 2502.

Figure 21A:
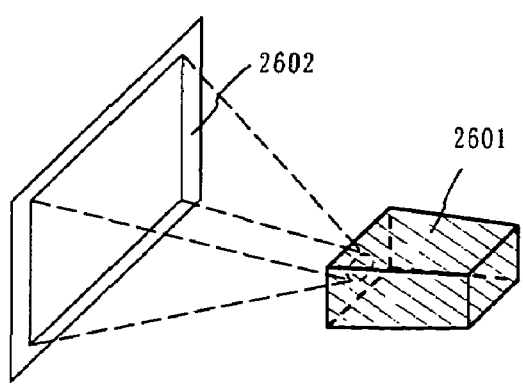
FIGS. 21A to 21D show examples of electronic equipment.

FIG. 21A is a front projector, and it includes a projection system 2601, a screen 2602, etc. The present invention can be applied to a liquid crystal display device 2808 which constitutes a part of the projection system 2601, or other driver circuits.

Figure 21B:
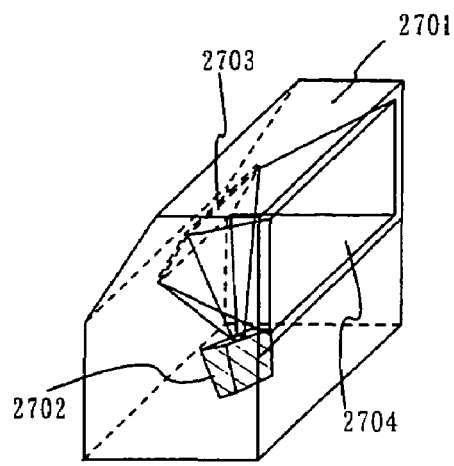

FIG. 21B is a rear projector, and it includes a main body 2701, a projection system 2702, a mirror 2703, a screen 2704, etc. The present invention can be applied to a liquid crystal display device 2808 which constitutes a part of the projection system 2702 or other driver circuits.

Figure 21C:
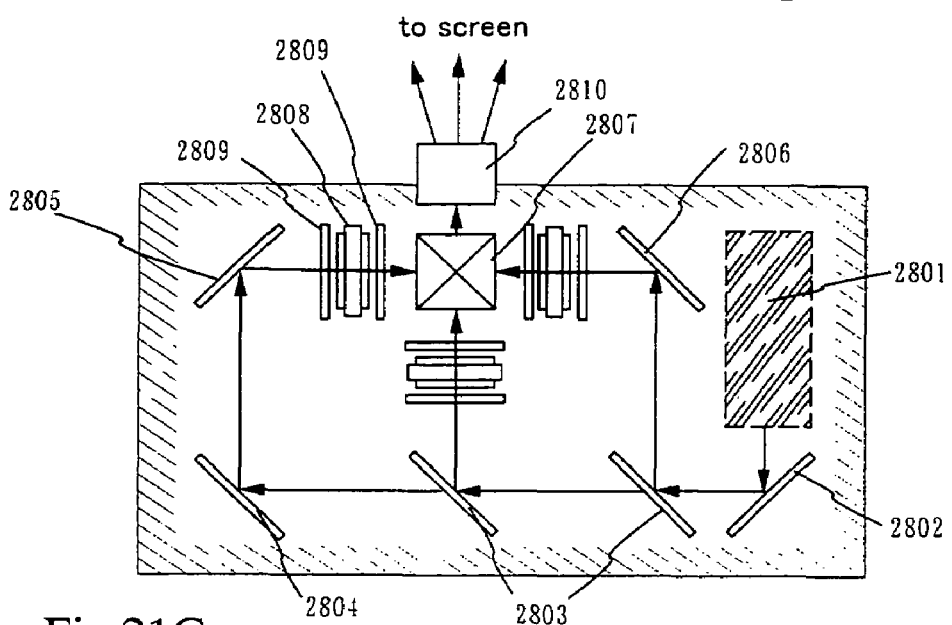

Note that FIG. 21C is a diagram showing an example of the structure of projection systems 2601 and 2702 of FIGS. 21A and 21B. The projection systems 2601 and 2702 comprise an optical light source system 2801, mirrors 2802 and 2804 to 2806, a dichroic mirror 2803, a prism 2807, a liquid crystal display device 2808, phase differentiating plate 2809 and a projection optical system 2810. The projection optical system 2810 comprises an optical system including a projection lens. The present embodiment showed a three plate type, but it is not limited to this structure, and it may be for instance a single plate type. Further, the operator may appropriately dispose an optical system such as an optical lens, a film having light polarizing function, a film for adjusting phase difference and an IR film, in the optical path shown by an arrow in the FIG. 21C.

Figure 21D:
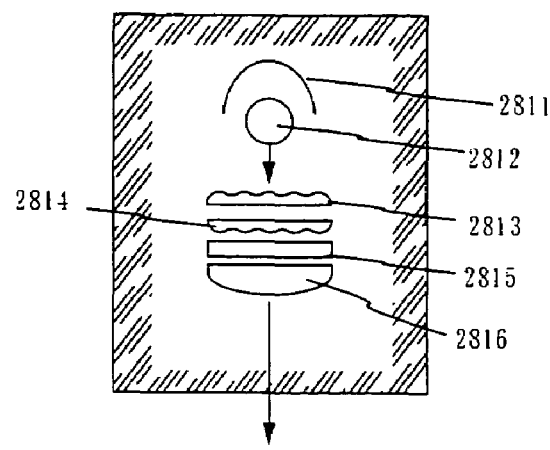

FIG. 21D is a diagram showing an example of the structure of the optical light source system 2801 of FIG. 21C. In the present embodiment the optical light source system 2801 comprises a reflector 2811, a light source 2812, lens arrays 2813 and 2814, light polarizing conversion element 2815 and a condenser lens 2816. Note that the optical light source system shown in FIG. 21D is merely an example and is not specifically limited. For example, the operator may appropriately dispose an optical system such as an optical lens, a film having light polarizing function, a film for adjusting phase difference and an IR film, etc., in the optical light source system.

Provided however, the projectors shown in FIG. 21 show a case of using transmission type electro-optical device and an application example of reflection type electro-optical device and EL display device are not shown in the figures.

Figure 22A:
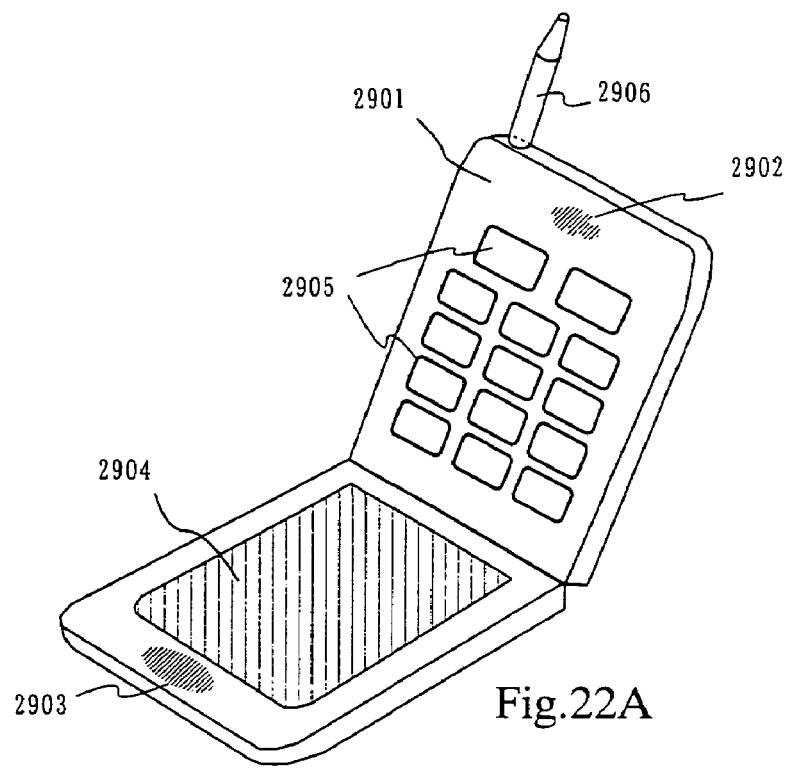
FIGS. 22A to 22C show examples of electronic equipment.

FIG. 22A is a portable telephone, and it includes a main body 2901, an audio output portion 2902, an audio input portion 2903, a display portion 2904, operation switches 2905, and an antenna 2906, etc. The present invention can be applied to the display portion 2904.

Figure 22B:
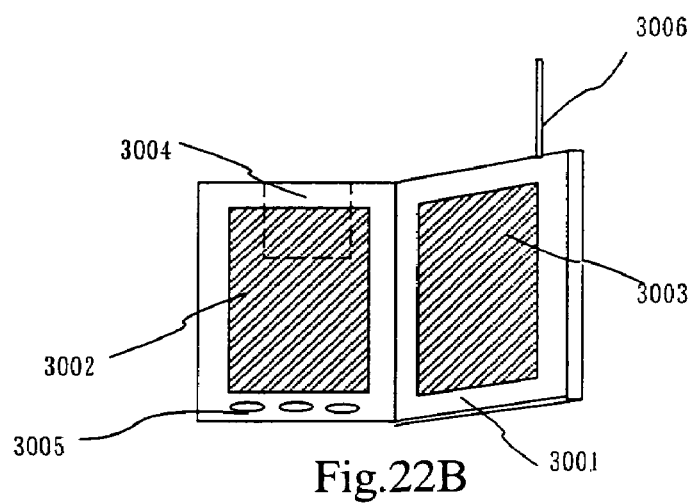

FIG. 22B is a portable book (electronic book), and it includes a main body 3001, display portions 3002 and 3003, a recording medium 3004, operation switches 3005, and an antenna 3006, etc. The present invention can be applied to the display portions 3002 and 3003.

Figure 22C:
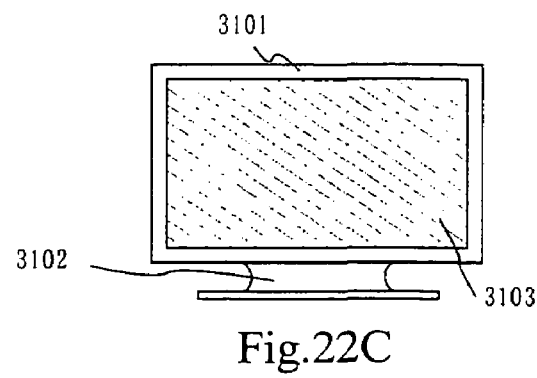

FIG. 22C is a display, and it includes a main body 3101, a support stand 3102, and a display portion 3103, etc. The present invention can be applied to the display portion 3103. The display of the present invention is advantageous for a large size screen in particular, and is advantageous for a display equal to or greater than 10 inches (especially equal to or greater than 30 inches) in the opposite angle.

The applicable range of the present invention is thus extremely wide, and it is possible to apply the present invention to electronic appliance in all fields. Further, the electronic appliance of Embodiment 6 can be realized by using a constitution of any combination of Embodiments 1 to 5.

[Embodiment 7]

This embodiment will be explained with reference to FIGS. 23A to 23C and FIGS. 24A to 24D.

First, a base insulating film 1011 is formed on a substrate 1010. A glass substrate, a quartz substrate, a silicon substrate, a metal substrate or a stainless substrate having an insulating film formed thereon may be used as the substrate 1010. Further, a plastic substrate with heat-resistance, which can stand treatment temperature, may be used.

Besides, as the base insulating film 1011, an insulating film such as a silicon oxide film, a silicon nitride film or a silicon nitride oxide film is used. Here, although an example of a two-layer structure (1011a, 1011b) as the base insulating film 1011 is shown, a single layer film or a lamination of two or more layers of the above insulating films may be used. Note that, the base insulating film may not be formed.

Next, a semiconductor layer 1012 is formed on the base insulating film. A semiconductor film with an amorphous structure is formed by a known means (sputtering method, LPCVD method, plasma CVE method or the like), a crystalline semiconductor film manufactured by conducting a known crystallization process (laser crystallization method, thermal crystallization method, thermal crystallization method using a catalyst such as nickel or the like) is patterned into a desired shape using a first photo mask, and then the semiconductor layer 1012. The thickness of the semiconductor layer 1012 is set from 25 to 80 nm (preferably between 30 and 60 nm). Although there is no limitation on the crystalline semiconductor film material, it is preferable to be formed of a silicon or a silicon germanium (SiGe) alloy.

Next, an insulating film 1013 is formed covering the semiconductor layer 1012.

As the insulating film 1013, a single layer or a laminate structure of an insulating film containing silicon is formed with a thickness of 40 to 150 nm by a plasma CVD method or a sputtering method. Note that, the insulating film 1013 corresponds to a gate insulating film.

Figure 23A:
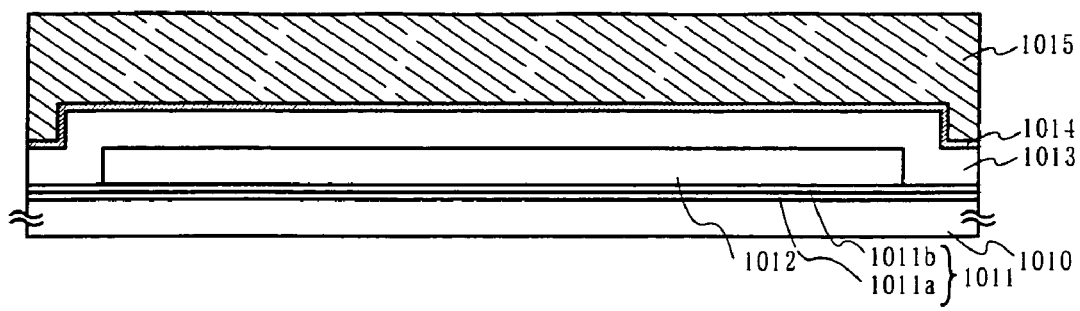
FIGS. 23A to 23D show a manufacturing process of a TFT (Embodiment 7)

Next, a first conductive film 1014 with a thickness of 20 to 100 nm, and a second conductive film 1015 with a thickness of 100 to 400 nm are laminated on the insulating film 1013 (FIG. 23A). Here, the first conductive film 1014 made of a TaN film and the second conductive film 1015 made of a W film are formed in lamination by using the sputtering method. Note that, although the first conductive film 1014 is made of TaN and the second conductive film 1015 is made of W, there is no limitation on the material. Both the first conductive film 1014 and the second conductive film 1015 may be formed of an element selected from the group consisting of Ta, W, Ti, Mo, Al, and Cu, of an alloy material including one of the above elements as its main constituent, or of a chemical compound of the above elements. Further, a semiconductor film, typically a polysilicon film, into which an impurity element such as phosphorous is doped, may also be used.

Figure 23B:
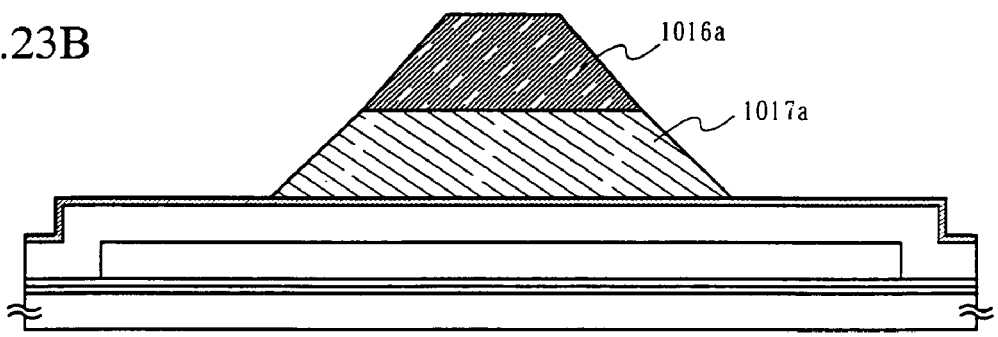

Next, a resist mask 1016a is formed using a second photo mask, and a first etching process is conducted using an ICP etching device. The second conductive film 1015 is etched in the first etching process to obtain a second conductive layer 1017a with a portion of a tapered shape (tapered portion) at the end portion, as shown in FIG. 23B. Note that, although the first conductive film is slightly etched in the first etching, this is not shown in the figure.

The angle of the tapered portion (taper angle) is defined as the angle formed by a surface of the substrate (horizontal surface) and a slanted portion of the tapered portion. The taper angle of the second conductive layer 1017a may be set in the range of 5° to 45° by appropriately selecting the etching conditions.

Figure 23C:
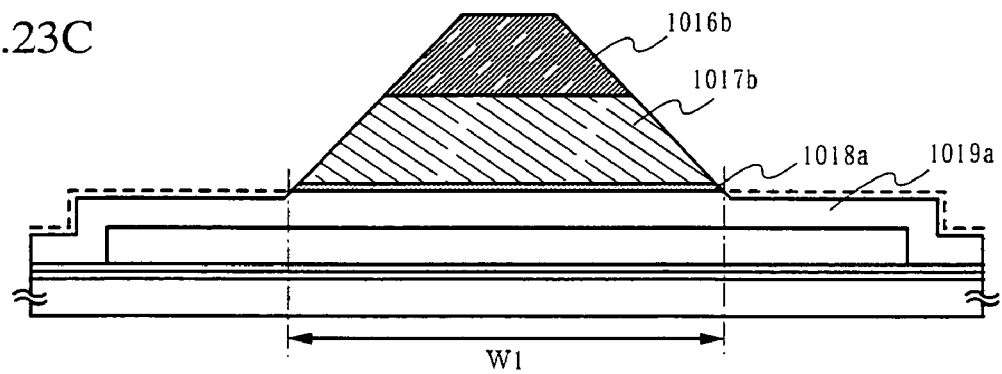

Next, a second etching process is performed using the resist mask 1016a as it is with the ICP etching device. The first conductive film 1014 is etched in the second etching process to form a first conductive layer 1018a as shown in FIG. 23C. The first conductive layer 1018a has a first width (W1). Note that, in the second etching process, the resist mask, the second conductive layer and the insulating film are slightly etched, and a resist mask 1016b, a second conductive layer 1017b and an insulating film 1019a are formed, respectively.

Figure 24A:
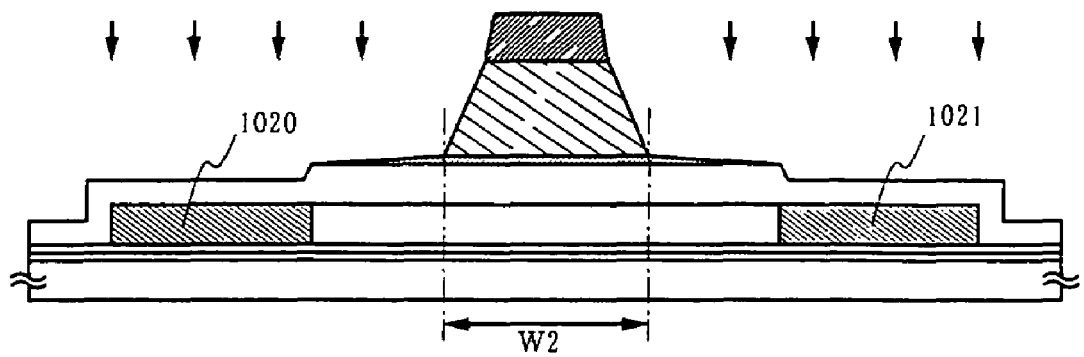
FIGS. 24A to 24D show the manufacturing process of the TFT (Embodiment 7)
Figure 24B:
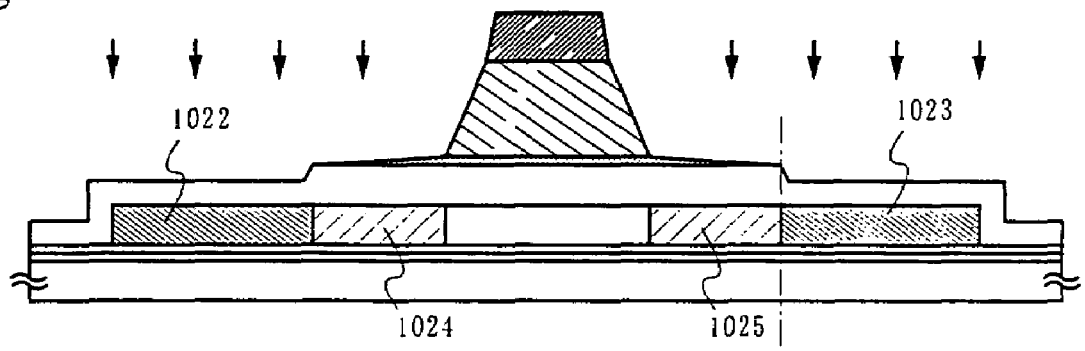
Figure 24C:
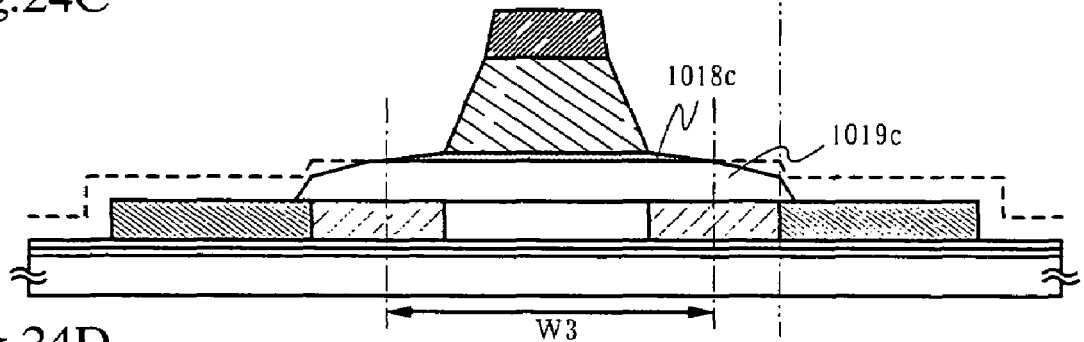
Figure 24D:
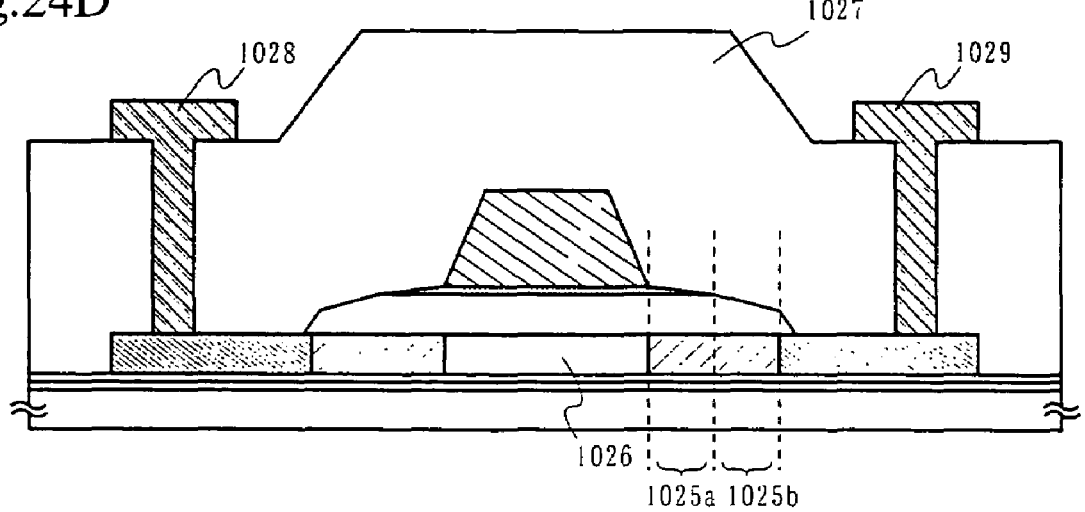

Note that, two etching processes (the first etching process and the second etching process) are performed in order to suppress the reduction in the film thickness, but there is no limitation provided that an electrode structure (a lamination of the second conductive layer 1017b and the first conductive layer 1018a) is formed as shown in FIG. 24C. One etching process may be adopted.

Figure 23D:
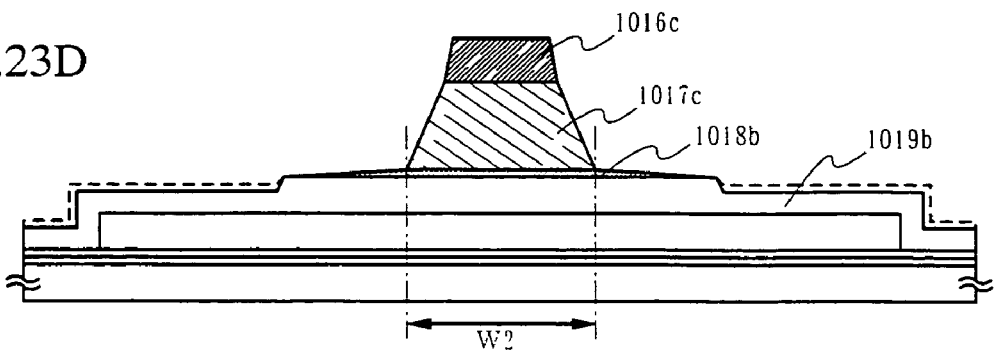

Next, a third etching process is performed with the resist mask 1016b using the ICP etching device. The second conductive layer 1017b is etched in the third etching process to form a second conductive layer 1017c as shown in FIG. 23C. The second conductive layer 1017c has a second width (W2). Note that, in the third etching process, the resist mask, the first conductive layer and the insulating film are slightly etched, and a resist mask 1016c, a first conductive layer 1018b and an insulating film 1019b are formed, respectively (FIG. 23D).

Thereafter, while the resist mask 1016c is kept as it is, a first doping process is conducted. In the first doping process, through doping is performed through the insulating film 1019b using the first conductive layer as a mask, and high concentration impurity regions 1020 and 1021 are formed (FIG. 24A).

With such through doping, the doping amount into the semiconductor layer can be controlled at the desired value.

Next, while the resist mask 1016c is kept as it is, a second doping process is conducted. In the second doping process, through doping is performed through the tapered portion of the first conductive layer 1018b and the insulating film 1019b, and low concentration impurity regions 1024 and 1025 are formed (FIG. 24B). Note that, in the second doping process, the high concentration impurity regions 1020 and 1021 are also doped, and high concentration impurity regions 1022 and 1023 are formed.

Next, while the resist mask 1016c is kept as it is, a fourth etching process is conducted using an RIE etching device or the ICP etching device. In the fourth etching process, a part of the tapered portion of the first conductive layer 1018b is removed. Here, the first conductive layer 1018b with the first width (W1) becomes a first conductive layer 1018c with a third width (W3) (FIG. 24C).

In this embodiment, the first conductive layer 1018c and the second conductive layer 1017c formed thereon become a gate electrode. Note that, in the fourth etching process, the insulating film 1019b is also etched, and an insulating film 1019c is formed. Although an example, in which a part of the insulating film is removed to expose the high concentration impurity regions, is shown here, there is no limitation and the high concentration impurity regions may be covered with a thin insulating film.

Thereafter, the resist mask 1016c is removed, and activation of the impurity element added into the semiconductor layer is performed. Then, after an interlayer insulating film 1027 is formed, a contact hole is formed using a third mask. A conductive film is formed, and then electrodes 1028 and 1029 are formed using a fourth mask.

As described above, a TFT with the structure shown in FIG. 24D can be formed using four photo masks.

Further, the characteristic of the TFT formed in accordance with this embodiment is that the low concentration impurity region 1025, which is provided between the channel forming region 1026 and the drain region 1023, has almost no concentration difference and has a gentle concentration gradient therein, and that the low concentration impurity region 1025 includes a region 1025a overlapping the gate electrode (1018c) (GOLD region) and a region 1025b not overlapping the gate electrode (LDD region). Further, a peripheral portion of the insulating film 1019c, that is the upper portions of the region 1025b not overlapping the gate electrode and the high concentration impurity regions 1020 and 1021, have a tapered shape.

[Embodiment 8]

This embodiment will be explained below with reference to FIGS. 25A to 25D and FIGS. 26A to 26D.

Note that, this embodiment is same as Embodiment 7 up to the first etching process (FIG. 23B) and the same reference symbols are used. Further, FIG. 25A corresponds to FIG. 23A, and FIG. 25B corresponds to FIG. 23B.

First, the state of FIG. 23B is obtained in accordance with Embodiment 7. Through this first etching process, the second conductive layer 1017a with a first width (X1) is formed.

Figure 25A:
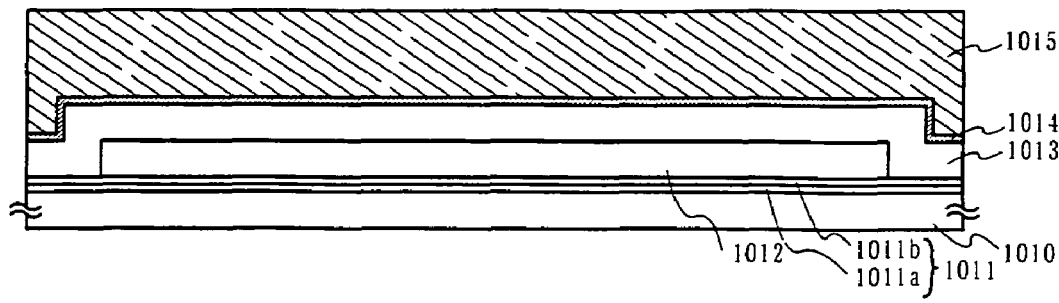
FIGS. 25A to 25D show a manufacturing process of a TFT (Embodiment 8)
Figure 25B:
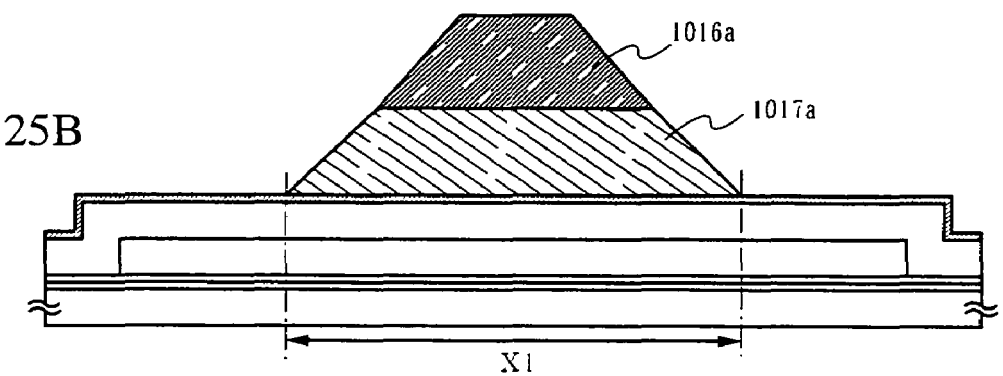
Figure 25C:
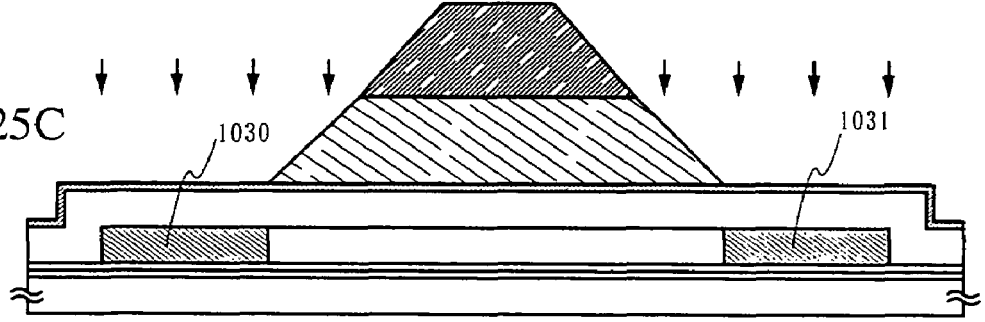

Next, while the resist mask 1016a is kept as it is, the first doping process is performed. Through the first doping process, through doping is performed through the first conductive film 1014 and the insulating film 1013 using the second conductive layer 1017a as a mask, and high concentration impurity regions 1030 and 1031 are formed (FIG. 25C).

With such through doping, the doping amount into the semiconductor layer can be controlled at the desired value.

Figure 25D:
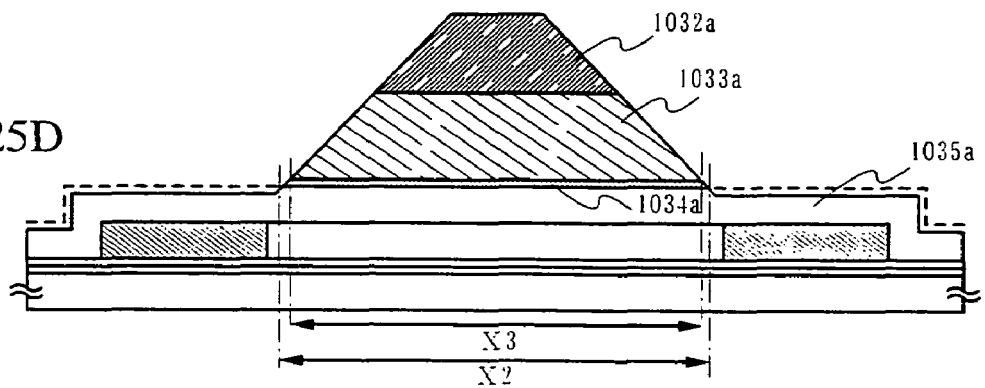

Next, the second etching process is performed using the resist mask 1016a as it is with the ICP etching device. The first conductive film 1014 is etched in the second etching process to form a first conductive layer 1034a as shown in FIG. 25D. The first conductive layer 1034a has a second width (X2). Note that, in the second etching process, the resist mask, the second conductive layer and the insulating film are slightly etched, and a resist mask 1032a, a second conductive layer 1033a with a third width (X3) and an insulating film 1035a are formed, respectively.

Figure 26A:
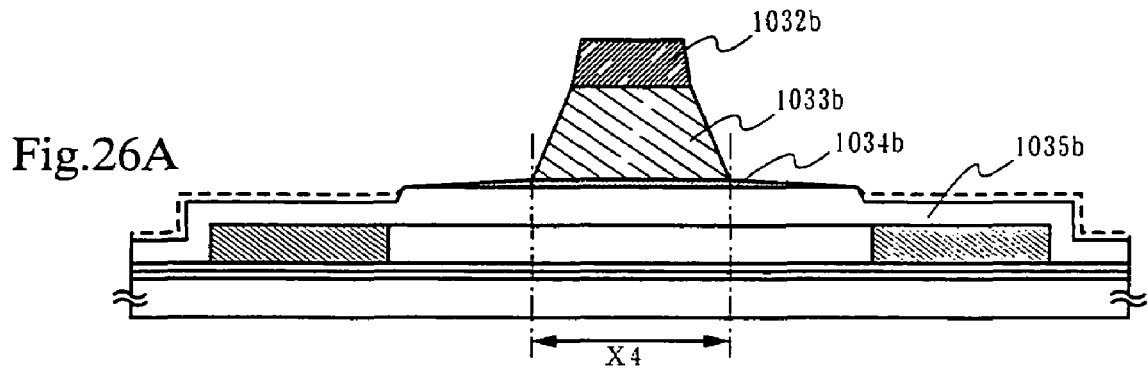
FIGS. 26A to 26D show the manufacturing process of the TFT (Embodiment 8)

Next, a third etching process is performed using the resist mask 1032a with the ICP etching device. The second conductive film 1033a is etched in the third etching process to form a second conductive layer 1033b as shown in FIG. 26A. The second conductive layer 1033b has a fourth width (X4). Note that, in the third etching process, the resist mask, the first conductive layer and the insulating film are slightly etched, and a resist mask 1032b, a first conductive layer 1034b and an insulating film 1035b are formed, respectively (FIG. 26A).

Figure 26B:
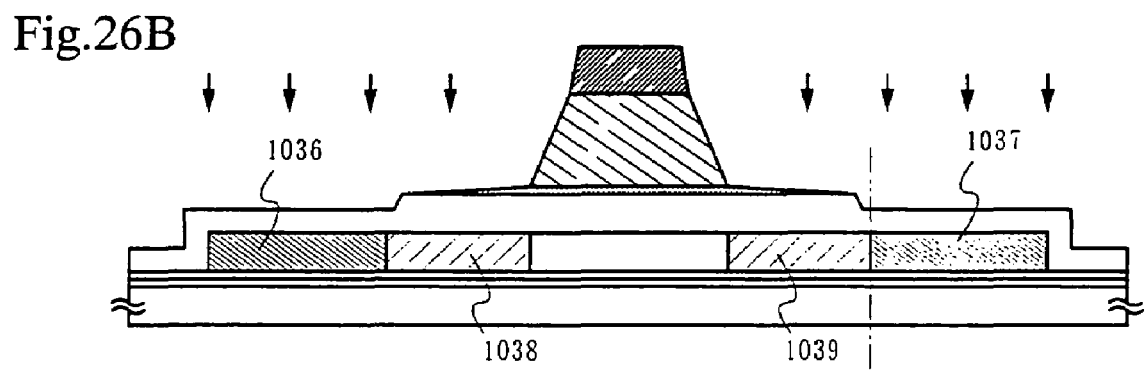

Next, while the resist mask 1032b is kept as it is, the second doping process is conducted. In the second doping process, through doping is performed through the tapered portion of the first conductive layer 1034b and the insulating film 1035b, and low concentration impurity regions 1038 and 1039 are formed (FIG. 26B). Note that, in the second doping process, the high concentration impurity regions 1030 and 1031 are also doped, and high concentration impurity regions 1036 and 1037 are formed.

Figure 26C:
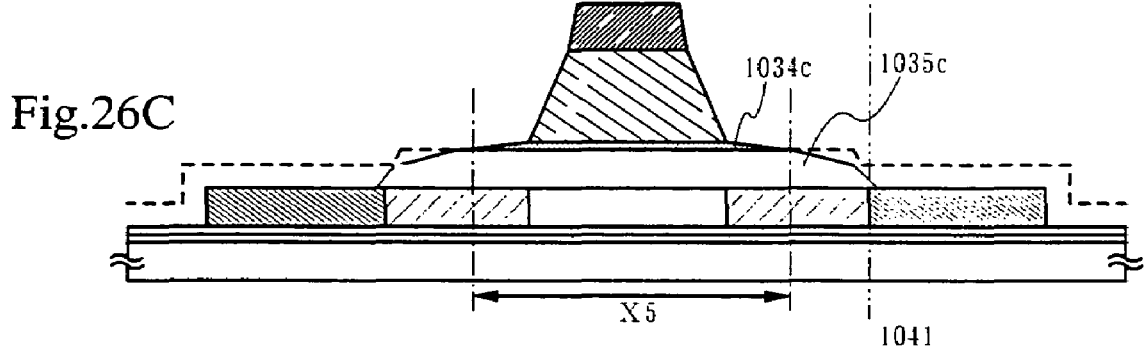
Figure 26D:
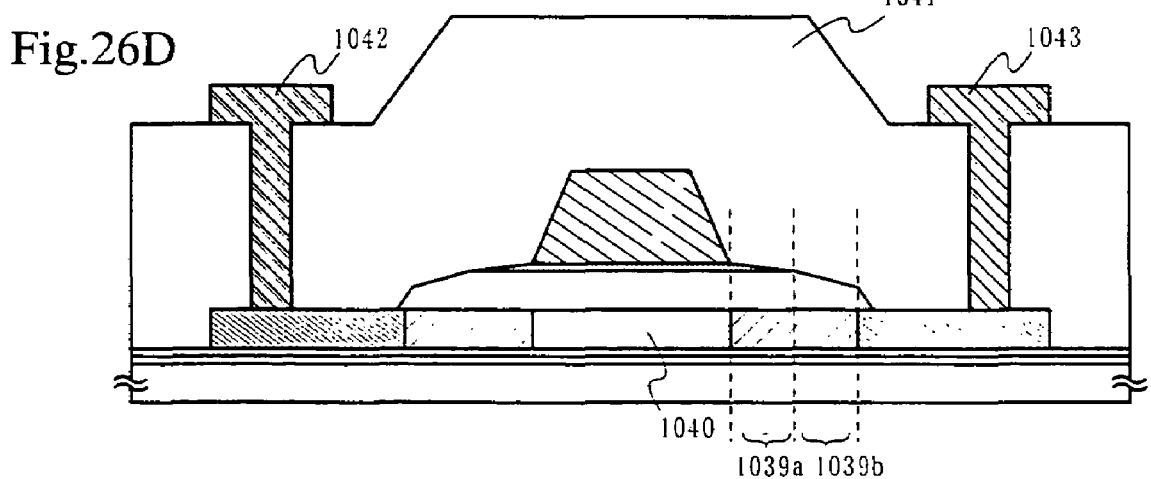

Next, while the resist mask 1032b is kept as it is, the fourth etching process is conducted using an RIE etching device or the ICP etching device. Through the fourth etching process, a part of the tapered portion of the first conductive layer 1034b is removed. Here, the first conductive layer 1034b having the first width (X2) becomes a first conductive layer 1034c with a fifth width (X5) (FIG. 26C).

In this embodiment, the first conductive layer 1034c and the second conductive layer 1033b formed thereon become a gate electrode. Note that, in the fourth etching process, the insulating film 1035b is also etched, and an insulating film 1035c is formed. Although an example, in which a part of the insulating film is removed to expose the high concentration impurity regions, is shown here, there is no limitation. The high concentration impurity regions may be covered with a thin insulating film.

Thereafter, the resist mask 1032b is removed, and activation of the impurity element added into the semiconductor layer is performed. Then, after an interlayer insulating film 1041 is formed, a contact hole is formed using a third mask. A conductive film is formed, and then electrodes 1042 and 1043 are formed using a fourth mask.

As described above, a TFT with the structure shown in FIG. 26D can be formed using four photo masks.

Further, the characteristic of the TFT formed in accordance with this embodiment is that the low concentration impurity region 1039, which is provided between a channel forming region 1040 and the drain region 1037, has almost no concentration difference and has a gentle concentration gradient therein, and that the low concentration impurity region 1039 includes a region 1039a overlapping the gate electrode (1034c) (GOLD region) and a region 1039b not overlapping the gate electrode (LDD region). Further, a peripheral portion of the insulating film 1035c, that is the upper portions of the region 1039b not overlapping the gate electrode and the high concentration impurity regions 1037 and 1036 have a tapered shape.

[Embodiment 9]

This embodiment will be explained with reference to FIG. 25C and FIGS. 27A to 27D.

Note that, this embodiment is same as Embodiment 8 up to the first doping process (FIG. 25C) and the figures are omitted. Further, the same reference symbols in FIGS. 25A to 25C are used here.

First, the state of FIG. 25C is obtained in accordance with Embodiment 7.

Figure 27A:
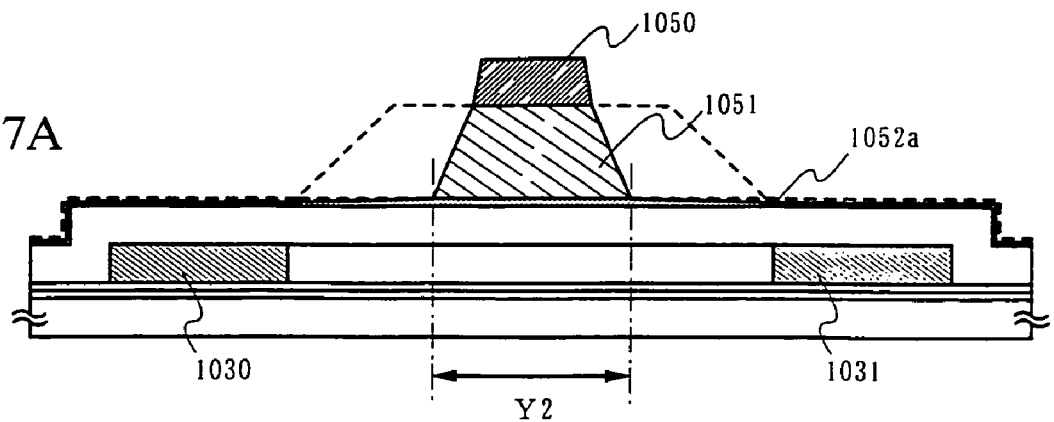
FIGS. 27A to 27D show a manufacturing process of a TFT (Embodiment 9)

Next, the second etching process is performed using the resist mask 1016a with the ICP etching device. The second conductive layer 1017a is etched in the second etching process to form a second conductive layer 1051 as shown in FIG. 27A. The second conductive layer 1051 has a second width (Y2). Note that, in the second etching process, the resist mask and the first conductive film are slightly etched, and a resist mask 1050 and a first conductive film 1052a are formed, respectively (FIG. 27A). Note that, a part of the first conductive film has already been slightly etched in the first etching process, and therefore the part of the first conductive film 1052a is further made thinner. Further, the portion of the first conductive film 1052a not overlapping the second conductive layer, which has not been etched, is made into a tapered shape.

Figure 27B:
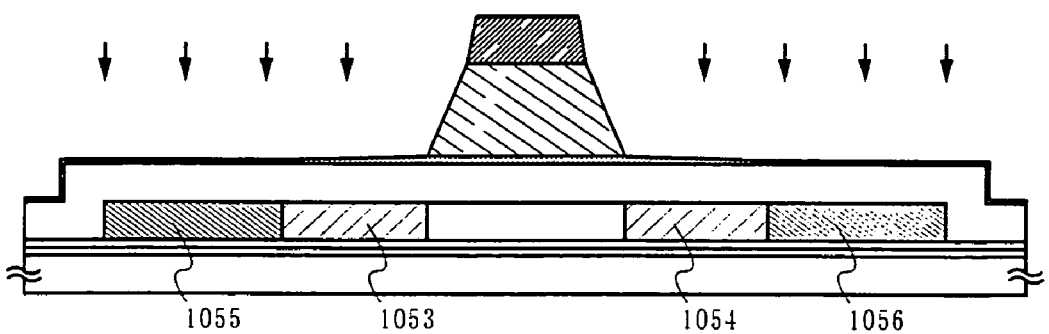

Next, while the resist mask 1050 is kept as it is, a second doping process is conducted. In the second doping process, through doping is performed through the tapered portion of the first conductive film 1052a and the insulating film 1013, and low concentration impurity regions 1053 and 1054 are formed (FIG. 27B). Note that, in the second doping process, the high concentration impurity regions 1030 and 1031 are also doped, and high concentration impurity regions 1055 and 1056 are formed.

With such through doping, the doping amount into the semiconductor layer can be controlled at the desired value.

Figure 27C:
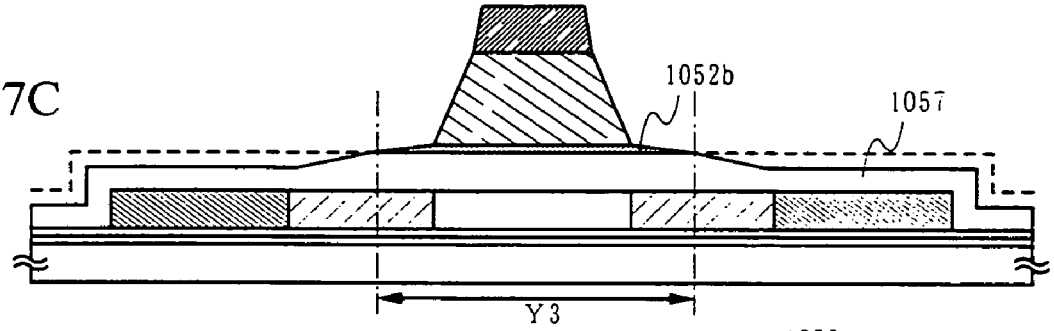
Figure 27D:
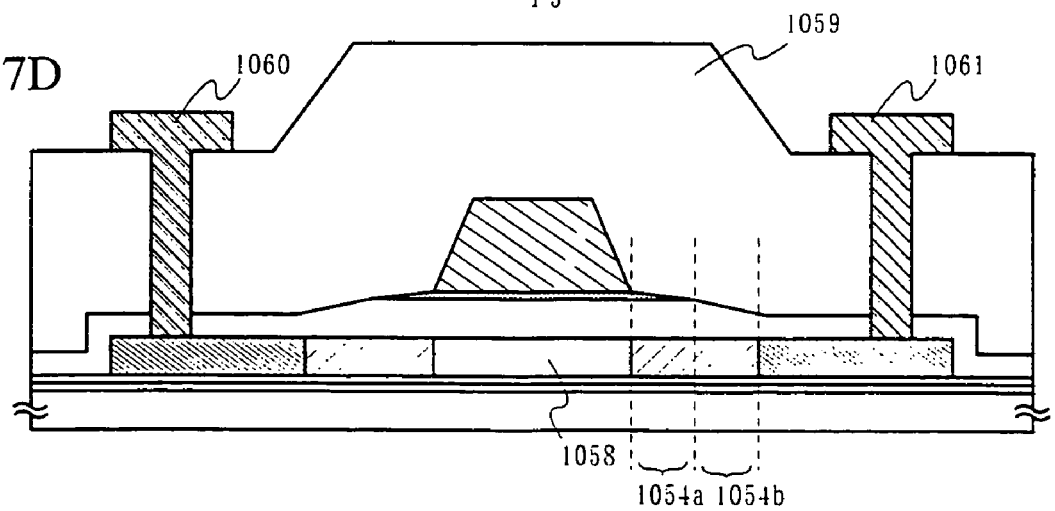

Next, while the resist mask 1050 is kept as it is, a third etching process is performed using the RIE etching device or the ICP etching device. The thinned portion through the first etching process and a part of the tapered portion of the exposed first conductive film 1052a is removed through the third etching process. Here, a first conductive layer 1052b with a tapered portion and a third width (Y3) is formed with appropriately adjusting the etching conditions while taking the thickness of the first conductive film, the thickness of the insulating film and the like into consideration (FIG. 27C).

In this embodiment, the first conductive layer 1052b and the second conductive layer 1051 formed thereon become a gate electrode. Note that, in the third etching process, the insulating film 1013 is also etched, and an insulating film 1057 is formed.

Thereafter, the resist mask 1050 is removed, and activation of the impurity element added into the semiconductor layer is performed. Then, after an interlayer insulating film 1059 is formed, a contact hole is formed using a third mask. After a conductive film is formed, electrodes 1060 and 1061 are formed using a fourth mask.

As described above, a TFT having the structure shown in FIG. 27D can be formed using four photo masks.

Further, the characteristic of the TFT formed in accordance with the present invention is that the low concentration impurity region 1054, which is provided between a channel forming region 1058 and the drain region 1056, has almost no concentration difference and has a gentle concentration gradient therein, and that the low concentration impurity region 1056 includes a region 1054*a* overlapping the gate electrode (1052*b*) (GOLD region) and a region 1054*b* not overlapping the gate electrode (LDD region).

[Embodiment 10]

In this embodiment, a method of simultaneously manufacturing a pixel portion and TFTs (n-channel TFTs and p-channel TFT) of a driver circuit provided in the periphery of the pixel portion is explained in detail with reference to FIGS. 28A to 30.

First, in this embodiment, a substrate 1100 is used, which is made from glass, such as barium borosilicate glass or aluminum borosilicate glass, represented by Corning #7059 glass and #1737 glass. Note that, there is no limitation on the substrate 1100, provided that the substrate has transmissivity, and a quartz substrate may also be used. A plastic substrate having heat resistance to a process temperature in this embodiment may also be used.

Then, a base film 1101 comprised of an insulating film such as a silicon oxide film, a silicon nitride film or a silicon nitride oxide film is formed. In this embodiment, a two-layer structure is used for the base film 1101. However, a single layer film or a lamination film of two or more layers of the insulating film may be used. As a first layer of the base film 1101, a silicon nitride oxide film 1101*a* is formed with a thickness of 10 to 200 nm (preferably 50 to 100 nm) using $SiH_4$, $NH_3$, and $N_2O$ as reaction gases by a plasma CVD method. In this embodiment, the silicon nitride oxide film 1101*a*. (composition ratio Si=32%, O=27%, N=24% and H=17%) having a film thickness of 50 nm is formed. Then, as a second layer of the base film 1101, a silicon nitride oxide film 1101*b* is formed so as to be laminated on the first layer with a thickness of 50 to 200 nm (preferably 100 to 150 nm) using $SiH_4$ and $N_2O$ as reaction gases by the plasma CVD method. In this embodiment, the silicon nitride oxide film 1101*b* (composition ratio Si=32%, O=59%, N=7% and H=2%) having a film thickness of 100 nm is formed.

Subsequently, semiconductor layers 1102 to 1105 are formed on the base film. The semiconductor layers 1102 to 1105 are formed of a semiconductor film having an amorphous structure by a known method (such as a sputtering method, an LPCVD method or a plasma CVD method), and is subjected to a known crystallization process (such as a laser crystallization method, a thermal crystallization method, or a thermal crystallization method using a catalyst such as nickel). The crystalline semiconductor film thus obtained is patterned into desired shapes to obtain the semiconductor layers. The semiconductor layers 1102 to 1105 are formed into a thickness of 25 to 80 nm (preferably 30 to 60 nm). The material of the crystalline semiconductor film is not particularly limited, but it is preferable to form the film using silicon, a silicon germanium ($Si_xGe_{1-x}(0<X<1$, typically X=0.0001 to 0.05)) alloy, or the like. In case of forming silicon germanium, it may be formed by a plasma CVD method using a gas mixture of silane and germanium, it may be formed by an ion injection method injecting germanium into a silicon film, or it may be formed by a sputtering method using a target formed of silicon germanium. In this embodiment, the plasma CVD method is used, and after a 55 nm thick amorphous silicon film is formed, a solution containing nickel is held onto the amorphous silicon film. Dehydrogenation of the amorphous silicon film is performed (500° C. for one hour), and thereafter a thermal crystallization process is performed (550° C. for four hours) thereto. Further, to improve the crystallinity, a laser annealing process is performed to form a crystalline silicon film. Then, this crystalline silicon film is subjected to a patterning process using a photolithography method, to obtain the semiconductor layers 1102 to 1105.

Further, after the formation of the semiconductor layers 1102 to 1105, doping (also referred to as channel doping) of a minute amount of impurity element (boron or phosphorus) may be performed in order to control a threshold value of the TFT.

Besides, in the case where the crystalline semiconductor film is manufactured by a laser crystallization method, a pulse oscillation type or a continuous emission type excimer laser, YAG laser, or $YVO_4$ laser may be used. In the case where those lasers are used, it is appropriate to use a method in which laser light radiated from a laser oscillator is condensed into a linear beam by an optical system, and is irradiated to a semiconductor film. Although the conditions of the crystallization should be properly selected by an operator, in the case where the excimer laser is used, a pulse oscillation frequency is set to 30 Hz, and a laser energy density is set from 100 to 400 $mJ/cm^2$ (typically 200 to 300 $mJ/cm^2$). In the case where the YAG laser is used, it is appropriate that the second harmonic is used to set a pulse oscillation frequency from 1 to 10 kHz, and a laser energy density is set from 300 to 600 $mJ/cm^2$ (typically, 350 to 500 $mJ/cm^2$). Then, laser light condensed into a linear shape with a width of 100 to 1000 μm, for example, 400 μm is irradiated to the whole surface of the substrate, and an overlapping ratio (overlap ratio) of the linear laser light at this time may be set from 80 to 98%.

Next, a gate insulating film 1106 is formed for covering the semiconductor layers 1102 to 1105. It is desirable to clean the surface of the semiconductor layer before the formation of the gate insulating film. The removal of contaminated impurities (typically, C, Na or the like) on the film surface may be conducted such that after the surface is cleaned with pure water containing ozone, the film surface is slightly etched using an acid solution containing fluorine. As a method in which the film surface is slightly etched, it is an effective method, in which the acid solution containing fluorine held on the film surface is scattered by spinning the substrate with a spinning device. As the acid solution containing fluorine, fluoric acid, hydrofluoric acid, ammonium fluoride, buffered fluoric acid (mixed solution of fluoric acid and ammonium fluoride), mixed solution of fluoric acid and hydrogen proxide, or the like may be used. After the cleaning, the gate insulating film 1107 is formed of an insulating film containing silicon by the plasma CVD method or the sputtering method with a film thickness of from 40 to 150 nm, preferably 50 to 100 nm. In this embodiment, the gate insulating film 1107 is formed of a silicon nitride oxide film with a thickness of 110 nm by the plasma CVD method (composition ratio Si=32%, O=59%, N=7%, and H=2%). Of course, the gate insulating film is not limited to the silicon nitride oxide film, and other insulating films containing silicon may be formed into a single layer or a lamination structure.

Besides, when the silicon oxide film is used, it can be formed by the plasma CVD method such that TEOS (tetraethyl orthosilicate) and $O_2$ are mixed with a reaction pressure of 40 Pa and at a substrate temperature of from 300 to 400° C., and discharged at a high frequency (13.56 MHZ) power density of 0.5 to 0.8 $W/cm^2$. The silicon oxide film thus manufactured can have good characteristics as the gate insulating film by subsequent thermal annealing at 400 to 500° C.

Then, as shown in FIG. 28A, on the gate insulating film 1106, a first conductive film 1107 and a second conductive film 1108 are laminated to have a film thickness of 20 to 100 nm and 100 to 400 nm, respectively. It is preferable that the gate insulating film, the first conductive film and the second conductive film are formed in succession without exposure to the atmosphere in order to prevent contamination. Further, in case the where those films are not formed in succession, the contamination on the film surface can be prevented if a film forming device equipped with a washer is used. The cleaning method may be performed the same as that performed before the formation of the gate insulating film. In this embodiment, the first conductive film 1107 made of a TaN film with a film thickness of 30 nm and the second conductive film 1108 made of a W film with a film thickness of 370 nm are formed in succession. The TaN film is formed by sputtering with a Ta target in a nitrogen containing atmosphere. Besides, the W film is formed by the sputtering method with a W target. The W film may be formed by a thermal CVD method using tungsten hexafluoride ($WF_6$). Whichever method is used, it is necessary to make the material have low resistance for use as the gate electrode, and it is preferred that the resistivity of the W film is set to 20 $\mu\Omega$cm or less. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film by sputtering using a target having a high purity (purity of 99.9999% or 99.99%), and in addition, by taking sufficient consideration to prevent impurities within the gas phase from mixing therein during the film formation, a resistivity of from 9 to 20 $\mu\Omega$m can be realized.

Note that, in this embodiment, although the first conductive film 1107 is made of TaN, and the second conductive film 1108 is made of W, the material is not particularly limited thereto, and both the films may be formed of an element selected from the group consisting of Ta, W, Ti, Mo, Al, Cu, Cr and Nd or an alloy material or a compound material containing the above elements as its main constituent. Besides, a semiconductor film typified by a polycrystalline silicon film doped with an impurity element such as phosphorus may be used. An AgPdCu alloy may be used. Further, a combination of the first conductive film formed of a tantalum (Ta) film and the second conductive film formed of a W film, a combination of the first conductive film formed of a titanium nitride (TiN) film and the second conductive film formed of a W film, a combination of the first conductive film formed of a tantalum nitride (TaN) film and the second conductive film formed of an Al film, and a combination of the first conductive film formed of a tantalum nitride (TaN) film and the second conductive film formed of a Cu film may be adopted.

Next, masks 1109 to 1112 made from resist are formed using a photolithography method, and a first etching process is performed in order to form electrodes and wirings. This first etching process is performed with the first and second etching conditions. In this embodiment, as the first etching conditions, an ICP (inductively coupled plasma) etching method is used, a gas mixture of $CF_4$, $Cl_2$ and $O_2$ is used as an etching gas, the gas flow rate is set to 25/25/10 sccm, and a plasma is generated by applying a 500 W RF power (13.56 MHZ) to a coil shape electrode at 1 Pa . A dry etching device with ICP (Model E645-□ICP) manufactured by Matsushita Electric Industrial Co., Ltd. is used here. A 150 W RF power (13.56 MHZ) is also applied to the substrate side (test piece stage), effectively applying a negative self-bias voltage. The W film is etched with the first etching conditions, and the end portion of the second conductive layer is formed into a tapered shape. In the first etching conditions, the etching rate for W is 200.39 nm/min, the etching rate for TaN is 80.32 nm/min, and the selectivity of W to TaN is about 2.5. Further, the taper angle of W is about 26° in accordance with the first etching conditions. Note that, etching with the first etching conditions corresponds to the first etching process (FIG. 23B) described in Embodiment 7.

Thereafter, the first etching conditions are changed to the second etching conditions without removing the masks 1109 to 1112 made of resist, a gas mixture of $CF_4$ and $Cl_2$ is used as an etching gas, the gas flow rate is set to 30/30 sccm, and a plasma is generated by applying a 500 W RF power (13.56 MHZ) to a coil shape electrode at 1 Pa , thereby performing etching for about 30 seconds. A 20 W RF power (13.56 MHZ) is also applied to the substrate side (test piece stage), effectively applying a negative self-bias voltage. The W film and the TaN film are both etched on the same order with the second etching conditions in which $CF_4$ and $Cl_2$ are mixed. In the second etching conditions, the etching rate for W is 58.97 nm/min, and the etching rate for TaN is 66.43 nm/min. Note that, the etching time may be increased by approximately 10 to 20% in order to perform etching without any residue on the gate insulating film. In addition, etching with the second etching conditions corresponds to the second etching process (FIG. 23C) described in Embodiment 7.

In the first etching process, the end portions of the first and second conductive layers are formed to have a tapered shape due to the effect of the bias voltage applied to the substrate side by adopting a suitable shape of the masks formed from resist (FIG. 28B). The angle of the tapered portions may be set to 15 to 45°. Thus, first shape conductive layers 1113 to 1116 (first conductive layers 1113a to 1116a and second conductive layers 1113b to 1116b) constituted of the first conductive layers and the second conductive layers are formed by the first etching process. The width of the first conductive layers in a channel length direction corresponds to W1 shown in Embodiment 7. Reference numeral 1117 indicates a gate insulating film, and regions of the gate insulating film not covered by the first shape conductive layers 1113 to 1116 are made thinner by etching approximately 20 to 50 nm.

Thereafter, a second etching process is performed without removing the masks made of resist. A gas mixture of $CF_4$, $Cl_2$ and $O_2$ is used as an etching gas, the gas flow rate is set to 25/25/10 sccm, and a plasma is generated by applying a 500 W RF power (13.56 MHZ) to a coil shape electrode at 1 Pa, thereby performing etching. A 20 W RF power (13.56 MHZ) is also applied to the substrate side (test piece stage), effectively applying a negative self-bias voltage. In the second etching process, the etching rate for W is 124.62 nm/min, the etching rate for TaN is 20.67 nm/min, and the selectivity of W to TaN is 6.05. Accordingly, the W film is selectively etched. The taper angle of W is 70° by the second etching process. Second conductive layers 1122b to 1125b are formed by the second etching process. On the other hand, the first conductive layers 1113a to 1116a are hardly etched, and first conductive layers 1122a to 1125a are formed. Note that, the second etching process here corresponds to the third etching process described in Embodiment 7 (FIG. 23D). Further, the width of the second conductive layers in the channel length direction corresponds to W2 shown in Embodiment 7.

Then, a first doping process is performed to add an impurity element for imparting an n-type conductivity to the semiconductor layer without removing the masks made of resist (FIG. 28C). Doping may be carried out by an ion doping method or an ion injecting method. The condition of the ion doping method is that a dosage is $1\times10^{13}$ to $5\times10^{15}$ atoms/cm$^2$, and an acceleration voltage is 60 to 100 keV. In this embodiment, the dosage is $1.5\times10^{15}$ atoms/cm$^2$ and the acceleration voltage is 80 keV. As the impurity element for imparting the n-type conductivity, an element belonging to group 15 of the periodic table, typically phosphorus (P) or arsenic (As) is used, but phosphorus (P) is used here. In this case, the conductive layers 1113 to 1116 become masks to the impurity element to impart the n-type conductivity, and high concentration impurity regions 1118 to 1121 are formed in a self-aligning manner. The impurity element to impart the n-type conductivity in the concentration range of $1\times10^{20}$ to $1\times10^{21}$ atoms/cm$^3$ is added to the high concentration impurity regions 1118 to 1121. Note that, the first doping process here corresponds to the first doping process (FIG. 24A) described in Embodiment 7.

Next, a second doping process is performed and the state of FIG. 28D is obtained. Second conductive layers 1122b to 1125b are used as masks to an impurity element, and doping is performed such that the impurity element is added to the semiconductor layer below the tapered portions of the first conductive layers. In this embodiment, phosphorus (P) is used as the impurity element, and plasma doping is performed with the dosage of $3.5\times10^{12}$ atoms/cm$^2$ and the acceleration voltage of 90 keV. Thus, low concentration impurity regions 1126 to 1129, which overlap with the first conductive layers, are formed in a self-aligning manner. The concentration of phosphorus (P) added to the low concentration impurity regions 1126 to 1129 is $1\times10^{17}$ to $1\times10^{18}$ atoms/cm$^3$, and has a gentle concentration gradient in accordance with the film thickness of the tapered portions of the first conductive layers. Note that, in the semiconductor layer that overlaps with the tapered portions of the first conductive layers, the concentration of impurity element slightly falls from the end portions of the tapered portions of the first conductive layers toward the inner portions, but the concentration keeps almost the same level. Further, an impurity element is added to the high concentration impurity regions 1118 to 1121 to form high concentration impurity regions 1130 to 1133. Note that, the second doping process here corresponds to the second doping process (FIG. 24B) described in Note that, in Embodiment 7, although the high concentration impurity regions are formed in the first doping process and the low concentration impurity regions are formed in the second doping process, there is no limitation. The low concentration impurity regions may be formed in the first doping process and the high concentration impurity regions may be formed in the second doping process. Further, the high concentration impurity regions and the low concentration impurity regions may be formed in one doping process by appropriately adjusting the thicknesses of the insulating film and the first conductive layer, the doping conditions or the like.

Thereafter, a third etching process is performed without removing the masks made of resist. The tapered portions of the first conductive layers are partially etched to thereby reduce the regions that overlap with the semiconductor layer in the third etching process. Here, CHF$_3$ is used as an etching gas, and a reactive ion etching method (RIE method) is used. In this embodiment, the third etching process is performed with the chamber pressure of 6.7 Pa, the RF power of 800 W, the CHF$_3$ gas flow rate of 35 sccm. Thus, first conductive layers 1138 to 1141 are formed (FIG. 29A). Note that, the third etching process here corresponds to the fourth etching process (FIG. 24C) described in Embodiment 7. Further, the width of the first conductive layers in the channel length direction corresponds to W3 shown in Embodiment 7.

In the third etching process, the insulating film 1117 is etched at the same time, a part of the high concentration impurity regions 1130 to 1133 is exposed, and insulating films 1143a to 1143d and 1144 are formed. Note that, in this embodiment, the etching condition that exposes the part of the high concentration impurity regions 1130 to 1133 is used, but it is possible that a thin layer of the insulating film is left in the high concentration impurity regions if the thickness of the insulating film or the etching condition is changed.

Through the third etching process, impurity regions (LDD regions) 1134a to 1137a are formed, which do not overlap with the first conductive layers 1138 to 1141. Note that, impurity regions (GOLD regions) 1134b to 1137b remain overlapped with the first conductive layers 1138 to 1141.

The electrode formed by the first conductive layer 1138 and the second conductive layer 1122b becomes a gate electrode of an n-channel TFT of a driver circuit to be formed in the later process. The electrode formed by the first conductive layer 1139 and the second conductive layer 1123b becomes a gate electrode of a p-channel TFT of the driver circuit to be formed in the later process. Similarly, the electrode formed by the first conductive layer 1140 and the second conductive layer 1124b becomes a gate electrode of an n-channel TFT of a pixel portion to be formed in the later process, and the electrode formed by the first conductive layer 1141 and the second conductive layer 1125b becomes one of the gate electrodes of a storage capacitor of the pixel portion to be formed in the later process.

By doing so, in this embodiment, the difference between the impurity concentration in the impurity regions (GOLD regions) 1134b to 1137b that overlap with the first conductive layers 1138 to 1141 and the impurity concentration in the impurity regions (LDD regions) 1134a to 1137a that do not overlap with the first conductive layers 1138 to 1141 can be made small, thereby improving the TFT characteristics.

Next, the masks formed from resist are removed, masks 1145 and 1146 are newly formed from resist, and a third doping process is performed. In accordance with the third doping process, impurity regions 1147 to 1152 are formed, in which the impurity element imparting a conductivity (p-type) opposite to the one conductivity (n-type) is added to the semiconductor layer that becomes an active layer of the p-channel TFT (FIG. 29B). The first conductive layers 1139 and 1141 are used as masks to the impurity element, and the impurity element that imparts the p-type conductivity is added, to thereby form impurity regions in a self-aligning manner. In this embodiment, the impurity regions 1147 to 1152 are formed by an ion doping method using diborane (B$_2$H$_6$). Note that, in the third doping process, the semiconductor layer forming the n-channel TFT is covered with the masks 1145 and 1146 formed from resist. Although phosphorus is added to the impurity regions 1145 and 1146 at different concentrations in accordance with the first and second doping processes, the doping process is performed such that the concentration of the impurity element imparting p-type conductivity is in the range of $2\times10^{20}$ to $2\times10^{21}$ atoms/cm$^3$ in any of the impurity regions. Thus, the impurity regions function as the source region and the drain region of the p-channel TFT so that no problem occurs. In this embodiment, a part of the semiconductor layer that becomes an active layer of the p-channel TFT is exposed by the third etching process, and thus there is an advantage that an impurity element (boron) is easily added.

In accordance with the above-described processes, the desired impurity regions are formed in the respective semiconductor layers.

Next, the masks 1145 and 1146 made of resist are removed, and a first interlayer insulating film (a) 1153a is formed. The first interlayer insulating film (a) 1153a is formed of an insulating film containing silicon with a thickness of 50 to 100 nm by the plasma CVD method or the sputtering method. In this embodiment, a 50 nm thick silicon nitride oxide film is formed by the plasma CVD method. Of course, the first interlayer insulating film (a) 1153a is not limited to the silicon nitride oxide film, and other insulating film containing silicon may be formed into a single layer or a lamination structure.

Then, a step of activating the impurity elements added in the respective semiconductor layers is performed (FIG. 29C). This activation process is carried out by a thermal annealing method using an annealing furnace. The thermal annealing method may be performed in a nitrogen atmosphere having an oxygen concentration of 1 ppm or less, preferably 0.1 ppm or less and at 400 to 700° C., typically 500 to 550° C. In this embodiment, an activation process with a heat treatment at 550° C. for 4 hours is carried out. Note that, other than the thermal annealing method, a laser annealing method, or a rapid thermal annealing method (RTA method) can be applied thereto.

Note that, in this embodiment, at the same time as the activation process, nickel used as the catalyst for crystallization is gettered to the impurity regions (1130, 1132, 1147 and 1150) containing phosphorous at a high concentration. As a result, mainly nickel concentration of the semiconductor layer that becomes a channel forming region is lowered. The TFT having a channel forming region thus formed is decreased in off current value, and has high electric field effect mobility because of good crystallinity, thereby attaining satisfactory characteristics.

Further, an activation process may be performed before the formation of the first interlayer insulating film. However, in the case where the used wiring material is weak against heat, it is preferable that the activation process is performed after an interlayer insulating film (an insulating film containing silicon as its main constituent, for example, silicon nitride film) is formed in order to protect the wiring or the like as in this embodiment.

Moreover, a laser annealing method may be performed as the activation process, and laser light of an excimer laser, a YAG laser or the like may be irradiated.

Next, a first interlayer insulating film (b) 1153b is formed. The first interlayer insulating film (b) 1153b is formed of an insulating film containing silicon with a thickness of 50 to 200 nm by the plasma CVD method or the sputtering method. In this embodiment, a 100 nm thick silicon nitride film is formed by the plasma CVD method. Of course, the first interlayer insulating film (b) 1153b is not limited to the silicon nitride film, and other insulating films containing silicon may be formed into a single layer or a lamination structure.

Next, heat treatment is performed for 1 to 12 hours at 300 to 550° C. in an inert atmosphere to perform hydrogenation of the semiconductor layer. The hydrogenation is preferably performed at a lower temperature than the heat treatment temperature in the activation process (400 to 500° C.) (FIG. 29D). In this embodiment, a thermal processing is performed for one hour at 410° C. in a nitrogen atmosphere. This process is a step for terminating dangling bonds in the semiconductor layer by hydrogen contained in the interlayer insulating film. Hydrogenation by thermal processing for 1 to 12 hours at 300 to 550° C. in an atmosphere containing 3 to 100% of hydrogen or plasma hydrogenation (using hydrogen excited by plasma) may be performed as other means of hydrogenation.

Further, thermal activation (typically in a nitrogen atmosphere at 500 to 550° C.) is performed after the resist masks 1145 and 1146 made of resist are removed, and then hydrogenation (in a nitrogen atmosphere at 300 to 500° C.) may be performed after forming the first interlayer insulating film (typically, a silicon nitride film with a thickness of 100 to 200 nm) made of an insulating film containing silicon.

Next, a second interlayer insulating film 1154 made of an organic insulating material is formed on the first interlayer insulating film (b) 1153b. In this embodiment, an acrylic resin film with a thickness of 1.6 μm is formed.

Next, a transparent conductive film with a thickness of 80 to 120 nm is formed on the second interlayer insulating film 1154, and a pixel electrode 1162 is formed by patterning. For the transparent conductive film, an alloy of indium oxide and zinc oxide ($In_2O_3$-ZnO) and zinc oxide (ZnO) are suitable materials, and further zinc oxide added with gallium (Ga) (ZnO:Ga) may be preferably used to increase the transmittivity or conductivity of visible light.

Note that, here, an example of using a transparent conductive film as a pixel electrode is shown, but if a conductive material having reflectivity is used to form a pixel electrode, a reflection type display device may be formed.

Then, patterning is performed for forming the contact holes reaching the respective impurity regions 1130, 1132, 1147, and 1150.

In a driver circuit 1205, electrodes 1155 to 1158 to which the impurity regions 1130 and 1147, are respectively electrically connected, are formed. Note that, the electrodes are formed by patterning the lamination film of a Ti film with a thickness of 50 nm and an alloy film with a thickness of 500 nm (an alloy film of Al and Ti).

Figure 30:
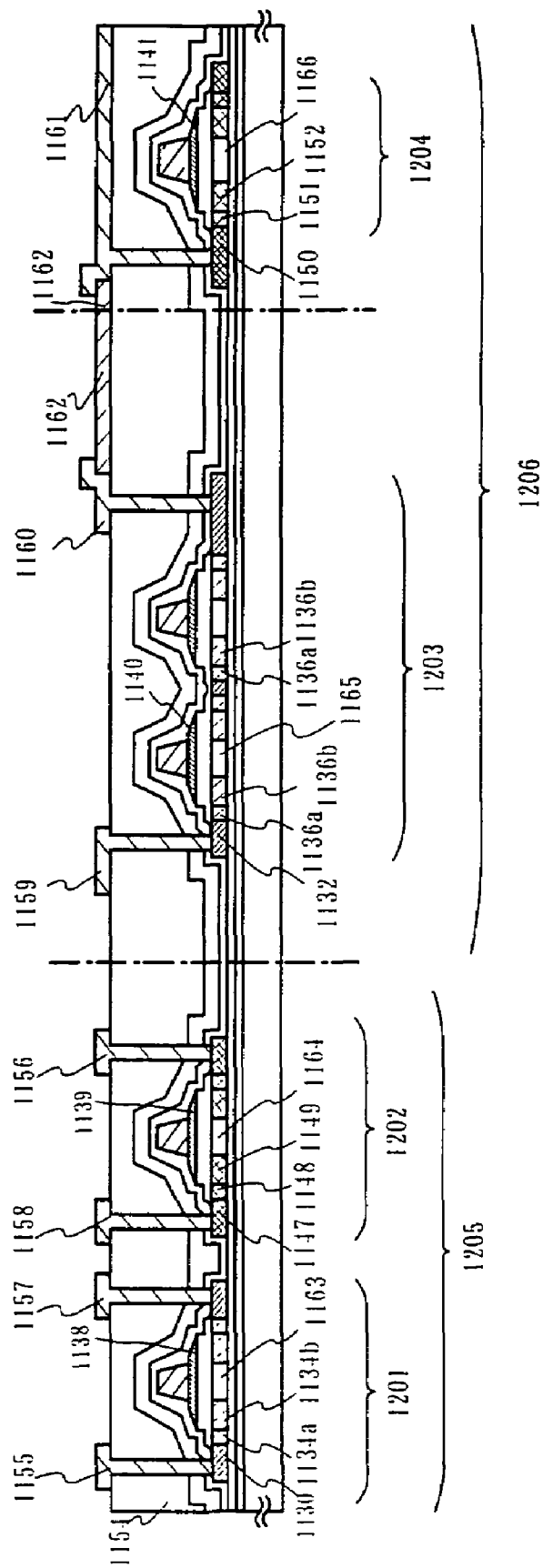
FIG. 30 shows the manufacturing process of the AM-LCD (Embodiment 10)

In a pixel portion 1206, a connection electrode 1160 contacting the impurity region 1132 or a source electrode 1159 is formed, and a connection electrode 1161 contacting the impurity region 1150 is formed. Note that, the connection electrode 1160 forms an electrical connection to a drain region of a pixel TFT by being formed contacting and overlapping the pixel electrode 1162. Further, the connection electrode 1160 is electrically connected to the semiconductor layer (impurity region 1150) which functions as one of the electrodes forming the storage capacitor (FIG. 30).

In the manner as described above, the driver circuit 1205 including an n-channel TFT 1201 and a p-channel TFT 1202, the pixel portion 1206 including a pixel TFT 1203 and a storage capacitor 1204 may be formed on the same substrate. In this specification, such a substrate is called an active matrix substrate for convenience.

The n-channel TFT 1261 of the driver circuit 1205 includes a channel forming region 1163, a low concentration impurity region 1134b (GOLD region) overlapping with the first conductive layer 1138 partially forming the gate electrode, a low concentration impurity region 1134a (LDD region) formed outside the gate electrode, and a high concentration impurity region 1130 functioning as a source region or a drain region. Also, the p-channel TFT 1202 includes a channel forming region 1164, an impurity region 1149 overlapping with the first conductive layer 1139 partially forming the gate electrode, the impurity region 1148 formed outside the gate electrode, and the impurity region 1147 functioning as a source region or a drain region.

The pixel TFT 203 of the pixel portion 1206 includes a channel forming region 1165, a low concentration impurity region 1136b (GOLD region) overlapping with the first conductive layer 1140 forming the gate electrode, an impurity region 1136a (LDD region) formed outside the gate electrode, and the high concentration impurity region 1132 functioning as a source region or a drain region. Besides, impurity elements imparting p-type conductivity are added to the respective semiconductor layers 1150 to 1152 functioning as one of the electrodes of the storage capacitor 1204. The storage capacitor 1204 is formed by the electrodes 1125, 1142 and the semiconductor layers 1150 to 1152, and 1166, using the insulating film 1144 as a dielectric material.

Further, in accordance with the process steps of this embodiment, the number of photomasks necessary for manufacturing the active matrix substrate may be made as six. As a result the number of processes may be reduced, to thereby reduce the manufacturing cost and improve the yield.

[Embodiment 11]

In this embodiment, the process of forming an active matrix liquid crystal display device from the active matrix substrate manufactured in Embodiment 10 is described below with reference to FIG. 31.

In accordance with Embodiment 7, after obtaining the active matrix substrate in the state as shown in FIG. 30, an orientation film 1167 is formed on the active matrix substrate in FIG. 30 and a rubbing process is performed. Note that, in this embodiment, before forming the orientation film 1167, a columnar spacer is formed in a desired position for maintaining a gap between the substrates by patterning an organic resin film of an acrylic resin film or the like. Further, in place of the columnar spacer, a spherical spacer may be scattered over the entire substrate.

Subsequently, an opposing substrate 1168 is prepared. In the opposing substrate, a color filter with a colored layer 1174, a light shielding layer 1175 arranged corresponding to each pixel is provided. Further, a light shielding layer 1177 is provided in the driver circuit portion. A leveling film 1176 for covering the color filter and the light shielding portion 1177 is formed. Next, an opposing electrode 1169 made of a transparent conductive film is formed in the pixel portion on the leveling film 1176, and an orientation film 1170 is formed on the entire surface of the opposing substrate to perform the rubbing process.

Then, the active matrix substrate on which the pixel portion and the driver circuit are formed and the opposing substrate are stuck together by a sealing member 1171. A filler is mixed into the sealing agent 1171, and two substrates are stuck together by this filler and a columnar spacer while keeping a uniform gap. Thereafter, a liquid crystal material 1173 is injected between both the substrates, and is completely encapsulated by an encapsulant (not shown). A known liquid crystal material may be used as the liquid crystal material 1173. In this manner, the active matrix liquid crystal display device shown in FIG. 31 is completed. If necessary, the active matrix substrate or the opposing substrate may be parted into a desired shape. Further, a polarizing plate or the like is provided by using a known technique. An FPC is adhered using a known technique.

The liquid crystal display panel manufactured in this way may be used as a display portion of various electronic equipments.

[Embodiment 12]

Figure 32:
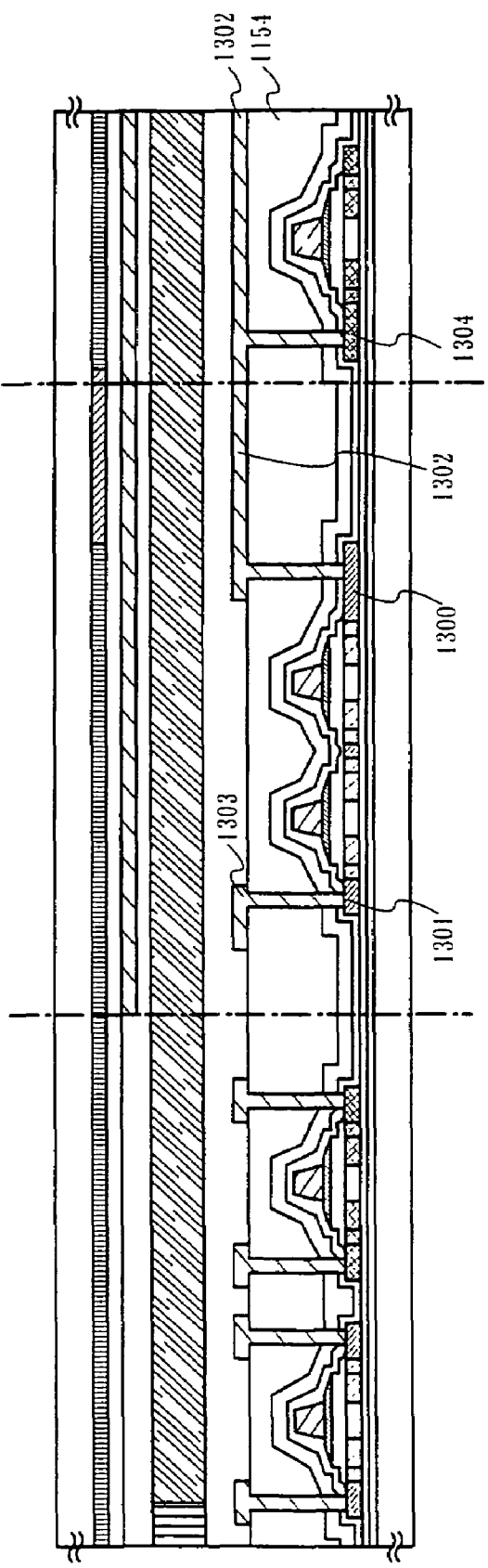
FIG. 32 is a cross sectional structural view of a reflection type liquid crystal display device (Embodiment 12)

In this embodiment, a manufacturing method of an active matrix substrate having a structure different to that in Embodiment 10 is described using FIG. 32. In Embodiment 10, a transmission type display device is formed, but this embodiment, is featured in that a reflection type display device is formed to reduce the number of masks as compared to Embodiment 10.

Note that, the process through the formation of the second interlayer insulating film 1154 is the same as Embodiment 10, and therefore the description thereof will be omitted.

In accordance with Embodiment 10, after the second interlayer insulating film 1154 is formed, patterning is performed to form the contact holes reaching respective impurity regions.

Then, in the driver circuit, as in Embodiment 10, a part of the semiconductor layer (a high concentration impurity region) and electrodes respectively electrically connected thereto are formed. Note that, these electrodes are formed by patterning the lamination film of a Ti film with a thickness of 50 nm and an alloy film with a thickness of 500 nm (an Al and Ti alloy film).

In a pixel portion, a pixel electrode 1302 contacting a high concentration impurity region 1300, or a source electrode 1303 contacting a high concentration impurity region 1301 is formed. Note that, the pixel electrode 1302 forms an electrical connection to the high concentration impurity region 1300 of a pixel TFT, and further forms an electrical connection to a semiconductor layer functioning as one of the electrodes forming the storage capacitor (high concentration impurity region 1304) (FIG. 32).

Note that, as a material for the pixel electrode 1302, a film with Al or Ag as the main component, or a material with an excellent reflectivity such as lamination films of the above components is preferably used.

Further, according to the processes shown in this embodiment, the number of photomasks necessary for manufacturing the active matrix substrate may be five. As a result, the number of processes may be reduced, to thereby reduce the manufacturing cost and improve the yield.

Further, after the pixel electrodes are formed, it is preferable that the process of a known method such as sandblasting or etching is supplemented to make the surface uneven to prevent the reflection on the mirror surface, and the reflected light is scattered in order to increase the whiteness. Further, unevenness may be formed on the insulating film before forming the pixel electrodes, and the pixel electrodes may be formed thereon.

[Embodiment 13]

Figure 33:
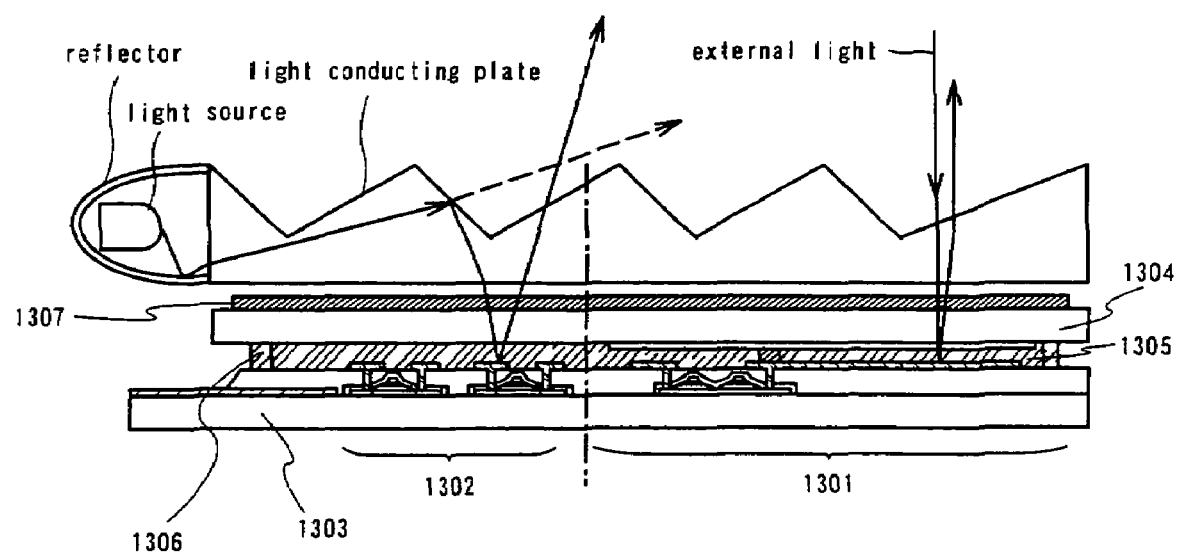
FIG. 33 is a cross sectional structural view of a reflection type liquid crystal display panel with a light source (Embodiment 13).

In this embodiment, the process of forming a reflection type liquid crystal display device from the active matrix substrate formed in Embodiment 12 is described below with reference to FIG. 33.

First, according to Embodiment 12, after obtaining the active matrix substrate in the state as shown in FIG. 32, an orientation film is formed on the active matrix substrate of FIG. 32 on at least the pixel electrode, and a rubbing process is thus performed. Note that, in this embodiment before forming the orientation film, an organic resin film such as an acrylic resin film is patterned to form a columnar spacer (not shown) for maintaining the gap between the substrates in the desired position. Further, in place of the columnar spacer, a spherical spacer may be scattered on the entire surface of the substrate.

Next, an opposing substrate 1404 is prepared. On the opposing substrate is provided a color filter with a colored layer and a light shielding layer arranged corresponding to each pixel. Next, a leveling film is formed covering the color filter.

Next, an opposing electrode formed of a transparent conductive film on the leveling film is formed at least in the pixel portion, an orientation film is formed on the entire surface of the opposing substrate and a rubbing process is performed.

Then, an active matrix substrate 1403 formed with a pixel portion 1401 and a driver circuit 1402, and an opposing substrate 1404 are stuck together with a sealing member 1406. The sealing material 1406 is mixed with a filler, and the two substrates are stuck together while keeping a uniform gap by the effect of this filler and the columnar spacer. Thereafter, a liquid crystal material 1405 is injected between both the substrates to encapsulate the substrates completely by an encapsulant. A known liquid crystal material may be used for the liquid crystal material 1405. Note that, this embodiment is a reflection type liquid crystal display device, so that the gap between both the substrates is about half that shown in Embodiment 11. Accordingly, the reflection type liquid crystal display device is completed. If necessary, the active matrix substrate or the opposing substrate is parted into a desired shape. Further, a polarizing plate 1407 is adhered to just the opposing substrate. Then, an FPC is attached using a known technique.

The reflection type liquid crystal display panel manufactured in this way may be used as a display portion of the various electrical equipments.

Further, with just the liquid crystal display panel, there occurs a problem in visibility in a case where it is used in a dark place. Therefore, a structure having a light source, a reflector and a light conducting plate as shown in FIG. 33, is preferable.

As a light source, a single or a plurality of LEDs or cold-cathode tubes may be used. The light source shown in FIG. 33 is arranged along the side surface of the light conducting plate and provided with a reflector behind the light source.

When, the light irradiated from the light source efficiently enters the inside from the side surface of the light conducting plate by the reflector, the light is reflected by a special prism processed surface provided on the surface to enter the liquid crystal display panel.

In this way, by combining the liquid crystal display panel, the light source and the light conducting plate, the light usage efficiency may be improved.

[Embodiment 14]

In this embodiment, an example of a manufacturing method different from that of Embodiment 10 is shown. Note that, this embodiment only differs from Embodiment 10 in the process until the formation of the semiconductor layers 1102 to 1105, and the processes thereafter are the same as in Embodiment 10, and therefore the description is omitted.

First, a substrate is prepared as in Embodiment 10. In a case a transmission type display device is manufactured, a glass substrate, a quartz substrate, or the like may be used as the substrate. Further, a plastic substrate having a heat resistivity that may resist the treatment temperature may be used. Further in the case that a reflection type liquid crystal display device is manufactured, in addition, a ceramic substrate, a silicon substrate, a metal substrate, or a stainless substrate with an insulating film on the surface may be used.

Next, a base film made of an insulating film such as a silicon oxide film, a silicon nitride film or a silicon nitride oxide film is formed on the substrate. In this embodiment, a two layer structure is used for the base film, but a structure with a single layer film or lamination of two or more layers of the insulating film may be used. In this embodiment, a first layer and a second layer of the base film are formed using a plasma CVD method to continuously form the films in the first film forming chamber. As the first layer of the base film, a silicon nitride oxide film is formed with a thickness of 10 to 200 nm (preferably 50 to 100 nm) by a plasma CVD method with $SiH_4$, $NH_3$ and $N_2O$ as reaction gases. In this embodiment, a silicon nitride oxide film (composition ratio Si=32%, O=27%, N=24%, H=17%) with a thickness of 50 nm is formed. Then, as the second layer of the base film, a silicon nitride oxide film formed by a plasma CVD method with $SiH_4$ and $N_2O$ as reaction gases is laminated with a thickness of 50 to 200 nm (preferably 100 to 150 nm). In this embodiment, a silicon nitride oxide film (composition ratio Si=32%, O=59%, N=7%, H=2%) with a thickness of 100 nm is formed.

Next, an amorphous semiconductor film is formed on the base film in the second film forming chamber. An amorphous semiconductor film is formed with a thickness of 30 to 60 nm. there is no limitation on a material of an amorphous semiconductor film, but preferably it is formed of silicon or a silicon germanium alloy. In this embodiment, an amorphous silicon film is formed using $SiH_4$ gas by a plasma CVD method.

Further, since the base film and the amorphous semiconductor film may be formed with the same film forming method, the base film and the amorphous semiconductor film may be formed continuously.

Next, Ni is added to the amorphous silicon film in the third film forming chamber. An electrode containing Ni as a material is attached by a plasma CVD method, argon gas is introduced into the third film forming chamber to generate plasma, and Ni is added. Of course, a very thin film of Ni may be formed by using an evaporation method or a sputtering method.

Next, a protective film is formed in the fourth film forming chamber. As the protecting film, a silicon oxide film, a silicon nitride oxide film, or the like may be used. In performing dehydrogenation at a later stage, a compact layer such as a silicon nitride should not be used since hydrogen does not leave easily. In this embodiment, TEOS (tetrathyl orthosilicate) and $O_2$ are mixed, to form a silicon oxide film with a thickness of 100 to 150 nm. This embodiment is featured in that a continuous processing may be performed without exposure to the clean room atmosphere up to the formation of the silicon oxide film as the protecting film.

Further, any known forming methods such as a plasma CVD method, a thermal CVD method, a decompression CVD method, an evaporation method and a sputtering method may be used as to the film formed in each film formation chamber.

Next, dehydrogenation of an amorphous silicon film (500° C., one hour) is performed, and thermal crystallization is performed (550° C., four hours). Note that, the method is not limited to adding a catalyst element such as Ni as shown in this embodiment, and thermal crystallization may be performed by known methods.

Then, in order to control the threshold (Vth) of the n-channel TFT, an impurity element imparting a p-type conductivity is added. Elements of group 13 of the periodic table such as boron (B), aluminum (Al) and gallium (Ga) are known as impurity elements imparting a p-type conductivity to the semiconductor. In this embodiment, boron (B) is added.

After adding boron, a silicon oxide film which is a protecting film is removed with an etching solution such as fluoric acid. Next, a continuous processing of washing and laser annealing is performed. By performing laser annealing processing after adding boron (B) which is an impurity element imparting a p-type conductivity to the amorphous semiconductor film, boron becomes a part of crystal structure of a crystalline semiconductor film when crystallization occurs, whereby damage to the crystal structure which occurs with the conventional technique, may be prevented.

Here, by using purified water containing ozone and an acid solution including fluorine, the very thin oxide film to be formed in washing with purified water containing ozone, and contaminated impurity stuck to the film surface may be removed. As a manufacturing method of purified water containing ozone, there is a method of electrolysis of purified water or a method of melting ozone gas directly into the purified water. Further, the concentration of ozone is preferably set at 6 mg/L or more. Note that, the number of rotations and time conditions of a spin device, may be appropriately found according to a substrate area, a material of a film and the like.

As a laser annealing method, a method of linearly condensing laser light radiated from a laser oscillator with an optical system and irradiating the linear laser light to the semiconductor film may be used. The conditions of crystallization by laser annealing may be appropriately selected by the operator.

The crystalline semiconductor film thus obtained is patterned into a desired shape to form island-like semiconductor films 102 to 105.

Figure 31:
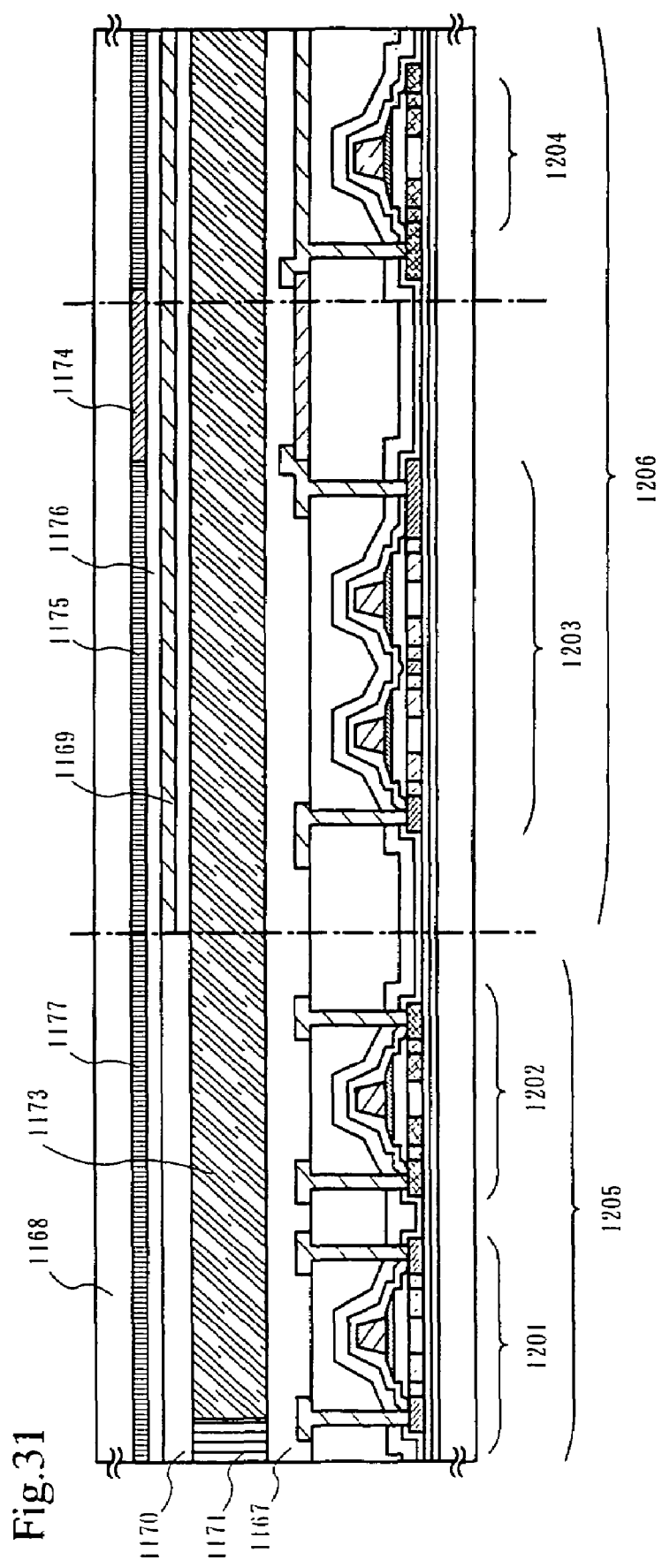
FIG. 31 is a cross sectional structural view of a transmission type liquid crystal display device (Embodiment 10)

As to the subsequent processes, the liquid crystal display panel shown in FIG. 31 can be formed in accordance with Embodiment 10.

Note that this embodiment may be implemented in combination with any one of Embodiments 10 to 13.

According to the present invention, a width of the low concentration impurity region (GOLD region) which is overlapped with the gate electrode and a width of the low concentration impurity region (LDD region) which is not overlapped with the gate electrode can be freely controlled. Also, the concentration difference between the GOLD region and the LDD region in the TFT formed in accordance with the present invention is hardly produced. Thus, in the GOLD region overlapped with the gate electrode, a relaxation of electric field concentration is achieved and then a hot carrier injection can be prevented. Also, in the LDD region which is not overlapped with the gate electrode, an increase of the off-current value can be suppressed.

What is claimed is:

1. A semiconductor device comprising:
a semiconductor layer comprising a low concentration impurity region provided between a channel forming region and a drain region or a source region formed on an insulating surface;
an insulating film formed on the semiconductor layer;
a gate electrode formed on the insulating film; and
an interlayer insulating film formed over the gate electrode,
wherein the low concentration impurity region is overlapped by the gate electrode, wherein a first portion of the insulating film is thinner than a second portion of the insulating film overlapped by the gate electrode, and
wherein the interlayer insulating film is directly in contact with at least one of the drain region and the source region.

2. The semiconductor device according to claim 1,
wherein the gate electrode has a lamination structure in which a first conductive layer with a first width is a lower layer and a second conductive layer with a second width narrower than the first width is an upper layer.

3. The semiconductor device according to claim 2,
wherein an end portion of the first conductive layer has a taper shape.

4. The semiconductor device according to claim 1,
wherein a film thickness of a region of the insulating film which is overlapped with the low concentration impurity region becomes thinner as a distance from the channel region is larger.

5. The semiconductor device according to claim 1,
wherein the semiconductor device is a liquid crystal display device.

6. The semiconductor device according to claim 1,
wherein the semiconductor device is an electro luminescence display device.

7. The semiconductor device according to claim 1,
wherein the semiconductor device is one selected from the group consisting of a video camera, a digital camera, a projector, a goggle type display, a car navigation system, a personal computer, a portable information terminal, a digital video disk player, and an electronic game device.

8. A semiconductor device comprising:
a semiconductor layer comprising a low concentration impurity region provided between a channel forming region and a drain region or a source region formed on an insulating surface;
an insulating film formed on the semiconductor layer;
a gate electrode formed on the insulating film; and
an interlayer insulating film formed over the gate electrode,
wherein the low concentration impurity region is overlapped by the gate electrode,
wherein a first portion of the insulating film is thinner than a second portion of the insulating film overlapped by the gate electrode,
wherein a concentration of impurity elements for imparting a conductivity in the low concentration impurity region is gradually increased as a distance from the drain region decreases, and
wherein the interlayer insulating film is directly in contact with at least one of the drain region and the source region.

9. The semiconductor device according to claim 8,
wherein the gate electrode has a lamination structure in which a first conductive layer with a first width is a lower layer and a second conductive layer with a second width narrower than the first width is an upper layer.

10. The semiconductor device according to claim 9,
wherein an end portion of the first conductive layer has a taper shape.

11. The semiconductor device according to claim 8,
wherein a film thickness of a region of the insulating film which is overlapped with the low concentration impurity region becomes thinner as a distance from the channel region is larger.

12. The semiconductor device according to claim 8,
wherein the semiconductor device is a liquid crystal display device.

13. The semiconductor device according to claim 8, wherein the semiconductor device is an electro luminescence display device.

14. The semiconductor device according to claim 8, wherein the semiconductor device is one selected from the group consisting of a video camera, a digital camera, a projector, a goggle type display, a car navigation system, a personal computer, a portable information terminal, a digital video disk player, and an electronic game device.

15. A semiconductor device comprising:
a semiconductor layer comprising a low concentration impurity region provided between a channel forming region and a drain region or a source region formed on an insulating surface;
an insulating film formed on the semiconductor layer;
a gate electrode formed on the insulating film; and
an interlayer insulating film formed over the gate electrode,
wherein the low concentration impurity region is partially overlapped by the gate electrode,
wherein a first portion of the insulating film is thinner than a second portion of the insulating film overlapped by the gate electrode, and
wherein the interlayer insulating film is directly in contact with at least one of the drain region and the source region.

16. The semiconductor device according to claim 15, wherein the gate electrode has a lamination structure in which a first conductive layer with a first width is a lower layer and a second conductive layer with a second width narrower than the first width is an upper layer.

17. The semiconductor device according to claim 16, wherein an end portion of the first conductive layer has a taper shape.

18. The semiconductor device according to claim 15, wherein a film thickness of a region of the insulating film which is overlapped with the low concentration impurity region becomes thinner as a distance from the channel region is larger.

19. The semiconductor device according to claim 15, wherein the semiconductor device is a liquid crystal display device.

20. The semiconductor device according to claim 15, wherein the semiconductor device is an electro luminescence display device.

21. The semiconductor device according to claim 15, wherein the semiconductor device is one selected from the group consisting of a video camera, a digital camera, a projector, a goggle type display, a car navigation system, a personal computer, a portable information terminal, a digital video disk player, and an electronic game device.

22. A semiconductor device comprising:
a semiconductor layer comprising a low concentration impurity region provided between a channel forming region and a drain region or a source region formed on an insulating surface;
an insulating film formed on the semiconductor layer;
a gate electrode formed on the insulating film; and
an interlayer insulating film formed over the gate electrode,
wherein the low concentration impurity region is partially overlapped by the gate electrode,
wherein a first portion of the insulating film is thinner than a second portion of the insulating film overlapped by the gate electrode,
wherein a concentration of impurity elements for imparting a conductivity in the low concentration impurity region is gradually increased as a distance from the drain region decreases, and
wherein the interlayer insulating film is directly in contact with at least one of the drain region and the source region.

23. The semiconductor device according to claim 22, wherein the gate electrode has a lamination structure in which a first conductive layer with a first width is a lower layer and a second conductive layer with a second width narrower than the first width is an upper layer.

24. The semiconductor device according to claim 23, wherein an end portion of the first conductive layer has a taper shape.

25. The semiconductor device according to claim 22, wherein a film thickness of a region of the insulating film which is overlapped with the low concentration impurity region becomes thinner as a distance from the channel region is larger.

26. The semiconductor device according to claim 22, wherein the semiconductor device is a liquid crystal display device.

27. The semiconductor device according to claim 22, wherein the semiconductor device is an electro luminescence display device.

28. The semiconductor device according to claim 22, wherein the semiconductor device is one selected from the group consisting of a video camera, a digital camera, a projector, a goggle type display, a car navigation system, a personal computer, a portable information terminal, a digital video disk player, and an electronic game device.

* * * * *